(12) United States Patent
Ohsawa et al.

(10) Patent No.: US 8,021,822 B2
(45) Date of Patent: *Sep. 20, 2011

(54) POSITIVE RESIST COMPOSITIONS AND PATTERNING PROCESS

(75) Inventors: Youichi Ohsawa, Joetsu (JP); Takeshi Kinsho, Joetsu (JP); Takeru Watanabe, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 280 days.

This patent is subject to a terminal disclaimer.

(21) Appl. No.: 12/355,072

(22) Filed: Jan. 16, 2009

(65) Prior Publication Data
US 2009/0186296 A1 Jul. 23, 2009

(30) Foreign Application Priority Data
Jan. 18, 2008 (JP) .................................. 2008-008931

(51) Int. Cl.
G03F 7/004 (2006.01)
G03F 7/30 (2006.01)

(52) U.S. Cl. .................... 430/270.1; 430/326; 430/330; 430/910; 430/921

(58) Field of Classification Search ............... 430/270.1, 430/326, 330, 910, 921
See application file for complete search history.

(56) References Cited

U.S. PATENT DOCUMENTS

| | | |
|---|---|---|
| 5,714,625 A | 2/1998 | Hada et al. |
| 6,004,724 A | 12/1999 | Yamato et al. |
| 6,063,953 A | 5/2000 | Hada et al. |
| 6,261,738 B1 | 7/2001 | Asakura et al. |
| 6,312,867 B1 | 11/2001 | Kinsho et al. |
| 6,329,125 B2 | 12/2001 | Takechi et al. |
| 6,512,020 B1 | 1/2003 | Asakura et al. |
| 6,849,374 B2 | 2/2005 | Cameron et al. |
| 6,893,792 B2 | 5/2005 | Miya et al. |
| 6,908,722 B2 | 6/2005 | Ebata et al. |
| 6,916,591 B2 | 7/2005 | Ohsawa et al. |
| 7,399,577 B2 | 7/2008 | Yamato et al. |
| 7,618,765 B2 * | 11/2009 | Nishi et al. ............ 430/270.1 |
| 2006/0228648 A1 | 10/2006 | Ohsawa et al. |
| 2007/0003871 A1 | 1/2007 | Kodama et al. |
| 2007/0078269 A1 | 4/2007 | Harada et al. |
| 2007/0207408 A1 | 9/2007 | Hatakeyama et al. |
| 2007/0231738 A1 | 10/2007 | Kaneko et al. |
| 2009/0234155 A1 * | 9/2009 | Oh et al. ................ 562/100 |
| 2009/0291390 A1 * | 11/2009 | Jung et al. .............. 430/270.1 |

FOREIGN PATENT DOCUMENTS

| | | |
|---|---|---|
| EP | 1 517 179 A1 | 3/2005 |
| EP | 1 710 230 A1 | 10/2006 |
| EP | 1 780 199 A1 | 5/2007 |
| JP | 9-73173 A | 3/1997 |
| JP | 9-90637 A | 4/1997 |
| JP | 9-95479 A | 4/1997 |
| JP | 9-208554 A | 8/1997 |
| JP | 9-230588 A | 9/1997 |
| JP | 9-301948 A | 11/1997 |
| JP | 2906999 B2 | 4/1999 |
| JP | 2000-314956 A | 11/2000 |
| JP | 2000-336121 A | 12/2000 |
| JP | 2002-214774 A | 7/2002 |
| JP | 2004-2252 A | 1/2004 |

(Continued)

OTHER PUBLICATIONS

Houlihan et al., Journal of Photopolymer Science and Technology, vol. 19, No. 3, 2006, pp. 327-334.
Choi et al., Journal of Photopolymer Science and Technology, vol. 19, No. 3, 2006, pp. 313-318.
Varanasi et al., Journal of Photopolymer Science and Technology, vol. 18, No. 3, 2005, pp. 381-387.

(Continued)

*Primary Examiner* — John S Chu
(74) *Attorney, Agent, or Firm* — Birch, Stewart, Kolasch & Birch, LLP

(57) ABSTRACT

A positive resist composition comprises (A) a resin component which becomes soluble in an alkaline developer under the action of an acid and (B) an acid generator. The resin (A) is a polymer comprising specific recurring units, represented by formula (1). The acid generator (B) is a specific sulfonium salt compound. When processed by lithography, the composition is improved in resolution and forms a pattern with a satisfactory mask fidelity and a minimal LER.

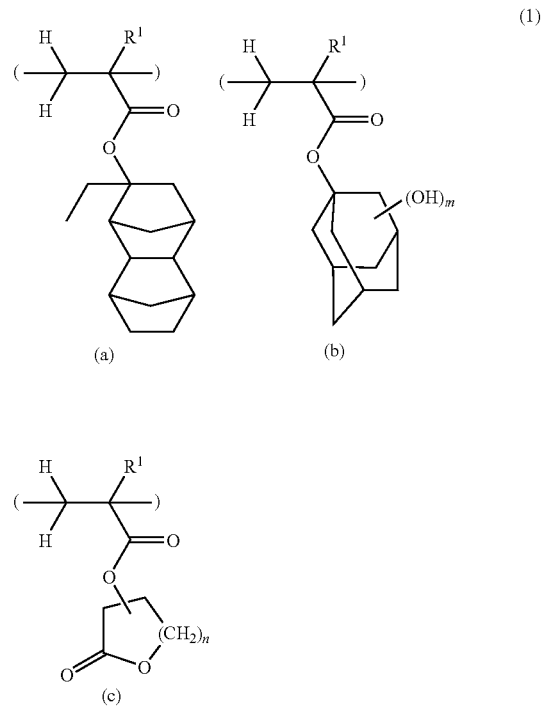

Herein $R^1$ is H or methyl, m is 1 or 2, and n is 1 or 2.

8 Claims, 10 Drawing Sheets

FOREIGN PATENT DOCUMENTS

| | | |
|---|---|---|
| JP | 2004-4561 A | 1/2004 |
| JP | 2004-531749 A | 10/2004 |
| JP | 2006-306856 A | 11/2006 |
| JP | 2007-145797 A | 6/2007 |
| JP | 2007-297590 A | 11/2007 |
| WO | WO-2004/074242 A2 | 9/2004 |

OTHER PUBLICATIONS

Arimitsu et al., Journal of Photopolymer Science and Technology, vol. 8, No. 1, 1995, pp. 43-46.
Arimitsu et al., Journal of Photopolymer Science and Technology, vol. 9, No. 1, 1996, pp. 29-30.

* cited by examiner

POSITIVE RESIST COMPOSITIONS AND PATTERNING PROCESS

CROSS-REFERENCE TO RELATED APPLICATION

This non-provisional application claims priority under 35 U.S.C. §119(a) on Patent Application No. 2008-008931 filed in Japan on Jan. 18, 2008, the entire contents of which are hereby incorporated by reference.

TECHNICAL FIELD

This invention relates to a positive resist composition for the micropatterning technology which is improved in resolution and mask fidelity, and forms a pattern with a minimal line edge roughness, and a patterning process using the same.

BACKGROUND ART

In the recent drive for higher integration and operating speeds in LSI devices, it is desired to miniaturize the pattern rule. Great efforts have been devoted for the development of the micropatterning technology using deep-ultraviolet (deep-UV) or vacuum-ultraviolet (VUV) lithography. The photolithography using KrF excimer laser (wavelength 248 nm) as the light source has already established the main role in the commercial manufacture of semiconductor devices. The lithography using ArF excimer laser (wavelength 193 nm) is under investigation to enable further miniaturization and has reached the stage of prototype manufacture experiments. However, the ArF excimer laser lithography has not matured so that many problems must be overcome before the technology can be applied to an industrial scale of semiconductor manufacture.

The requisite properties for the resist materials complying with the ArF excimer laser lithography include transparency at wavelength 193 nm and dry etch resistance. Resist materials comprising as a base resin poly(meth)acrylic acid derivatives having bulky acid-labile protective groups as typified by 2-ethyl-2-adamantyl and 2-methyl-2-adamantyl groups were proposed as having both the properties (JP-A 9-73173 and JP-A 9-90637). Since then, a variety of materials have been proposed. Most of them commonly use resins having a highly transparent backbone and a carboxylic acid moiety protected with a bulky tertiary alkyl group.

As the pattern layout becomes finer, the fluctuation of pattern line width, known as "line edge roughness" (LER), becomes significant. In the processing of gate electrode zones in the LSI circuit manufacturing process, for example, poor LER can give rise to such problems as current leakage, resulting in a transistor with degraded electrical properties. It is believed that the LER is affected by various factors. The main factor is the poor affinity of a base resin to a developer, that is, low solubility of a base resin in a developer. Since carboxylic acid protective groups commonly used in the art are bulky tertiary alkyl groups and thus highly hydrophobic, most of them are less soluble. Where a high resolution is required as in the formation of microscopic channels, a noticeable LER can lead to an uneven size. One of known approaches for reducing LER is by increasing the amount of photoacid generator added, as described in Journal of Photopolymer Science and Technology, vol. 19, No. 3, 2006, 327-334. This approach, however, exerts a less than satisfactory effect, sometimes at the substantial sacrifice of exposure dose dependency, mask fidelity and/or pattern rectangularity.

Studies have also been made on photoacid generators. In prior art chemically amplified resist compositions for lithography using KrF excimer laser, photoacid generators capable of generating alkane- or arene-sulfonic acid are used. However, the use of these photoacid generators in chemically amplified resist compositions for ArF lithography results in an insufficient acid strength to scissor acid labile groups on the resin, a failure of resolution or a low sensitivity. Thus these photoacid generators are not suited for the fabrication of microelectronic devices.

For the above reason, photoacid generators capable of generating perfluoroalkanesulfonic acid having a high acid strength are generally used in ArF chemically amplified resist compositions. Perfluorooctanesulfonic acid and derivatives thereof (collectively referred to as PFOS) are considered problematic with respect to their stability (or non-degradability) due to C—F bonds, and biological concentration and accumulation due to hydrophobic and lipophilic natures. With respect to perfluoroalkanesulfonic acids of 5 or more carbon atoms and derivatives thereof, the same problems are pointed out.

Facing the PFOS-related problems, manufacturers made efforts to develop partially fluorinated alkane sulfonic acids having a reduced degree of fluorine substitution. For instance, JP-A 2004-531749 describes the development of α,α-difluoroalkanesulfonic acid salts from α,α-difluoroalkene and a sulfur compound and discloses a resist composition comprising a photoacid generator which generates such sulfonic acid upon irradiation, specifically di(4-tert-butylphenyl)iodonium 1,1-difluoro-2-(1-naphthyl)-ethanesulfonate. JP-A 2004-2252 describes the development of α,α,β,β-tetrafluoroalkanesulfonic acid salts from α,α,β,β-tetrafluoro-α-iodoalkane and sulfur compound and discloses a photoacid generator capable of generating such a sulfonic acid and a resist composition comprising the same. JP-A 2002-214774 discloses photoacid generators having difluorosulfoacetic acid alkyl esters (e.g., 1-(alkoxycarbonyl)-1,1-difluoromethanesulfonate) and difluorosulfoacetic acid amides (e.g., 1-carbamoyl-1,1-difluoromethanesulfonate) although their synthesis method is lacking. Furthermore, JP-A 2004-4561 discloses triphenylsulfonium(adamantan-1-ylmethyl) oxycarbonyldifluoro-methanesulfonate although its synthesis method is lacking; JP-A 2006-306856 discloses triphenylsulfonium alkyloxycarbonyldifluoromethanesulfonates having a lactone structure and analogs; and JP-A 2007-145797 discloses triphenylsulfonium 2-acyloxy-1,1,3,3,3-hexafluoropropane-sulfonate and analogs.

As far as the inventors empirically confirmed, undesirably these compounds suffer from problems including difficult compound design due to limited starting reactants (JP-A 2004-531749, JP-A 2004-2252), low solubility (JP-A 2002-214774, JP-A 2004-4561, JP-A 2006-306856), and increased hydrophobicity due to many fluorine atoms (JP-A 2007-145797).

With respect to the immersion lithography, there remain some other problems. Minute water droplets are left on the resist and wafer after the immersion exposure, which can often cause damages and defects to the resist pattern profile. The resist pattern after development can collapse or deform into a T-top profile. There exists a need for a patterning process which can form a satisfactory resist pattern after development according to the immersion lithography.

Reference is also made to Journal of Photopolymer Science and Technology, vol. 19, No. 3, 2006, 313-318, and ibid., vol. 18, No. 3, 2005, 381-387.

DISCLOSURE OF THE INVENTION

An object of the invention is to provide a positive resist composition which accomplishes a high resolution and forms a pattern with mask fidelity and minimized LER when processed by the photolithography using high-energy radiation such as ArF excimer laser light as a light source, and a patterning process using the same.

The inventor has found that a positive resist composition comprising a polymer comprising specific recurring units as a base resin and a sulfonium salt compound having a specific structure as an acid generator possesses an excellent resolution performance and can form a pattern with mask fidelity and a minimized LER when processed by the photolithography. The composition is thus quite effective for precise micropatterning.

In one aspect, the invention provides a positive resist composition comprising (A) a resin component which becomes soluble in an alkaline developer under the action of an acid and (B) a compound capable of generating an acid in response to actinic light or radiation. The resin component (A) is a polymer comprising recurring units (a), (b), and (c) represented by the general formula (1):

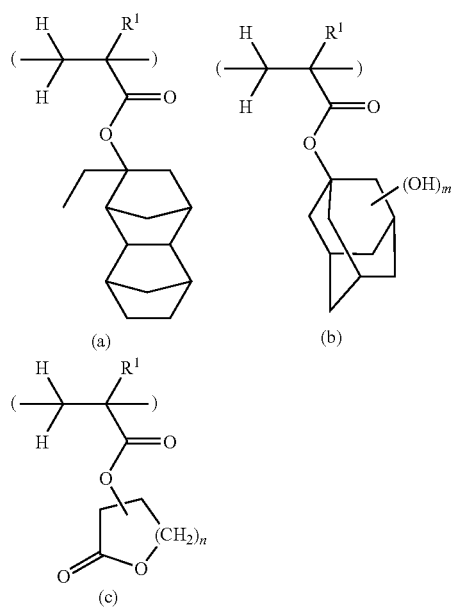

wherein $R^1$ is each independently hydrogen or methyl, m is 1 or 2, and n is 1 or 2. The compound (B) is a sulfonium salt compound having the general formula (2):

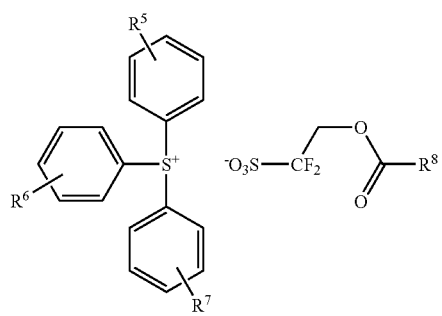

wherein $R^5$, $R^6$ and $R^7$ are each independently hydrogen or a straight, branched or cyclic, monovalent hydrocarbon group of 1 to 20 carbon atoms which may contain a heteroatom, and $R^8$ is a straight, branched or cyclic, monovalent hydrocarbon group of 4 to 30 carbon atoms which may contain a heteroatom.

In a preferred embodiment, the recurring units (c) in resin component (A) are units (c-1) of the following formula:

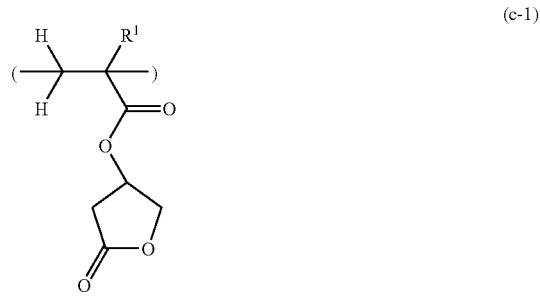

wherein $R^1$ is each independently hydrogen or methyl.

In a preferred embodiment, the composition may further comprise a tertiary amine as an acid diffusion regulator and/or a surfactant which is insoluble in water and soluble in the alkaline developer.

In another aspects the invention provides a process for forming a pattern, comprising the steps of applying the positive resist composition defined above onto a substrate to form a resist coating, heat treating, exposing the resist coating to high-energy radiation through a photomask, optionally heat treating, and developing the exposed coating with a developer;

a process for forming a pattern, comprising the steps of applying the positive resist composition defined above onto a substrate to form a resist coating, heat treating, applying on the resist coating a protective coating which is insoluble in water and soluble in an alkaline developer, exposing the resist coating to high-energy radiation through a photomask, with water interposed between the substrate and a projection lens, optionally heat treating, and developing the exposed coating with a developer; or a process for forming a pattern, comprising the steps of applying the positive resist composition defined above onto a substrate to form a resist coating, heat treating, imagewise writing on the resist coating with an electron beam, optionally heat treating, and developing the coating with a developer.

In a still further aspect, the invention provides a process for forming a pattern, comprising the steps of applying the positive resist composition defined above onto a substrate to form a resist coating, heat treating, exposing the resist coating to high-energy radiation through a photomask, heat treating, and developing the coating with a developer. The process further comprises the step of applying a protective coating on the resist coating. The exposing step is effected by the immersion lithography wherein a liquid having a refractive index of at least 1.0 intervenes between the protective coating and a projection lens.

BENEFITS OF THE INVENTION

When processed by the micropatterning process, especially ArF lithography, the positive resist composition of the invention exhibits a significantly high resolution and forms a pattern with a good mask fidelity and a minimized LER. The composition is thus quite effective for precise micropatterning.

PREFERRED EMBODIMENTS OF THE INVENTION

Figure 1:
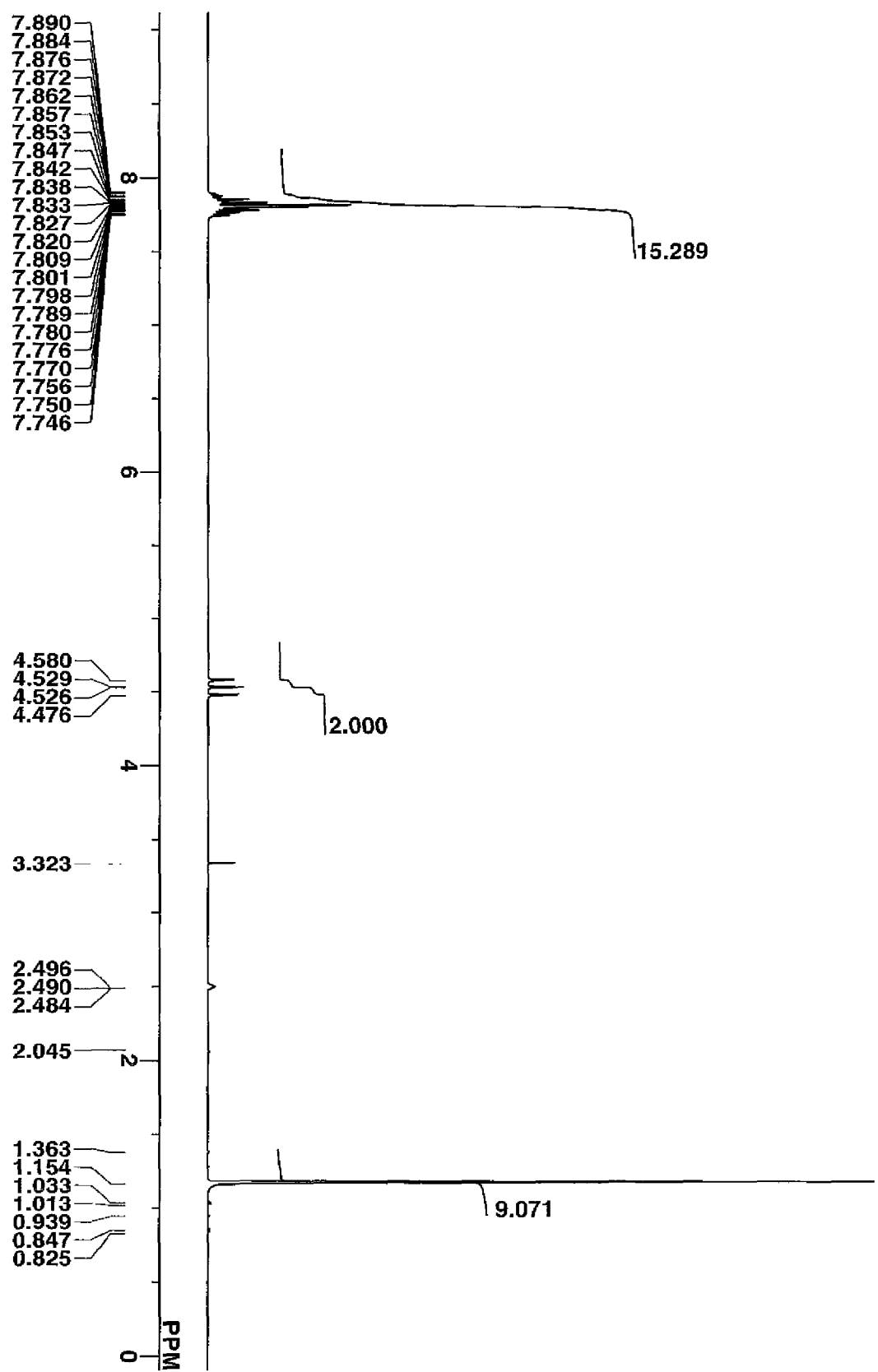
FIG. 1 is a diagram showing the $^1$H-NMR (DMSO-$d_6$) spectrum of PAG-1 in Example.

Below the resist composition of the invention is described in detail. The singular forms "a," "an" and "the" include plural referents unless the context clearly dictates otherwise.

The notation (Cn-Cm) means a group containing from n to m carbon atoms per group.

It is understood that for some structures represented by chemical formulae, there can exist enantiomers and diastereomers because of the presence of asymmetric carbon atoms. In such a case, a single formula collectively represents all such isomers. The isomers may be used alone or in admixture.

The resist composition of the invention comprises (A) a resin component which becomes soluble in an alkaline developer under the action of an acid, and (B) a compound capable of generating an acid in response to actinic light or radiation, wherein resin component (A) is a polymer comprising recurring units (a), (b) and (c) represented by the general formula (1) and compound (B) is a sulfonium salt compound having the general formula (2).

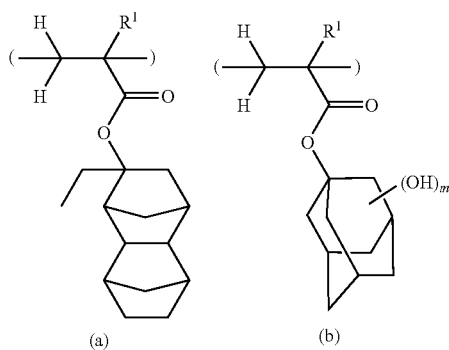

(1)

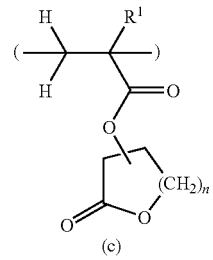

(c)

Herein $R^1$ is each independently hydrogen or methyl. The subscript m is equal to 1 or 2, and n is equal to 1 or 2.

Illustrative, non-limiting examples of the recurring units (c) in resin component (A) are given below, while such units of one type or more than one type may be used.

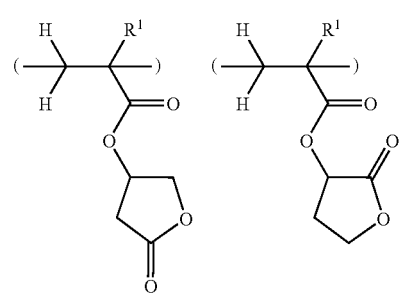

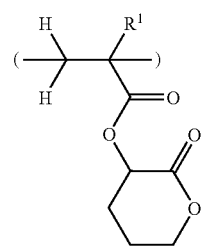

Herein $R^1$ is as defined above.

In a preferred embodiment, the recurring units (c) in resin component (A) are units (c-1) of the following formula:

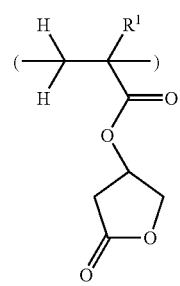

(c-1)

wherein $R^1$ is as defined above.

Illustrative, non-limiting examples of the recurring units (b) in resin component (A) are given below, while such units of one type or more than one type may be used.

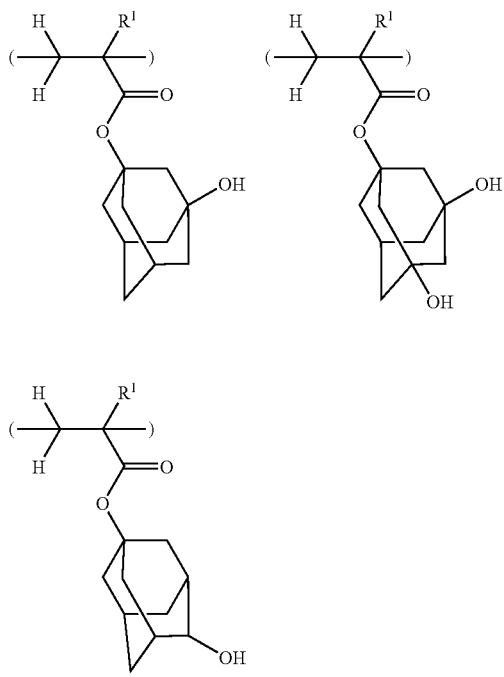

Herein R¹ is as defined above.

While the polymer as resin component (A) should comprise recurring units (a), (b) and (c) as essential units, the polymer may further comprise additional units (d), including carboxylate-terminated recurring units, lactone-containing recurring units, fluorinated alcohol-containing recurring units, hydroxyphenyl or hydroxynaphthyl-containing recurring units, substituted or unsubstituted hydroxystyrene units, substituted or unsubstituted vinylnaphthalene units, indene units, and acenaphthylene units. Illustrative, non-limiting examples of the additional recurring units (d) are given below.

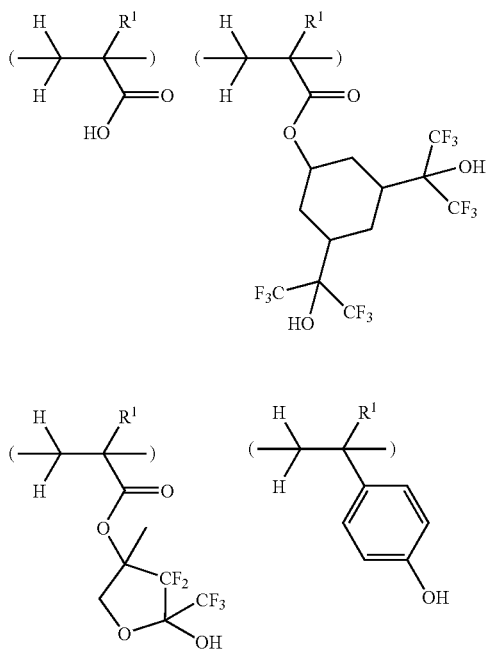

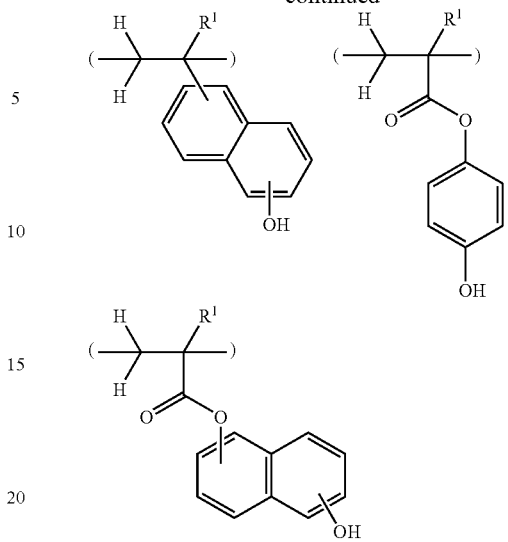

Note that R¹ is as defined above.

The proportion of recurring units (a), (b) and (c) and optional recurring units (d) relative to the entire recurring units within the polymer as resin component (A) is desirably in the following range:

$a/[a+b+c+d]=0.1$ to $0.5$, $b/[a+b+c+d]=0.05$ to $0.4$, $c/[a+b+c+d]=0.1$ to $0.5$, and $d/[a+b+c+d]=0$ to $0.3$, provided that $a+b+c+d=1$. That is, in a polymer comprising recurring units (a) to (d), the total of these recurring units (a) to (d) is 100 mol % relative to the total of entire recurring units.

The compound (B) is a sulfonium salt compound having the general formula (2).

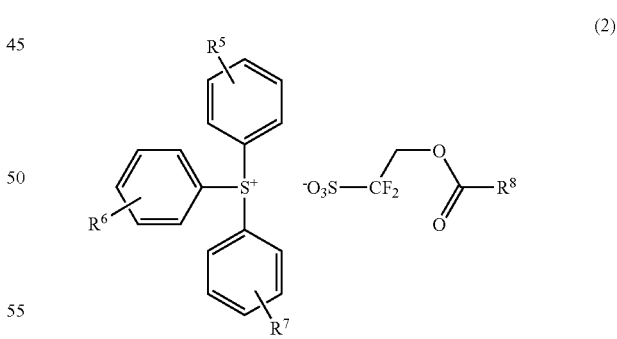

(2)

Herein $R^5$, $R^6$ and $R^7$ are each independently hydrogen or a straight, branched or cyclic, monovalent hydrocarbon group of 1 to 20 carbon atoms which may contain a heteroatom(s). Exemplary hydrocarbon groups include methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, and butyladamantyl, and modified forms of the foregoing in which any carbon-carbon bond is separated by a hetero atomic group such as —O—, —S—, —SO—, —SO$_2$—, —NH—, —C(=O)—, —C(=O)O— or —C(=O)NH— or in which any hydrogen atom is substituted by a functional group such as —OH, —NH$_2$, —CHO, or —CO$_2$H.

R$^8$ is a straight, branched or cyclic, monovalent hydrocarbon group of 4 to 30 carbon atoms which may contain a heteroatom(s), examples of which are given below, but not limited thereto.

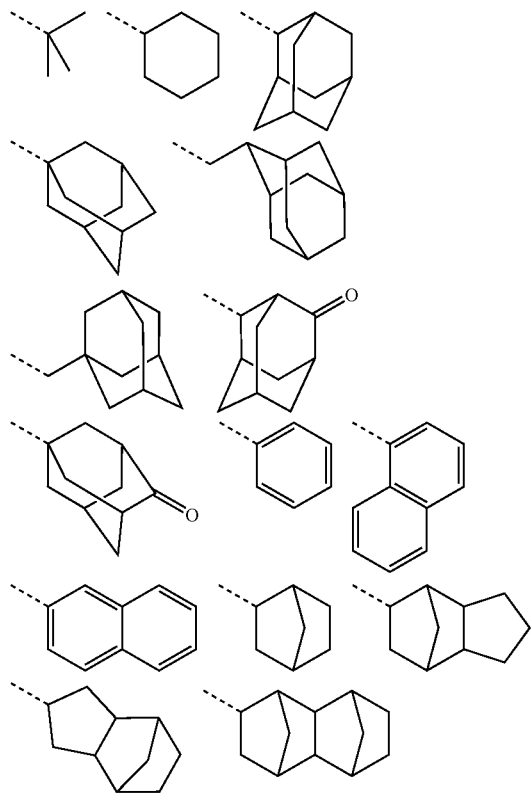

Note that the broken line denotes a valence bond.

The compound (B) capable of generating an acid in response to actinic light or radiation may be synthesized by the following process, for example.

One exemplary compound may be synthesized by reacting 2-bromo-2,2-difluoroethanol with a carboxylic chloride to form 2-bromo-2,2-difluoroethylalkane carboxylate or 2-bromo-2,2-difluoroethylarene carboxylate, converting the bromo group into sodium sulfinate using a sulfur compound such as sodium dithionite, and converting sulfinic acid into sulfonic acid using an oxidizing agent such as hydrogen peroxide. The steps of esterification, conversion from alkane halide to sodium sulfinate, and conversion to sulfonic acid are well known, while the formulations used in the latter two steps are described in JP-A 2004-2252. The outline of the process is illustrated below.

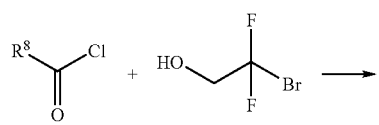

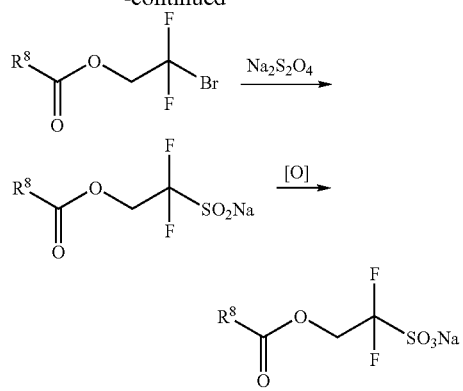

Note that R$^8$ is as defined above.

Subsequent ion exchange reaction between the resulting sodium sulfonate and a sulfonium salt compound yields the desired compound (B) capable of generating an acid in response to actinic light or radiation, as represented by formula (2). With respect to ion exchange reaction, reference is made to JP-A 2007-145797.

Further, the acyl group R$^8$CO— introduced as above is subjected to ester hydrolysis or solvolysis and then acylated again whereby a substituent group different from the initially introduced acyl group can be introduced. The outline of the process is illustrated below.

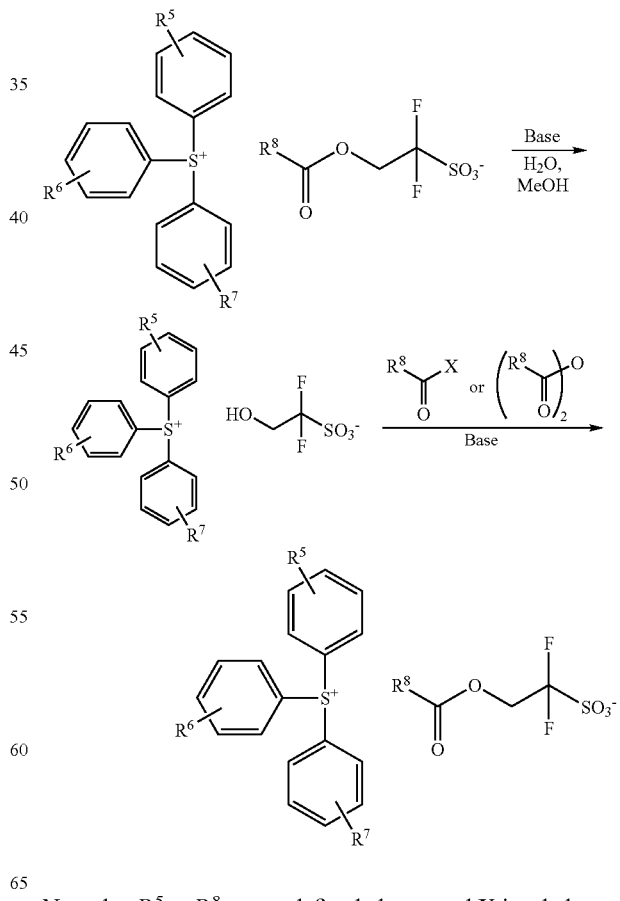

Note that R$^5$ to R$^8$ are as defined above, and X is a halogen atom.

This formulation makes it possible to introduce a substituent group which is unstable under the conditions of the previous anion synthesis process (conversion of a bromo group into sodium sulfinate using a sulfur compound such as sodium dithionite and subsequent conversion of sulfinic acid into sulfonic acid using an oxidizing agent such as hydrogen peroxide).

One common approach of introducing monocyclic lactone units is effective in increasing diffusion somewhat and improving line edge roughness (LER), but reduces maximum resolution. On the other hand, resolution is improved using an acid labile group which is highly reactive with acid, but at the sacrifice of LER. Making efforts to solve this problem, the inventors have found that a 1,1-difluoroethane-sulfonic acid derivative is a substantially low diffusible acid, that a sulfonium salt compound of the above general formula (2) capable of generating that acid is an effective acid generator, and that a combination of this sulfonium salt compound with a polymer defined as resin component (A) gives a resist composition which is improved in both resolution and LER.

More particularly, exemplary preferred configurations of polymers as resin component (A) are given below, but not limited thereto.

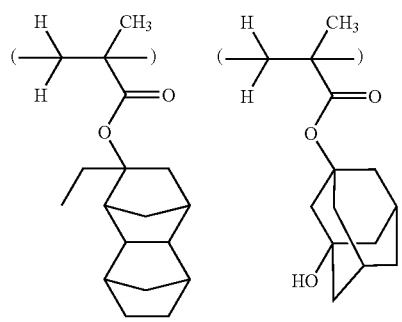

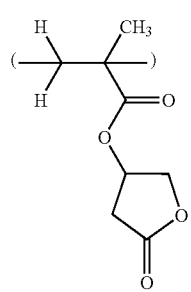

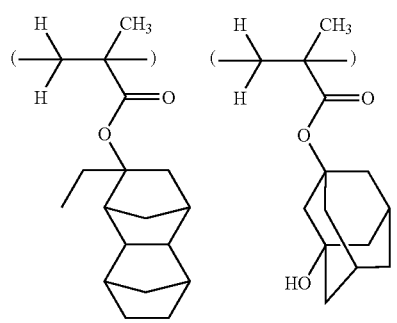

-continued

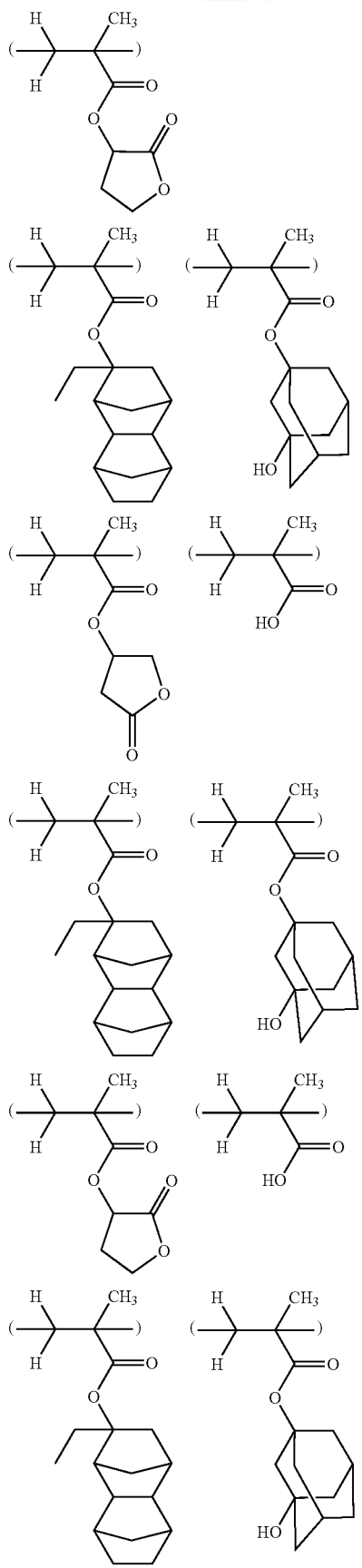

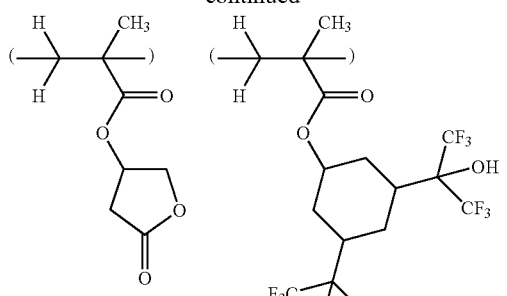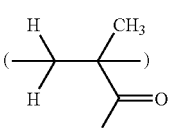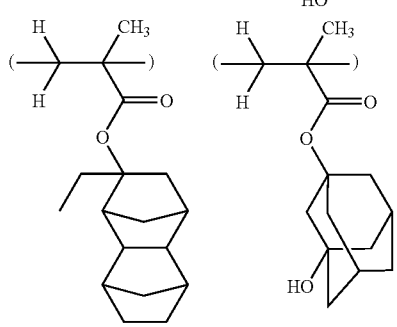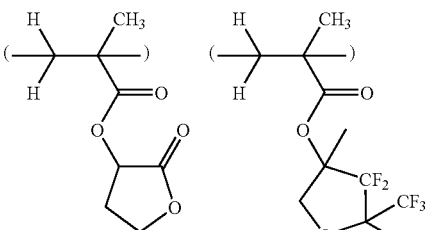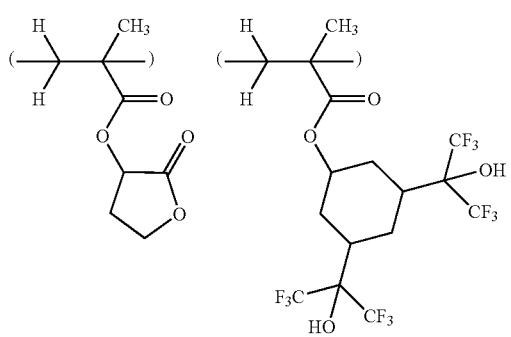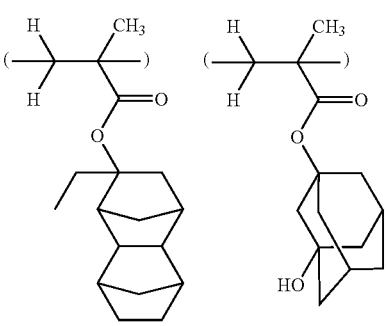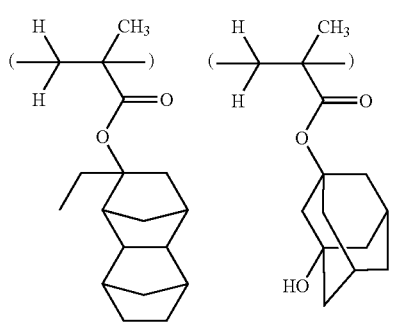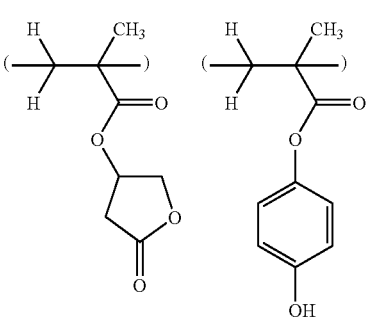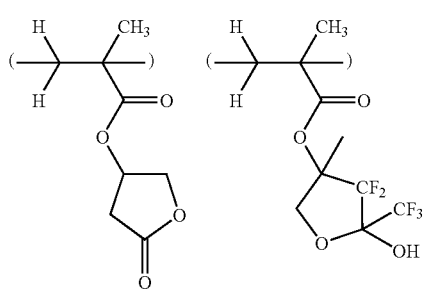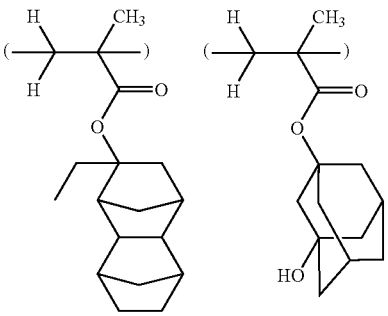

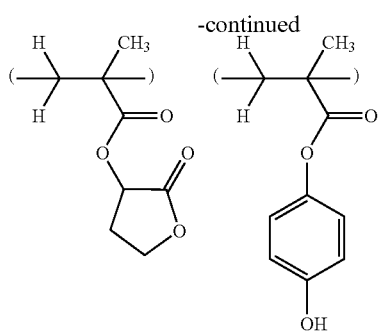
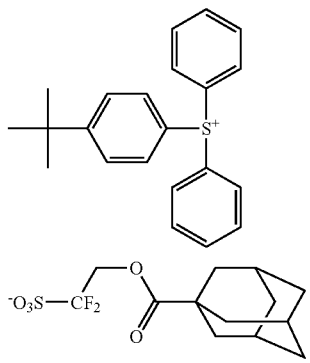

The polymer as resin component (A) should preferably have a weight average molecular weight (Mw) of 2,000 to 30,000, and more preferably 3,000 to 20,000, as measured by gel permeation chromatography (GPC) versus polystyrene standards. Outside the range, a polymer with too low a Mw may fail to form a satisfactory pattern profile whereas a polymer with too high a Mw may fail to provide a difference in dissolution rate before and after exposure, leading to a lower resolution.

The polymer as resin component (A) may be obtained through copolymerization of (meth)acrylic ester derivative monomers corresponding to the respective recurring units by any well-known technique such as radical polymerization. It is noted that the polymers used in Examples to be described later were synthesized from preselected (meth)acrylic ester derivative monomers by a standard radical polymerization technique.

Preferred examples of sulfonium salt compounds as the compound capable of generating an acid in response to actinic light or radiation (B) are given below, but not limited thereto.

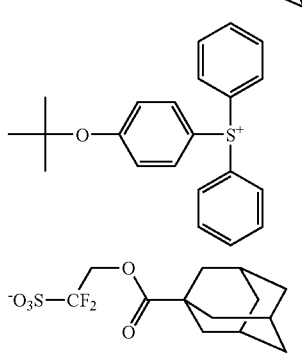
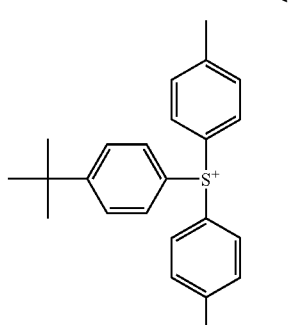
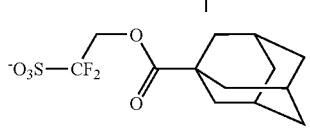
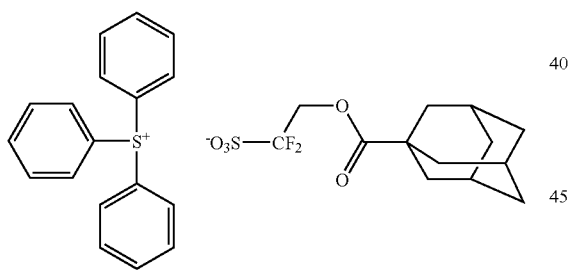
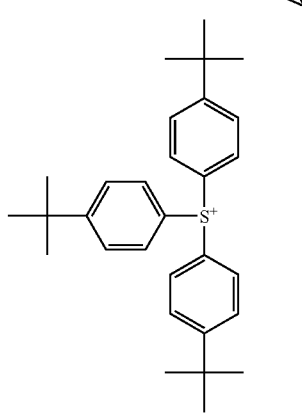
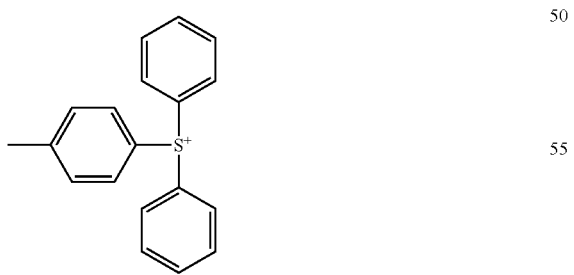
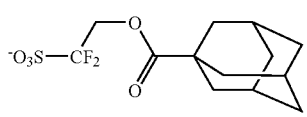
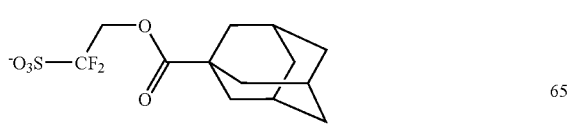

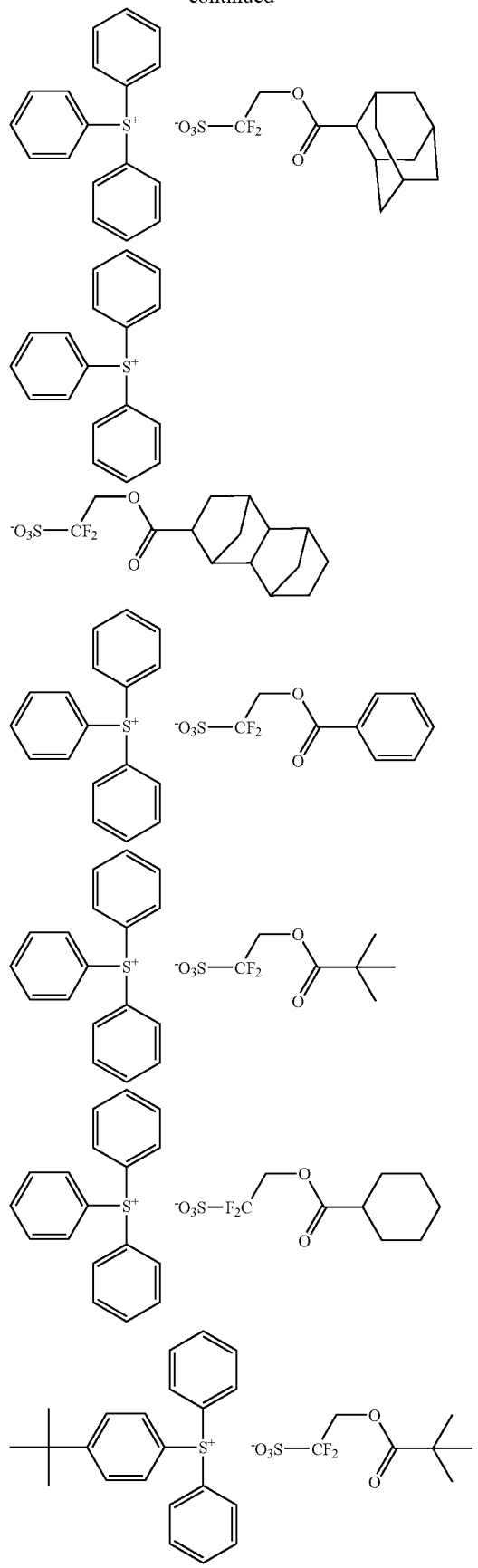
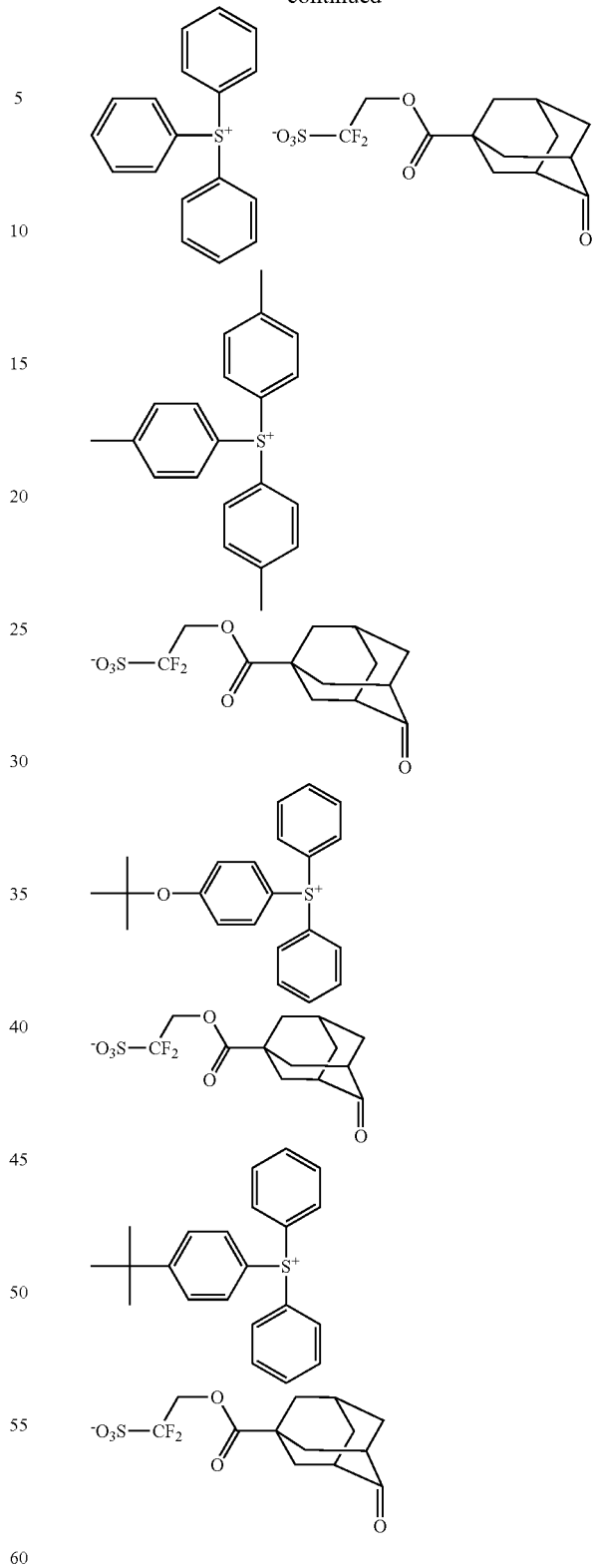
Other Resin Component
In addition to resin component (A) or polymer having formula (1), the resist composition of the invention may further comprise another resin component.
The resin component other than resin component (A) that can be added to the resist composition includes, but is not limited to, polymers comprising units of the following formula (R1) and/or (R2) and having a weight average molecular weight of 1,000 to 100,000, especially 3,000 to 30,000, as measured by GPC versus polystyrene standards.

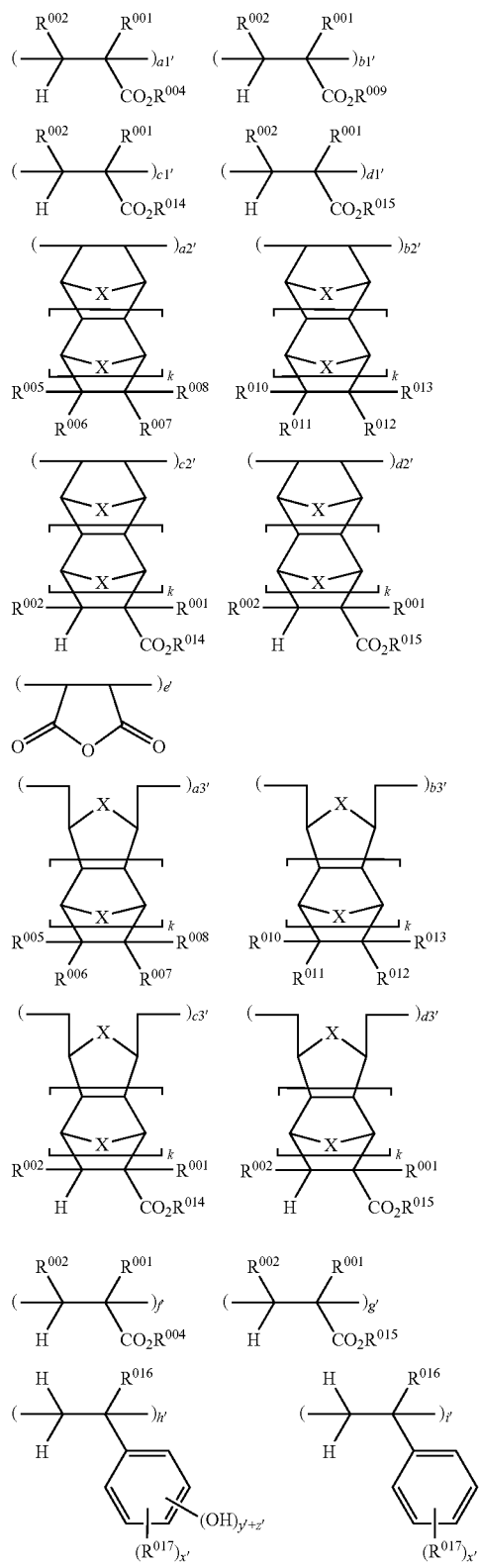

(R1)

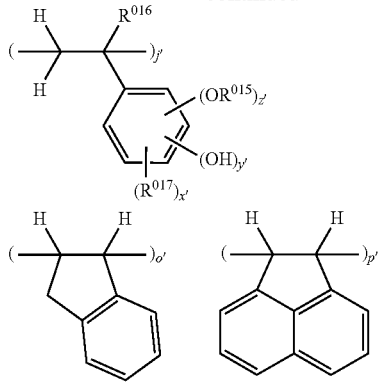

(R2)

Herein, $R^{001}$ is hydrogen, methyl or $CH_2CO_2R^{003}$. $R^{002}$ is hydrogen, methyl or $CO_2R^{003}$. $R^{003}$ is a straight, branched or cyclic $C_1$-$C_{15}$ alkyl group, examples of which include methyl, ethyl, propyl, isopropyl, n-butyl, sec-butyl, tert-butyl, tert-amyl, n-pentyl, n-hexyl, cyclopentyl, cyclohexyl, ethylcyclopentyl, butylcyclopentyl, ethylcyclohexyl, butylcyclohexyl, adamantyl, ethyladamantyl, and butyladamantyl.

$R^{004}$ is hydrogen or a monovalent hydrocarbon group of 1 to 15 carbon atoms having at least one group selected from among fluorinated substituent groups, carboxyl groups and hydroxyl groups. Examples include hydrogen, carboxyethyl, carboxybutyl, carboxycyclopentyl, carboxycyclohexyl, carboxynorbornyl, carboxyadamantyl, hydroxyethyl, hydroxybutyl, hydroxycyclopentyl, hydroxycyclohexyl, hydroxynorbornyl, hydroxyadamantyl, [2,2,2-trifluoro-1-hydroxy-1-(trifluoromethyl)ethyl]-cyclohexyl, and bis[2,2,2-trifluoro-1-hydroxy-1-(trifluoromethyl)ethyl]-cyclohexyl.

At least one of $R^{005}$ to $R^{008}$ represents a carboxyl group or a monovalent hydrocarbon group of 1 to 15 carbon atoms having at least one group selected from among fluorinated substituent groups, carboxyl groups and hydroxyl groups while the remaining R's independently represent hydrogen or straight, branched or cyclic $C_1$-$C_{15}$ alkyl groups. Examples of suitable monovalent $C_1$-$C_{15}$ hydrocarbon groups having at least one group selected from among fluorinated substituent groups, carboxyl groups and hydroxyl groups include carboxymethyl, carboxyethyl, carboxybutyl, hydroxymethyl, hydroxyethyl, hydroxybutyl, 2-carboxyethoxycarbonyl, 4-carboxybutoxycarbonyl, 2-hydroxyethoxycarbonyl, 4-hydroxybutoxycarbonyl, carboxycyclopentyloxycarbonyl, carboxycyclohexyloxycarbonyl, carboxynorbornyloxycarbonyl, carboxyadamantyloxycarbonyl, hydroxycyclopentyloxycarbonyl, hydroxycyclohexyloxycarbonyl, hydroxynorbornyloxycarbonyl, hydroxyadamantyloxycarbonyl, [2,2,2-trifluoro-1-hydroxy-1-(trifluoromethyl)ethyl]-cyclohexyloxycarbonyl, and bis[2,2,2-trifluoro-1-hydroxy-1-(trifluoromethyl)ethyl]-cyclohexyloxycarbonyl. Suitable straight, branched or cyclic $C_1$-$C_{15}$ alkyl groups are as exemplified for $R^{003}$.

Two of $R^{005}$ to $R^{008}$ (for example, a pair of $R^{005}$ and $R^{006}$, $R^{006}$ and $R^{007}$, or $R^{007}$ and $R^{008}$) may bond together to form a ring with the carbon atom(s) to which they are attached, and in that event, at least one of ring-forming $R^{005}$ to $R^{008}$ is a divalent hydrocarbon group of 1 to 15 carbon atoms having at least one group selected from fluorinated substituent groups, carboxyl groups and hydroxyl groups, while the remaining R's are independently single bonds, hydrogen atoms or straight, branched or cyclic $C_1$-$C_{15}$ alkyl groups. Suitable divalent $C_1$-$C_{15}$ hydrocarbon groups having at least one group selected from fluorinated substituent groups, carboxyl groups and hydroxyl groups include those exemplified above as the monovalent hydrocarbon groups having at least one group selected from fluorinated substituent groups, carboxyl groups and hydroxyl groups, with one hydrogen atom eliminated therefrom. Suitable straight, branched or cyclic $C_1$-$C_{15}$ alkyl groups are as exemplified for $R^{003}$.

$R^{009}$ is a monovalent hydrocarbon group of 3 to 15 carbon atoms containing a —$CO_2$— partial structure. Examples include 2-oxooxolan-3-yl, 4,4-dimethyl-2-oxooxolan-3-yl, 4-methyl-2-oxooxan-4-yl, 2-oxo-1,3-dioxolan-4-ylmethyl, and 5-methyl-2-oxooxolan-5-yl.

At least one of $R^{010}$ to $R^{013}$ is a monovalent hydrocarbon group of 2 to 15 carbon atoms containing a —$CO_2$— partial structure, while the remaining R's are independently hydrogen atoms or straight, branched or cyclic $C_1$-$C_{15}$ alkyl groups. Illustrative examples of suitable monovalent $C_2$-$C_{15}$ hydrocarbon groups containing a —$CO_2$— partial structure include 2-oxooxolan-3-yloxycarbonyl, 4,4-dimethyl-2-oxooxolan-3-yloxycarbonyl, 4-methyl-2-oxooxan-4-yloxycarbonyl, 2-oxo-1,3-dioxolan-4-ylmethyloxycarbonyl, and 5-methyl-2-oxooxolan-5-yloxycarbonyl. Suitable straight, branched or cyclic $C_1$-$C_{15}$ alkyl groups are as exemplified for $R^{003}$.

Two of $R^{010}$ to $R^{013}$ (for example, a pair of $R^{010}$ and $R^{011}$, $R^{011}$ and $R^{012}$, or $R^{012}$ and $R^{013}$) may bond together to form a ring with the carbon atom(s) to which they are attached, and in that event, at least one of ring-forming $R^{010}$ to $R^{013}$ is a divalent hydrocarbon group of 1 to 15 carbon atoms containing a —$CO_2$— partial structure, while the remaining R's are independently single bonds, hydrogen atoms or straight, branched or cyclic $C_1$-$C_{15}$ alkyl groups. Illustrative examples of suitable divalent $C_1$-$C_{15}$ hydrocarbon groups containing a —$CO_2$— partial structure include 1-oxo-2-oxapropane-1,3-diyl, 1,3-dioxo-2-oxapropane-1,3-diyl, 1-oxo-2-oxabutane-1,4-diyl, and 1,3-dioxo-2-oxabutane-1,4-diyl, as well as those exemplified as the monovalent hydrocarbon groups containing a —$CO_2$— partial structure, with one hydrogen atom eliminated therefrom. Suitable straight, branched or cyclic $C_1$-$C_{15}$ alkyl groups are as exemplified for $R^{003}$.

$R^{014}$ is a polycyclic hydrocarbon group having 7 to 15 carbon atoms or an alkyl group containing such a polycyclic hydrocarbon group. Examples include norbornyl, bicyclo[3.3.1]nonyl, tricyclo[5.2.1.0$^{2,6}$]decyl, adamantyl, norbornylmethyl, and adamantylmethyl as well as alkyl- or cycloalkyl-substituted forms of the foregoing. $R^{015}$ is an acid labile group, which will be described later in detail. $R^{016}$ is hydrogen or methyl. $R^{017}$ is a straight, branched or cyclic $C_1$-$C_8$ alkyl group, examples of which include methyl, ethyl, propyl, isopropyl, n-butyl, sec-butyl, tert-butyl, tert-amyl, n-pentyl, n-hexyl, cyclopentyl and cyclohexyl. X is $CH_2$ or an oxygen atom. Letter k is 0 or 1.

The acid labile group represented by $R^{015}$ may be selected from a variety of such groups to be deprotected with the acid generated from the photoacid generator. It may be any of well-known acid labile groups commonly used in prior art resist compositions, especially chemically amplified resist compositions. Examples of the acid labile group are groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

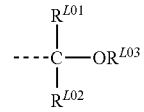

(L1)

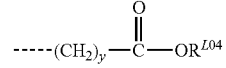

(L2)

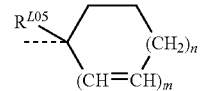

(L3)

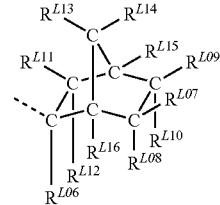

(L4)

Herein, the broken line denotes a valence bond. In formula (L1), $R^{L01}$ and $R^{L02}$ are hydrogen or straight, branched or cyclic alkyl groups of 1 to 18 carbon atoms, preferably 1 to 10 carbon atoms. Exemplary alkyl groups include methyl, ethyl, propyl, isopropyl, n-butyl, sec-butyl, tert-butyl, cyclopentyl, cyclohexyl, 2-ethylhexyl, n-octyl, and adamantyl. $R^{L03}$ is a monovalent hydrocarbon group of 1 to 18 carbon atoms, preferably 1 to 10 carbon atoms, which may contain a heteroatom such as oxygen, examples of which include unsubstituted straight, branched or cyclic alkyl groups and substituted forms of such alkyl groups in which some hydrogen atoms are replaced by hydroxyl, alkoxy, oxo, amino, alkylamino or the like. Illustrative examples of the straight, branched or cyclic alkyl groups are as exemplified above for $R^{L01}$ and $R^{L02}$, and examples of the substituted alkyl groups are as shown below.

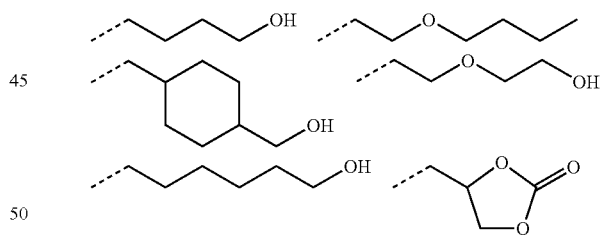

A pair of $R^{L01}$ and $R^{L02}$, $R^{L01}$ and $R^{L03}$, or $R^{L02}$ and $R^{L03}$ may bond together to form a ring with carbon and oxygen atoms to which they are attached. Each of $R^{L01}$, $R^{L02}$ and $R^{L03}$ is a straight or branched alkylene group of 1 to 18 carbon atoms, preferably 1 to 10 carbon atoms when they form a ring.

In formula (L2), $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). Exemplary tertiary alkyl groups are tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 2-(tricyclo[5.2.1.0$^{2,6}$]decan-8-yl)propan-2-yl, 2-(tetracyclo[6.2.1.1³,⁶.0²,⁷]dodecan-4-yl)propan-2-yl,
1-ethylcyclopentyl, 1-butylcyclopentyl, 1-ethylcyclohexyl,
1-butylcyclohexyl, 1-ethyl-2-cyclopentenyl,
1-ethyl-2-cyclohexenyl, 2-methyl-2-adamantyl,
2-ethyl-2-adamantyl, 8-methyl-8-tricyclo[5.2.1.0²,⁶]decyl,
8-ethyl-8-tricyclo[5.2.1.0²,⁶]decyl,
4-methyl-4-tetracyclo[6.2.1.1³,⁶.0²,⁷]dodecyl,
4-ethyl-4-tetracyclo[6.2.1.1³,⁶.0²,⁷]dodecyl, and the like.
Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Letter y is an integer of 0 to 6.

In formula (L3), $R^{L05}$ is an optionally substituted, straight, branched or cyclic $C_1$-$C_{10}$ alkyl group or an optionally substituted $C_6$-$C_{20}$ aryl group. Examples of the optionally substituted alkyl groups include straight, branched or cyclic alkyl groups such as methyl, ethyl, propyl, isopropyl, n-butyl, sec-butyl, tert-butyl, tert-amyl, n-pentyl, n-hexyl, cyclopentyl, cyclohexyl, and bicyclo[2.2.1]heptyl, and substituted forms of such groups in which some hydrogen atoms are replaced by hydroxyl, alkoxy, carboxy, alkoxycarbonyl, oxo, amino, alkylamino, cyano, mercapto, alkylthio, sulfo or other groups or in which some methylene groups are replaced by oxygen or sulfur atoms. Examples of optionally substituted aryl groups include phenyl, methylphenyl, naphthyl, anthryl, phenanthryl, and pyrenyl. Letter m is equal to 0 or 1, n is equal to 0, 1, 2 or 3, and 2m+n is equal to 2 or 3.

In formula (L4), $R^{L06}$ is an optionally substituted, straight, branched or cyclic $C_1$-$C_{10}$ alkyl group or an optionally substituted $C_6$-$C_{20}$ aryl group. Examples of these groups are the same as exemplified for $R^{L05}$. $R^{L07}$ to $R^{L16}$ independently represent hydrogen or monovalent hydrocarbon groups of 1 to 15 carbon atoms. Exemplary hydrocarbon groups are straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of these groups in which some hydrogen atoms are replaced by hydroxyl, alkoxy, carboxy, alkoxycarbonyl, oxo, amino, alkylamino, cyano, mercapto, alkylthio, sulfo or other groups. Alternatively, two of $R^{L07}$ to $R^{L16}$ may bond together to form a ring with the carbon atom(s) to which they are attached (for example, a pair of $R^{L07}$ and $R^{L08}$, $R^{L07}$ and $R^{L09}$, $R^{L08}$ and $R^{L10}$, $R^{L09}$ and $R^{L10}$, $R^{L11}$ and $R^{L12}$, $R^{L13}$ and $R^{L14}$, or a similar pair form a ring). Each of $R^{L07}$ to $R^{L16}$ represents a divalent $C_1$-$C_{15}$ hydrocarbon group when they form a ring, examples of which are those exemplified above for the monovalent hydrocarbon groups, with one hydrogen atom being eliminated. Two of $R^{L07}$ to $R^{L16}$ which are attached to vicinal carbon atoms may bond together directly to form a double bond (for example, a pair of $R^{L07}$ and $R^{L09}$, $R^{L09}$ and $R^{L15}$, $R^{L13}$ and $R^{L15}$, or a similar pair).

Of the acid labile groups of formula (L1), the straight and branched ones are exemplified by the following groups.

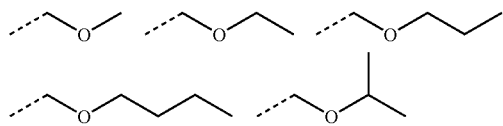

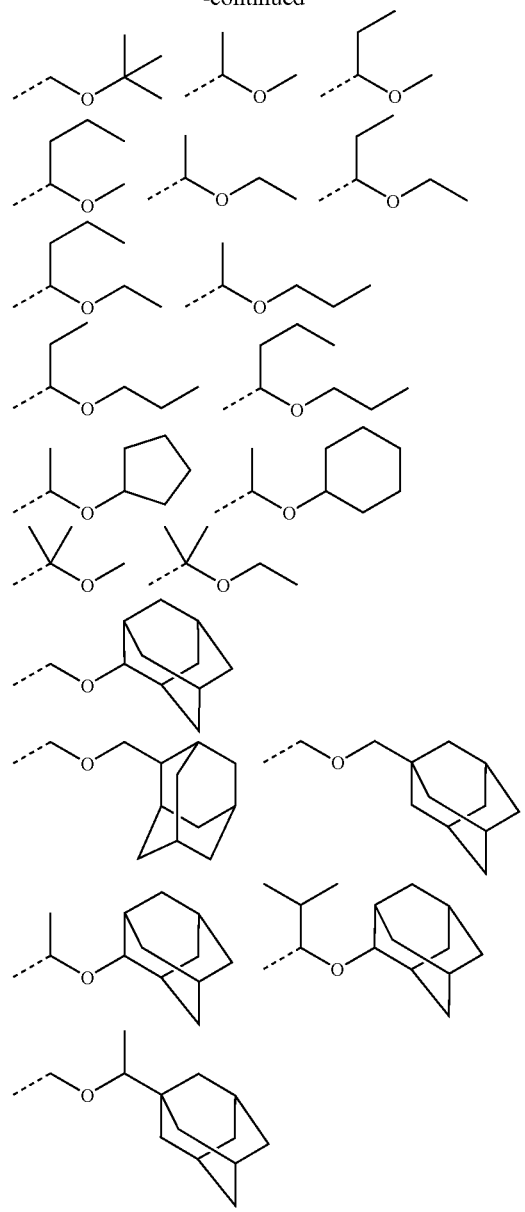

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile groups of formula (L2) include tert-butoxycarbonyl, tert-butoxycarbonylmethyl, tert-amyloxycarbonyl, tert-amyloxycarbonylmethyl,
1,1-diethylpropyloxycarbonyl,
1,1-diethylpropyloxycarbonylmethyl,
1-ethylcyclopentyloxycarbonyl,
1-ethylcyclopentyloxycarbonylmethyl,
1-ethyl-2-cyclopentenyloxycarbonyl,
1-ethyl-2-cyclopentenyloxycarbonylmethyl,
1-ethoxyethoxycarbonylmethyl,
2-tetrahydropyranyloxycarbonylmethyl, and
2-tetrahydrofuranyloxycarbonylmethyl groups.

Examples of the acid labile groups of formula (L3) include
1-methylcyclopentyl, 1-ethylcyclopentyl,
1-n-propylcyclopentyl, 1-isopropylcyclopentyl, 1-n-butylcyclopentyl, 1-sec-butylcyclopentyl, 1-cyclohexylcyclopentyl, 1-(4-methoxybutyl)cyclopentyl, 1-(bicyclo[2.2.1]heptan-2-yl)cyclopentyl, 1-(7-oxabicyclo[2.2.1]heptan-2-yl)cyclopentyl, 1-methylcyclohexyl, 1-ethylcyclohexyl, 1-methyl-2-cyclopentenyl, 1-ethyl-2-cyclopentenyl, 1-methyl-2-cyclohexenyl, and 1-ethyl-2-cyclohexenyl groups.

Of the acid labile groups of formula (L4), those groups of the following formulae (L4-1) to (L4-4) are preferred.

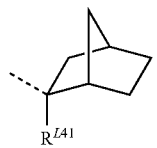
(L4-1)

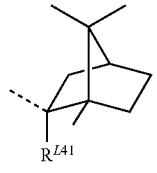
(L4-2)

(L4-3)

(L4-4)

In formulas (L4-1) to (L4-4), the broken line denotes a bonding site and direction. $R^{L41}$ is each independently a monovalent hydrocarbon group, typically a straight, branched or cyclic $C_1$-$C_{10}$ alkyl group, such as methyl, ethyl, propyl, isopropyl, n-butyl, sec-butyl, tert-butyl, tert-amyl, n-pentyl, n-hexyl, cyclopentyl and cyclohexyl.

For formulas (L4-1) to (L4-4), there can exist enantiomers and diastereomers. Each of formulae (L4-1) to (L4-4) collectively represents all such stereoisomers. Such stereoisomers may be used alone or in admixture.

For example, the general formula (L4-3) represents one or a mixture of two selected from groups having the following general formulas (L4-3-1) and (L4-3-2).

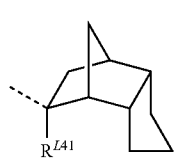
(L4-3-1)

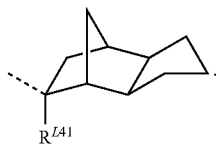
(L4-3-2)

Similarly, the general formula (L4-4) represents one or a mixture of two or more selected from groups having the following general formulas (L4-4-1) to (L4-4-4).

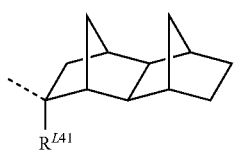
(L4-4-1)

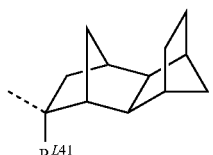
(L4-4-2)

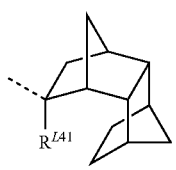
(L4-4-3)

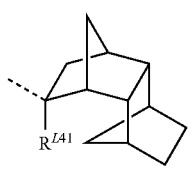
(L4-4-4)

Each of formulas (L4-1) to (L4-4), (L4-3-1) and (L4-3-2), and (L4-4-1) to (L4-4-4) collectively represents an enantiomer thereof and a mixture of enantiomers.

It is noted that in the above formulas (L4-1) to (L4-4), (L4-3-1) and (L4-3-2), and (L4-4-1) to (L4-4-4), the bond direction is on the exo side relative to the bicyclo[2.2.1] heptane ring, which ensures high reactivity for acid catalyzed elimination reaction (see JP-A 2000-336121). In preparing these monomers having a tertiary exo-alkyl group of bicyclo [2.2.1]heptane structure as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

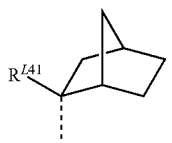
(L4-1-endo)

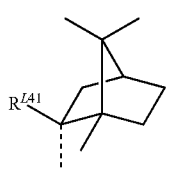
(L4-2-endo)

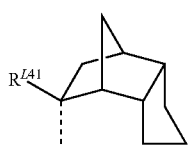
(L4-3-endo)

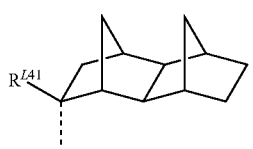
(L4-4-endo)

Illustrative examples of the acid labile group of formula (L4) are given below

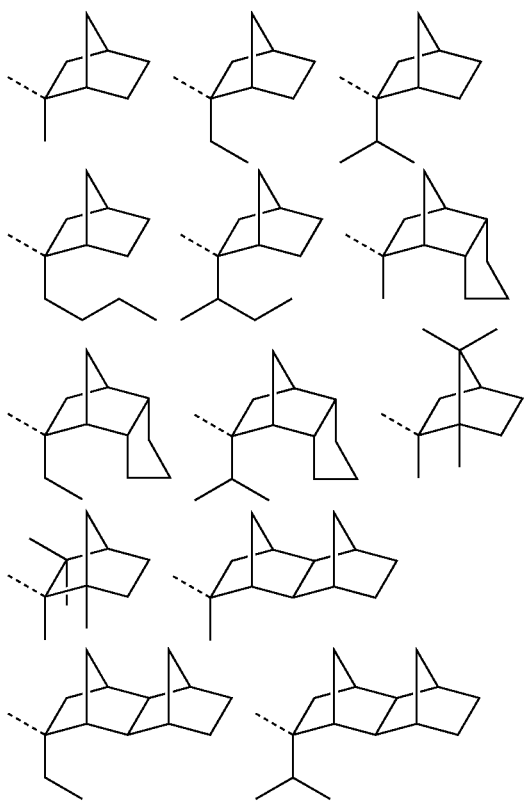

Examples of the tertiary $C_4$-$C_{20}$ alkyl groups, trialkylsilyl groups in which each alkyl moiety has 1 to 6 carbon atoms, and $C_4$-$C_{20}$ oxoalkyl groups, represented by $R^{O15}$, are as exemplified for $R^{L04}$ and the like.

In formula (R2), $R^{O16}$ is hydrogen or methyl. $R^{O17}$ is a straight, branched or cyclic $C_1$-$C_8$ alkyl group.

In formulae (R1) and (R2), letters a1', a2', a3', b1', b2', b3', c1', c2', c3', d1', d2', d3', and e' are numbers from 0 to less than 1, satisfying a1'+a2'+a3'+b1'+b2'+b3'+c1'+c2'+c3'+d1'+d2'+d3'+e'=1; f', g', h', i', j', o', and p' are numbers from 0 to less than 1, satisfying f'+g'+h'+i'+j'+o'+p'=1; x', y' and z' are each an integer of 0 to 3, satisfying $1 \leq x'+y'+z' \leq 5$ and $1 \leq y'+z' \leq 3$.

With respect to the recurring units of formula (R1) and (R2), units of more than one type may be incorporated at the same time. Incorporation of units of more than one type enables to adjust the performance of a resist material in which the resulting polymer is formulated.

Understandably, the sum of respective units=1 means that in a polymer comprising recurring units, the total of the indicated recurring units is 100 mol % relative to the total of entire recurring units.

Examples of the recurring units incorporated at compositional ratio a1' in formula (R1) and the recurring units incorporated at compositional ratio f' in formula (R2) are given below, but not limited thereto. It is noted that some polymer compositions illustrated overlap the polymer compositions as resin component (A), but these examples do not deny the polymer compositions as resin component (A).

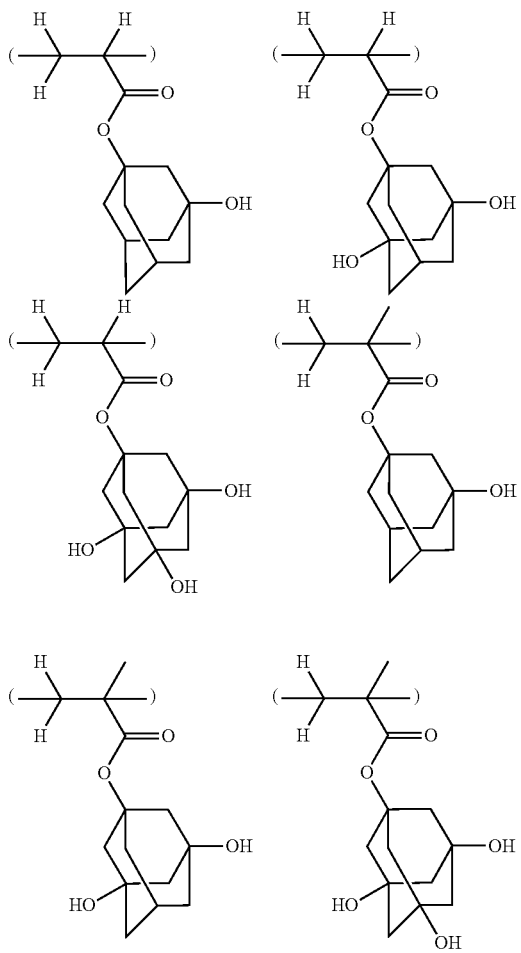

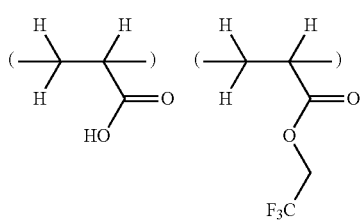

-continued
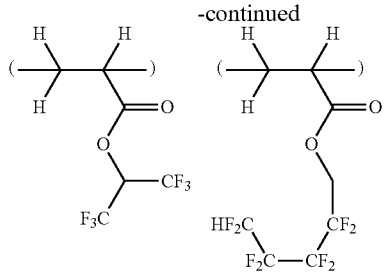
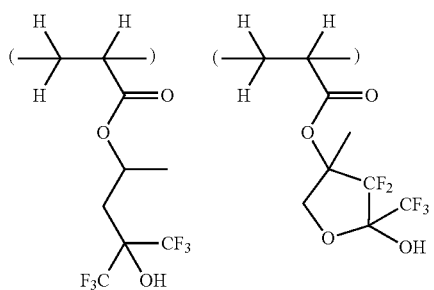
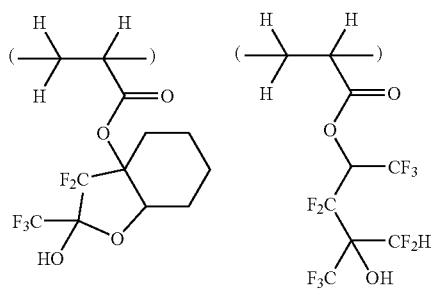
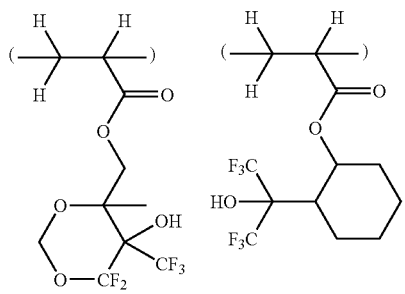
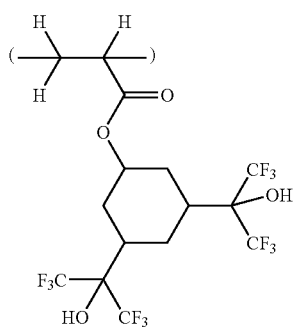
-continued
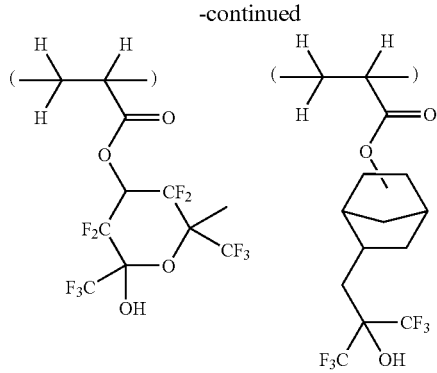
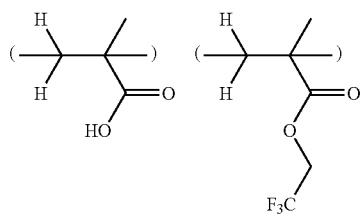
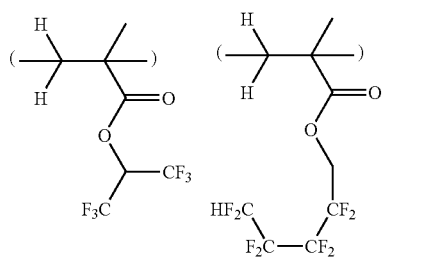
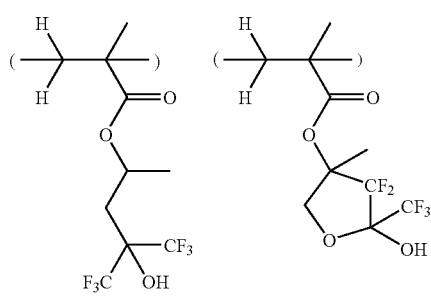
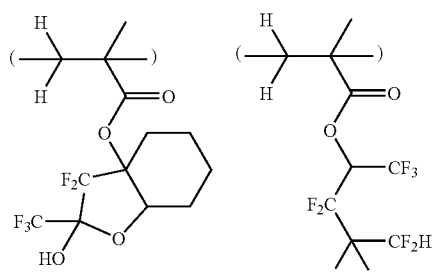
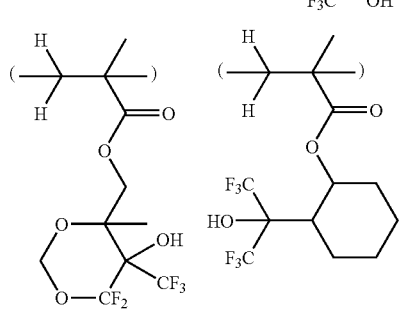

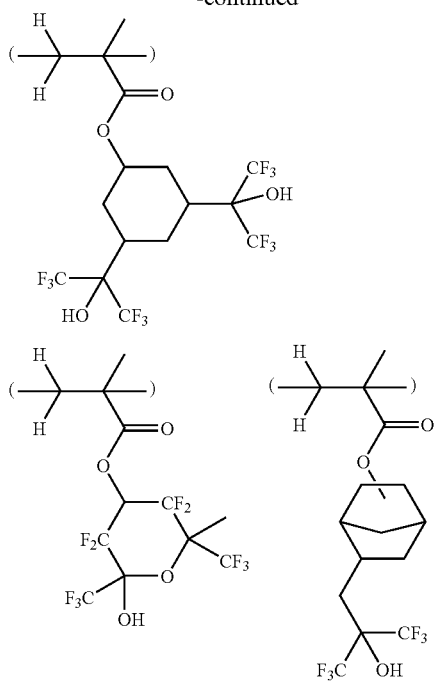
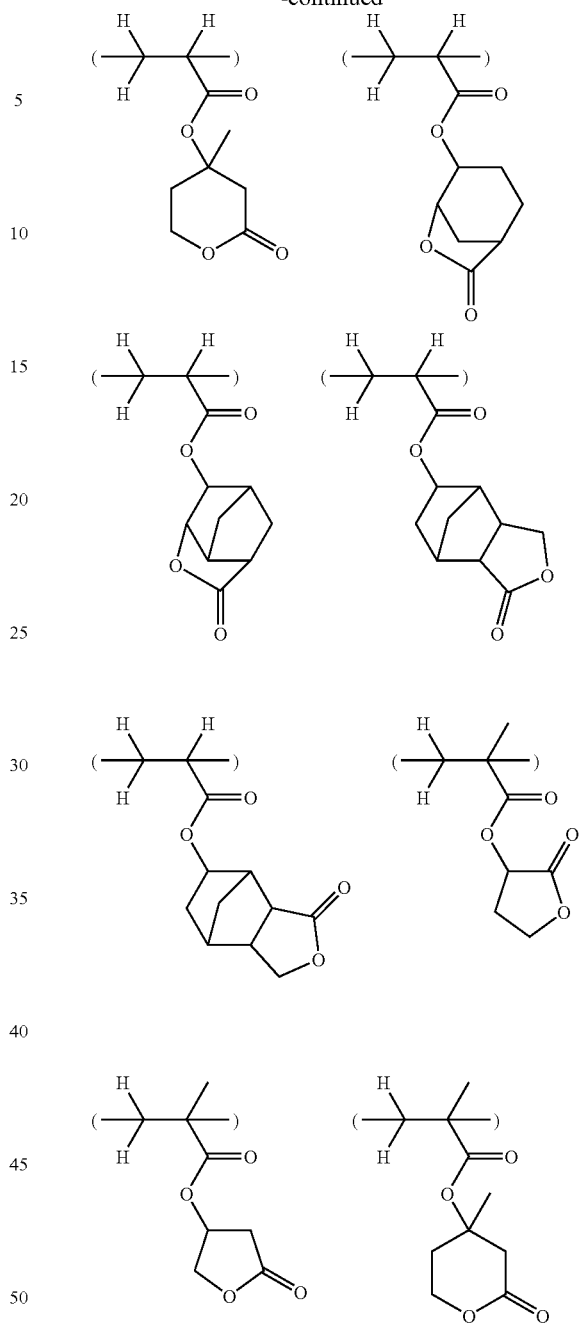
Examples of the recurring units incorporated at compositional ratio b1' in formula (R1) are given below, but not limited thereto.
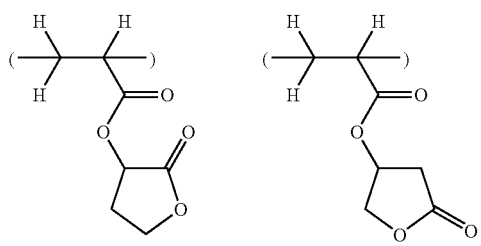
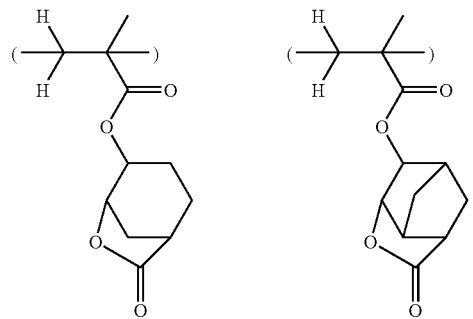

-continued
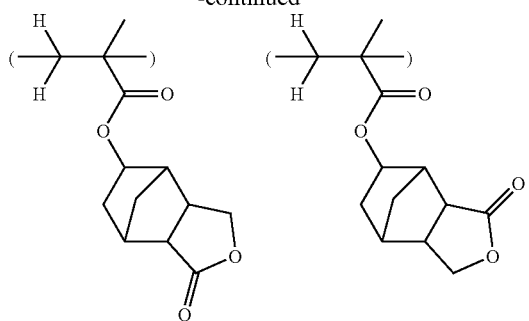
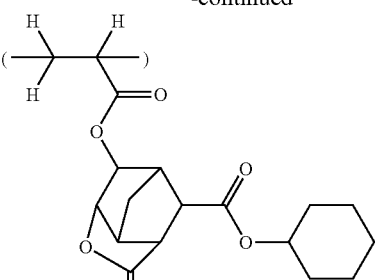
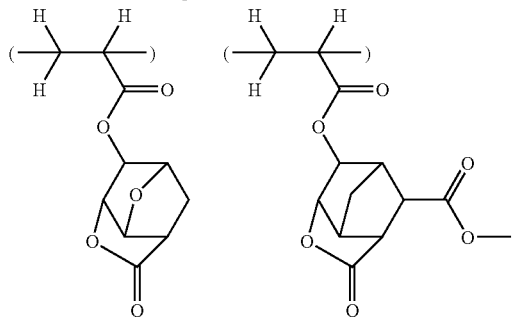
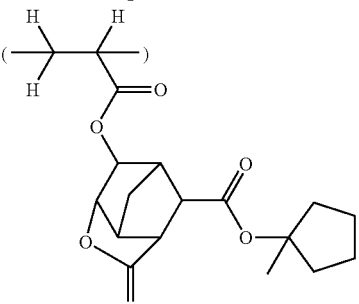
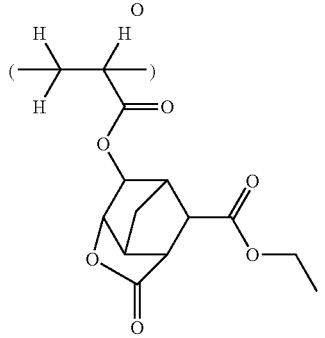
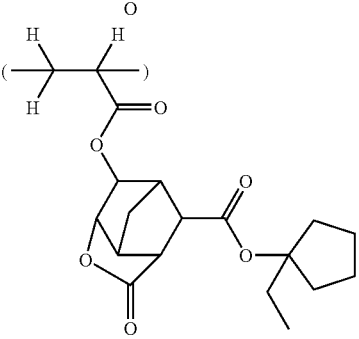
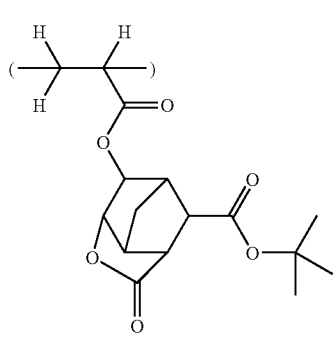
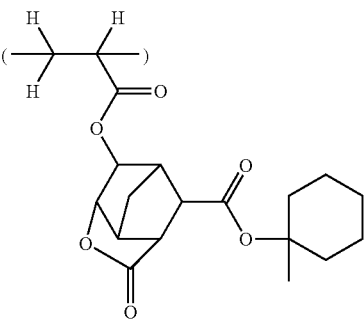
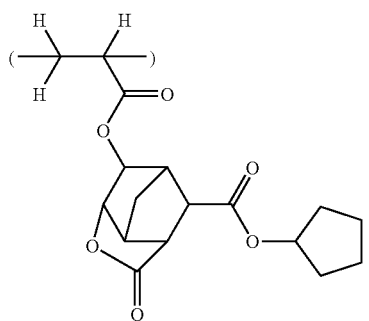
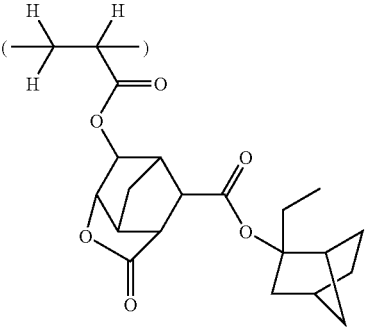

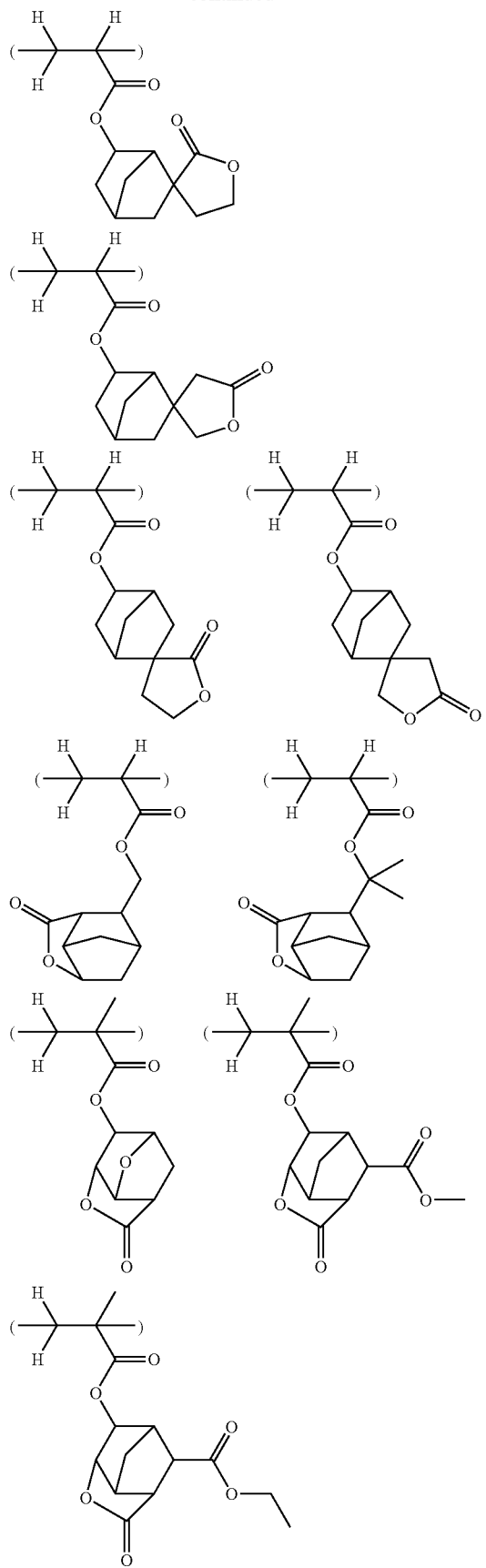
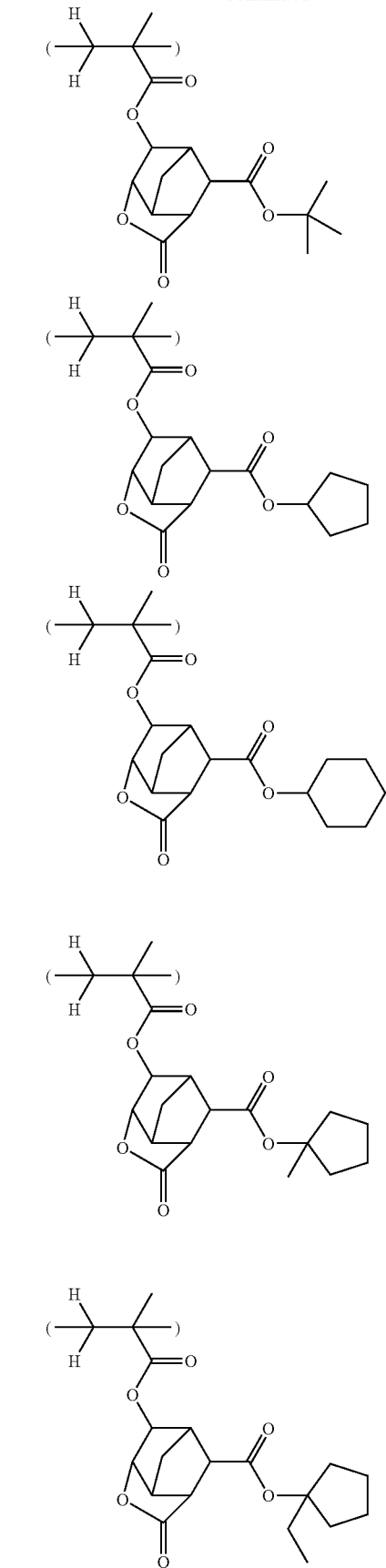

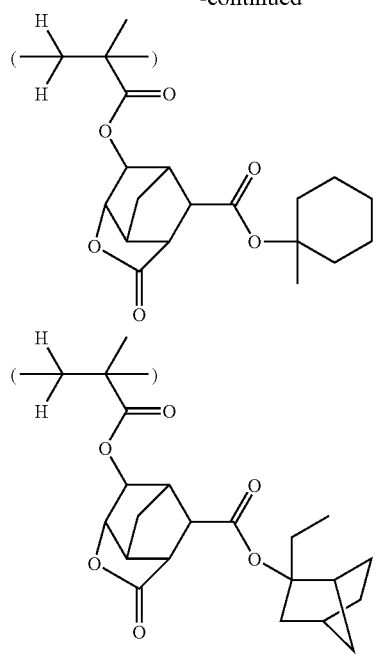
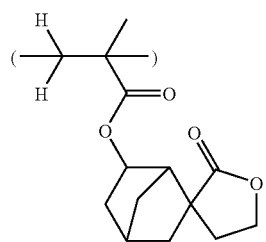
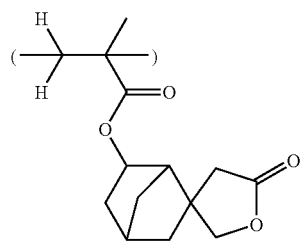
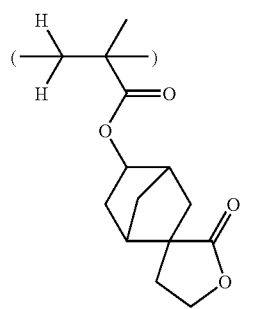
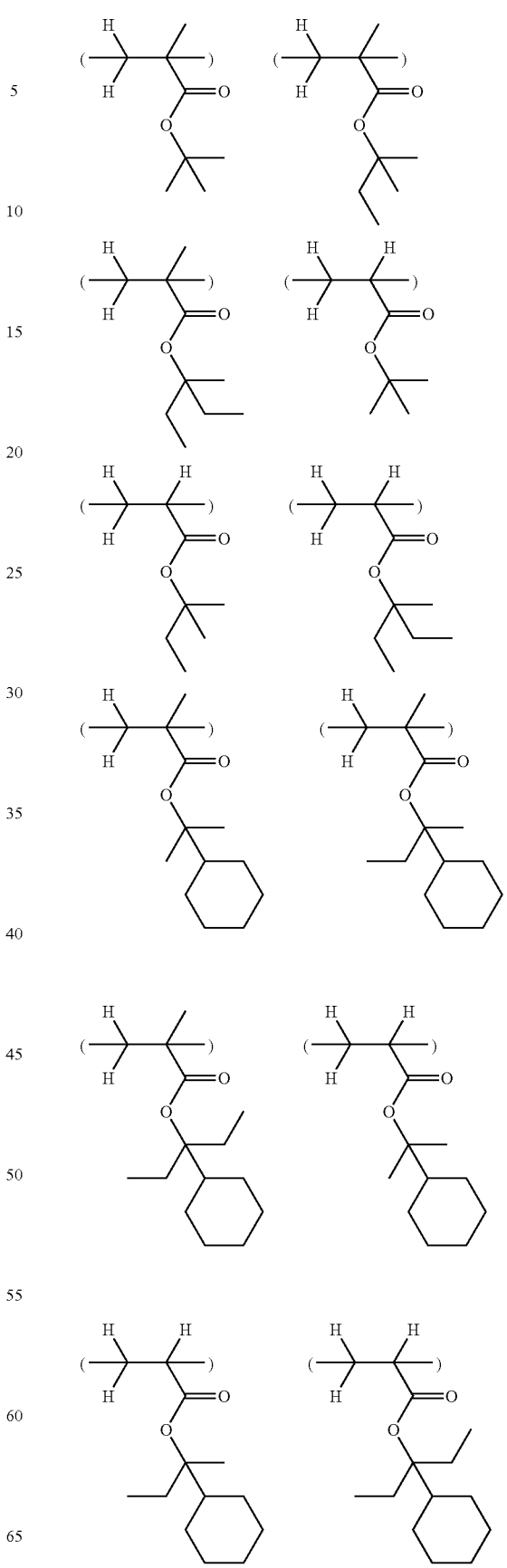
Examples of the recurring units incorporated at compositional ratio d1' in formula (R1) and the recurring units incorporated at compositional ratio g' in formula (R2) are given below, but not limited thereto.

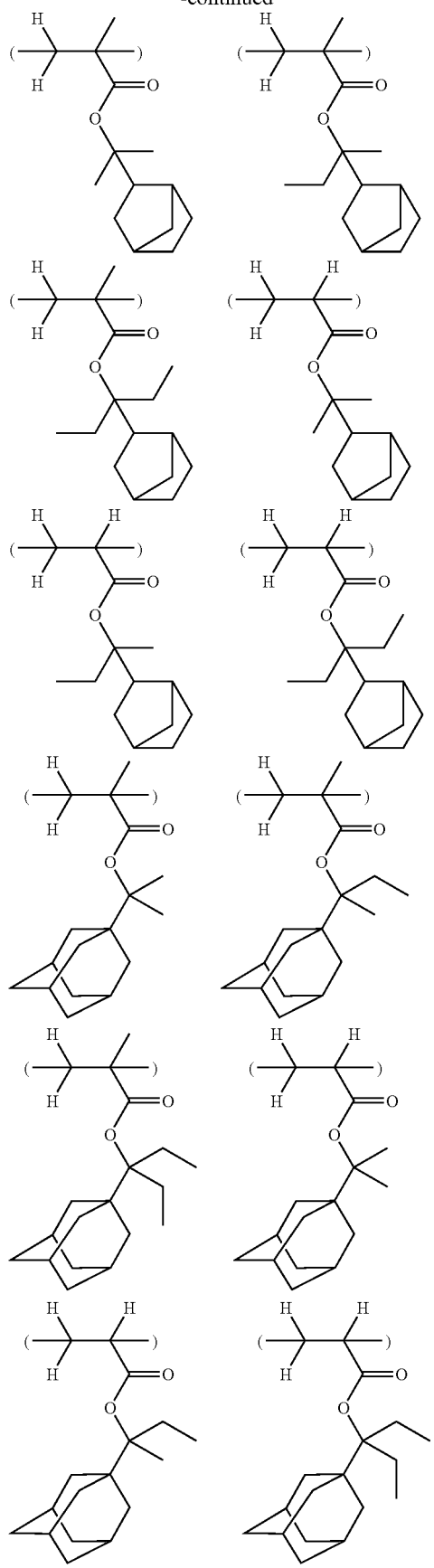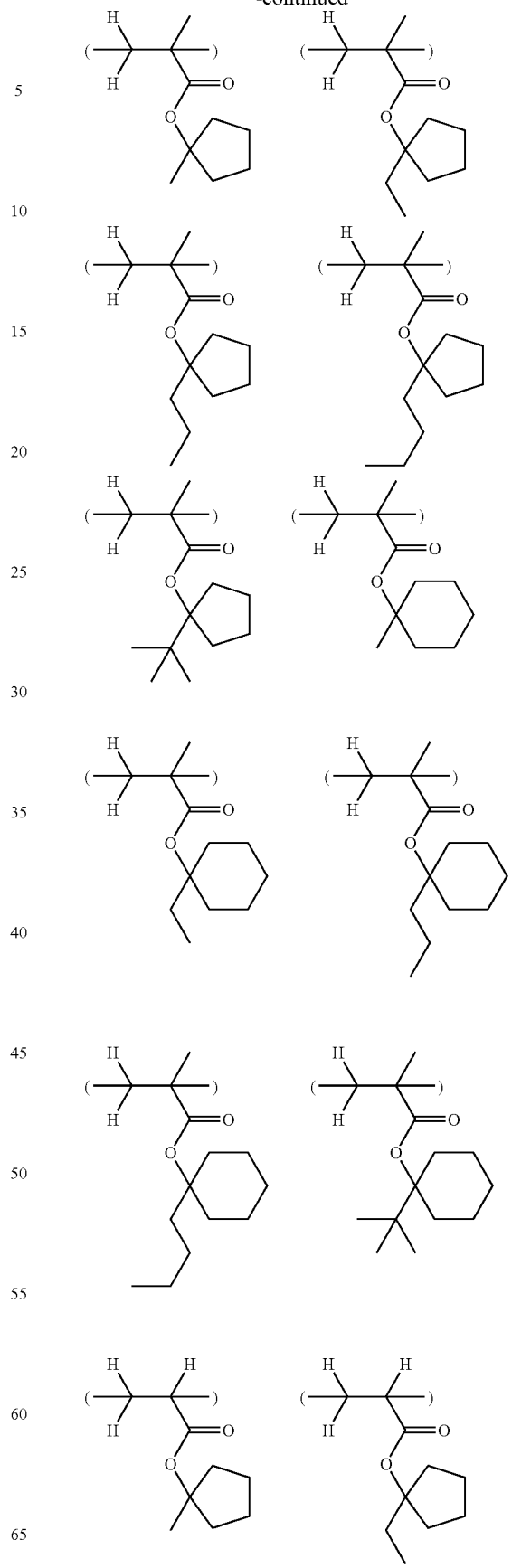

-continued
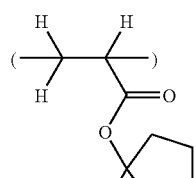 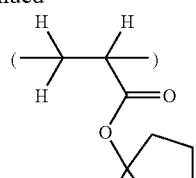
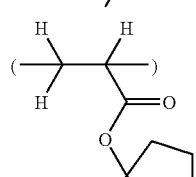 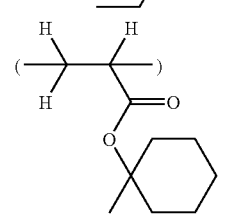
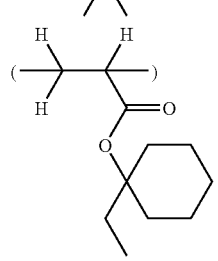 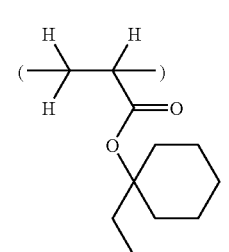
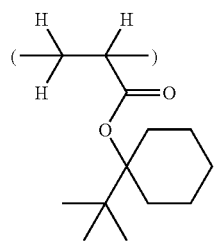 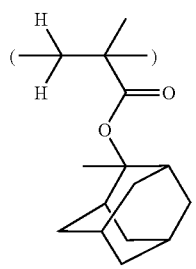
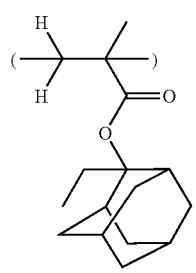 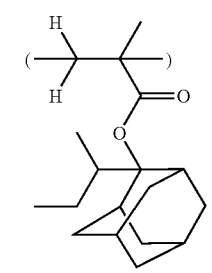
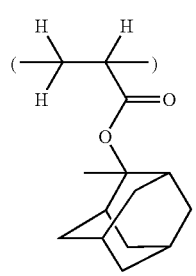 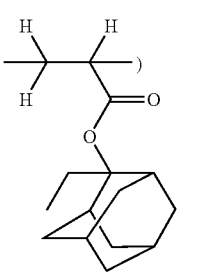
-continued
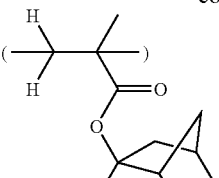 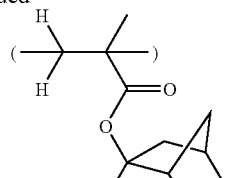
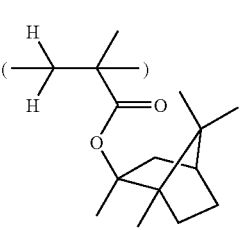 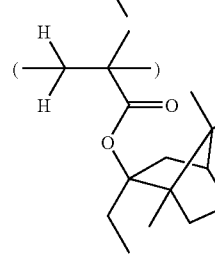
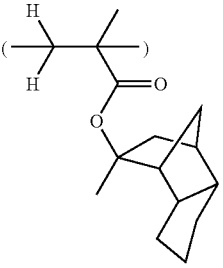 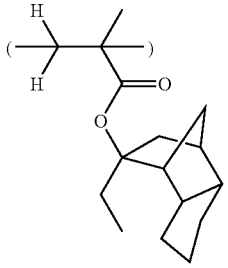
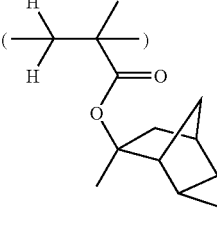
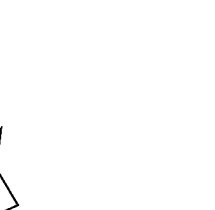
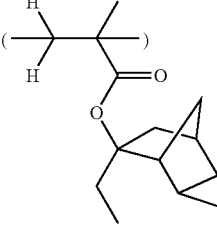 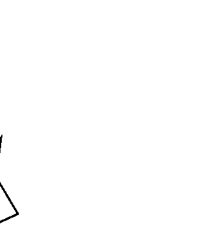
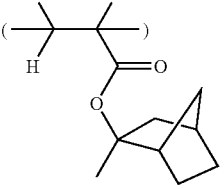 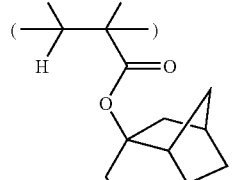
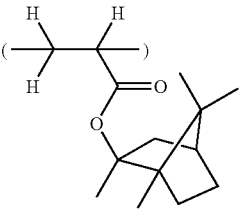 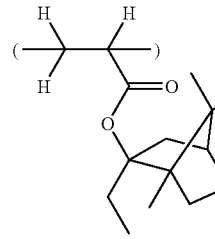

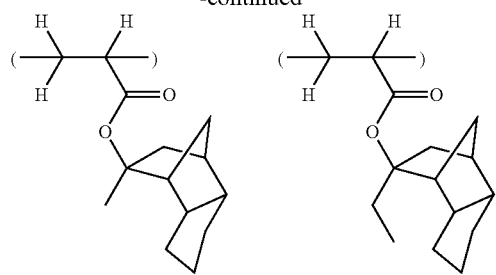
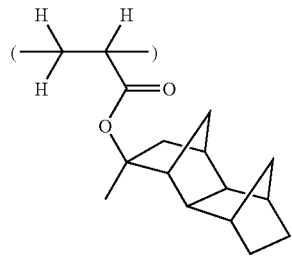
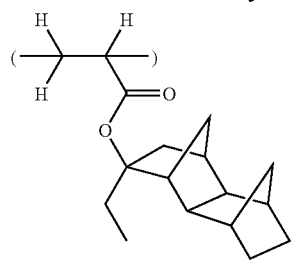
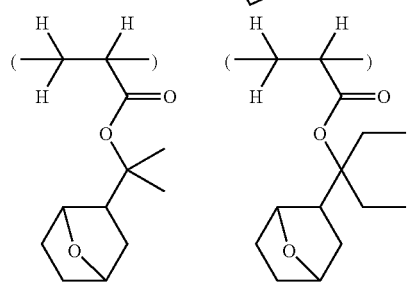
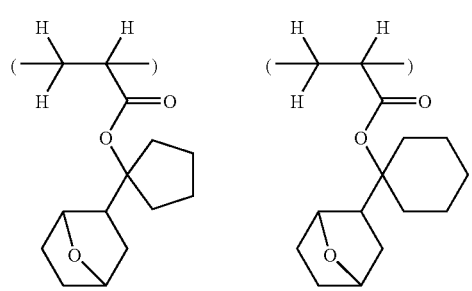
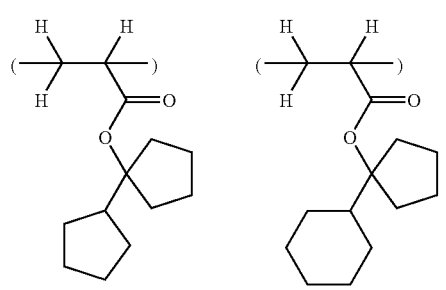
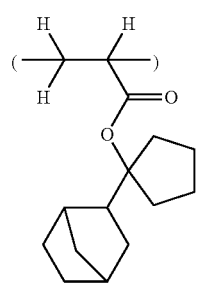
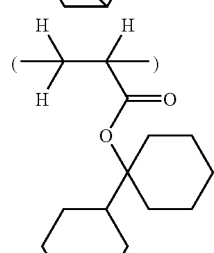
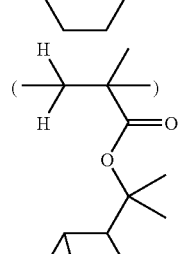
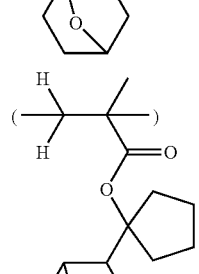
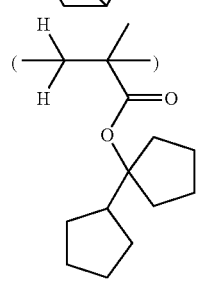
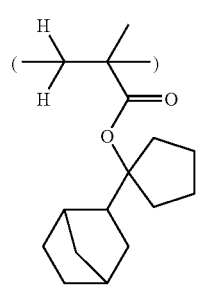

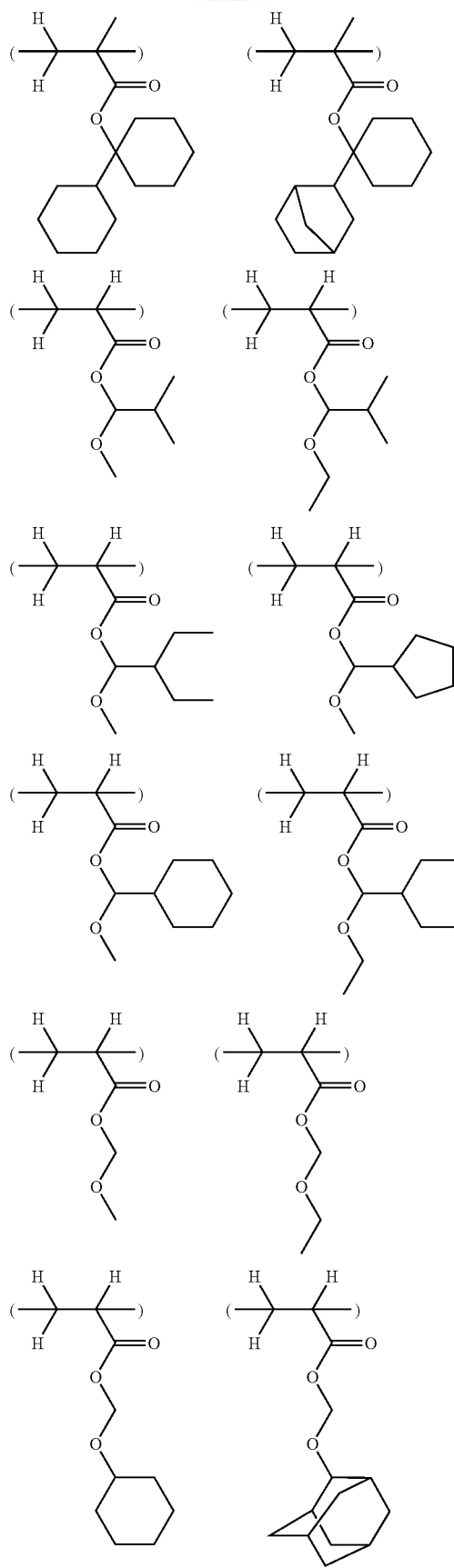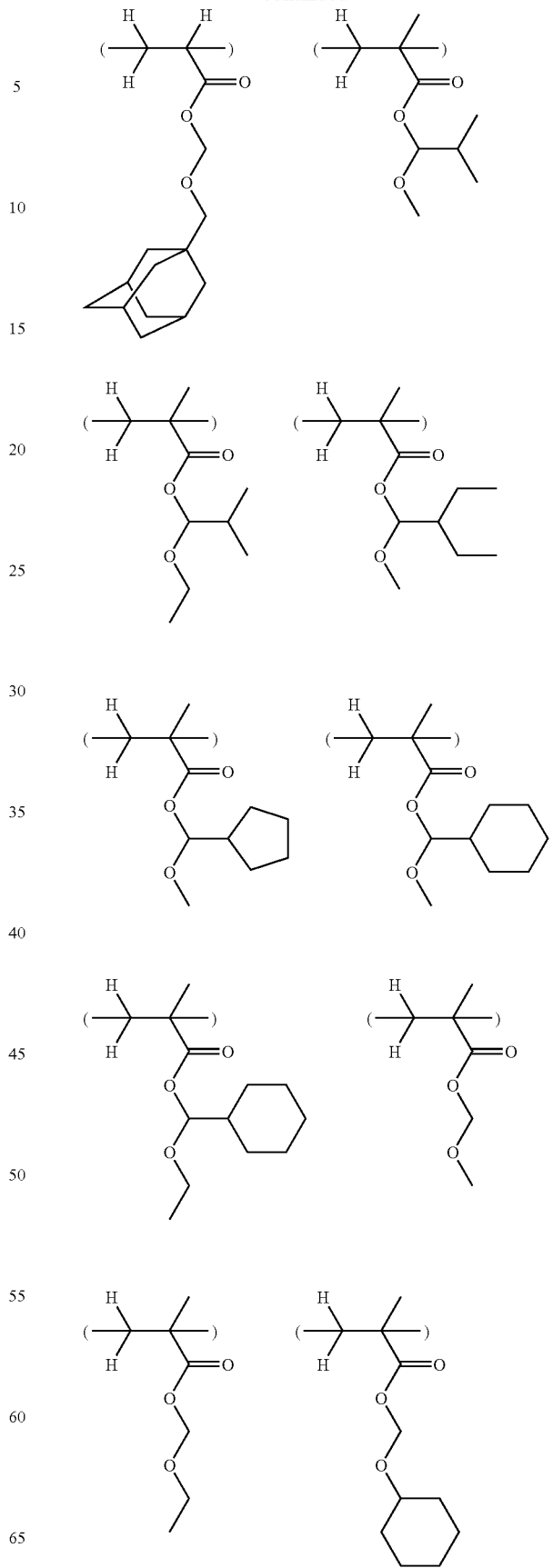

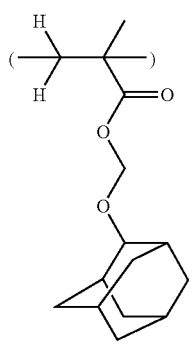
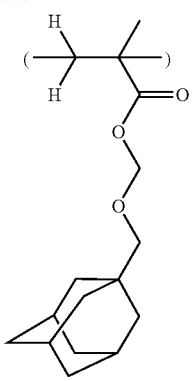
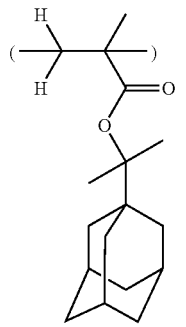
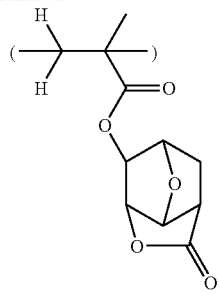
Exemplary polymers comprising recurring units incorporated at compositional ratios a1', b1', c1', and d1' in formula (R1) are shown below, but not limited thereto. It is noted that some polymer compositions illustrated overlap the polymer compositions as resin component (A), but these examples do not restrict or deny the polymer compositions as resin component (A).
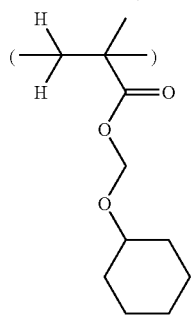
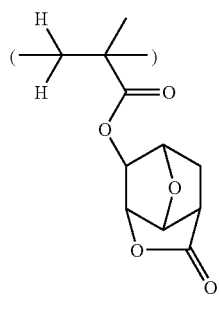
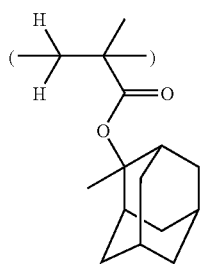
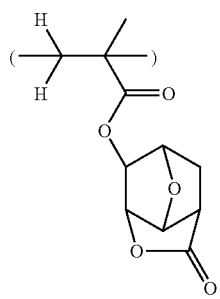
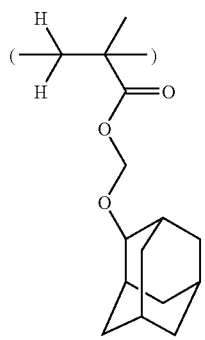
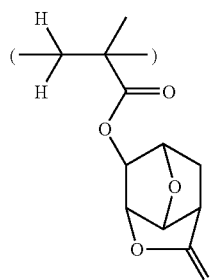
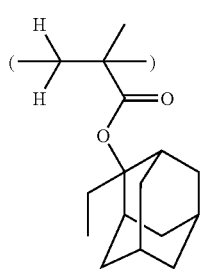
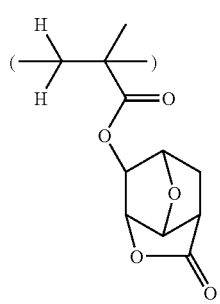
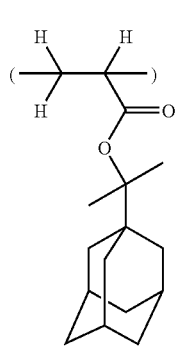
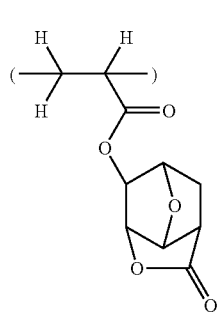
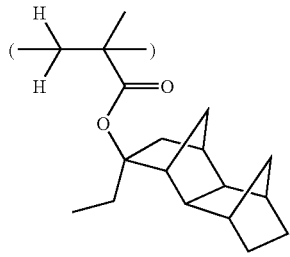
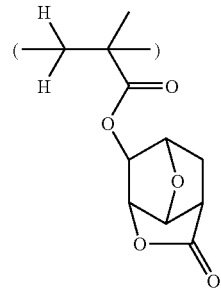
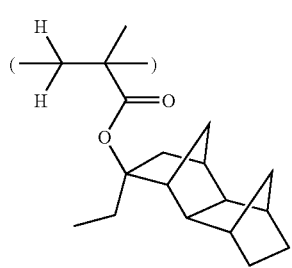

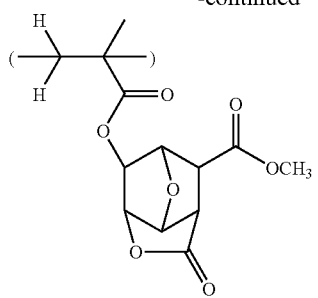
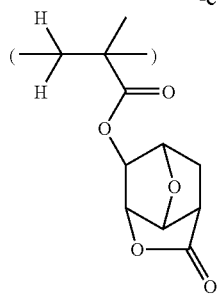
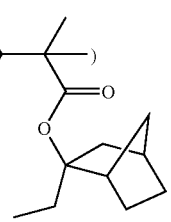
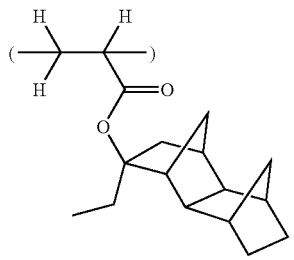
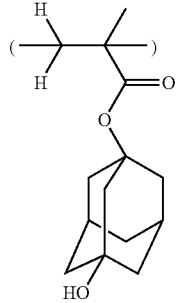
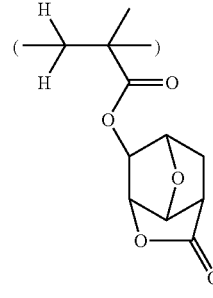
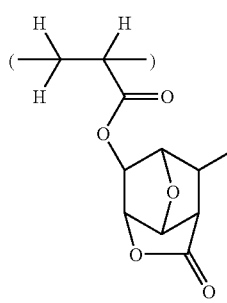
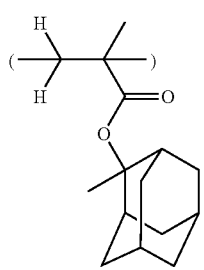
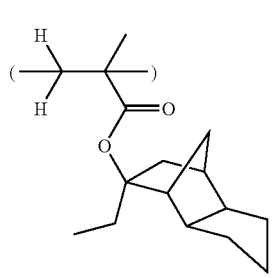
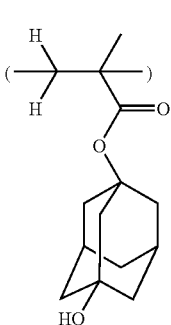
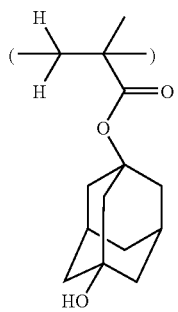
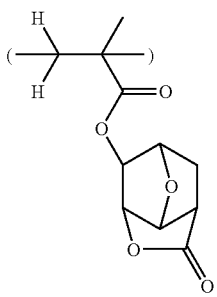
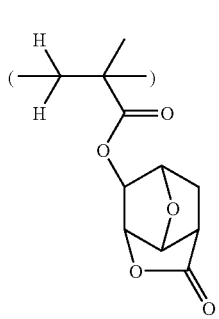
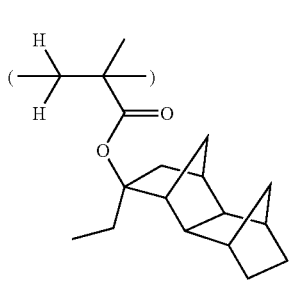
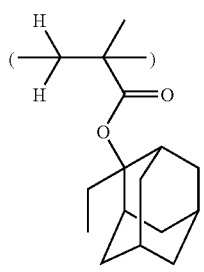
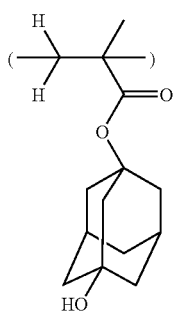
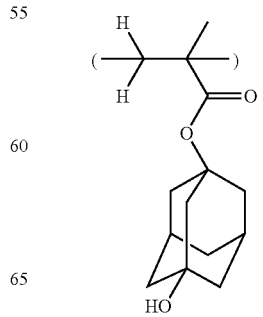
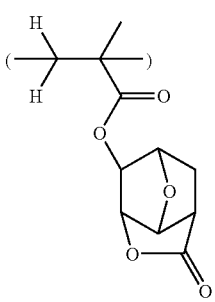

-continued
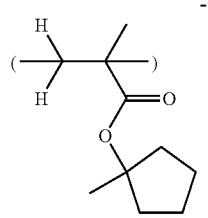 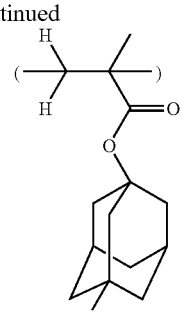 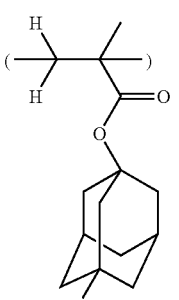 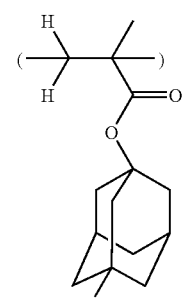
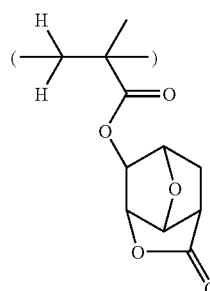 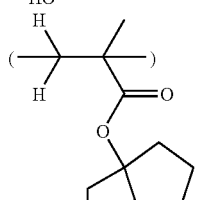 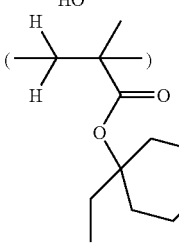 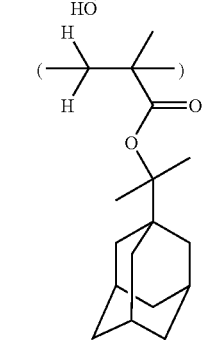
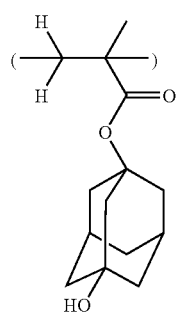 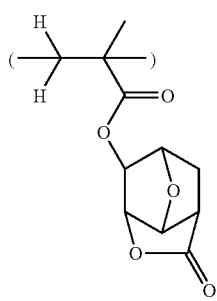 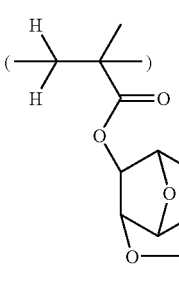 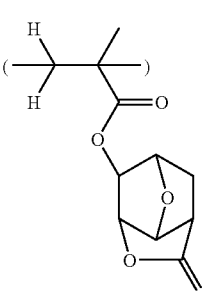
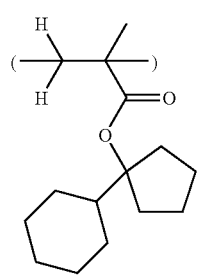 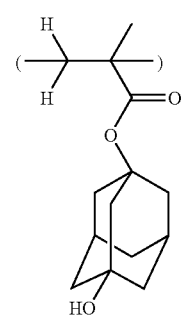 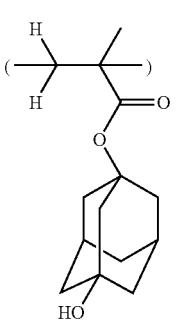
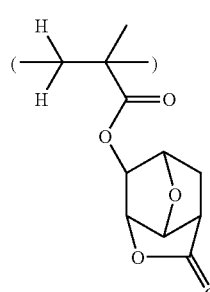 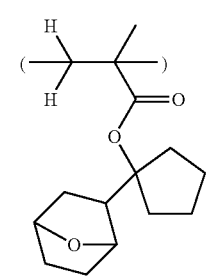 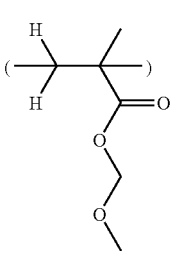 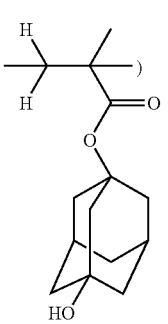

-continued
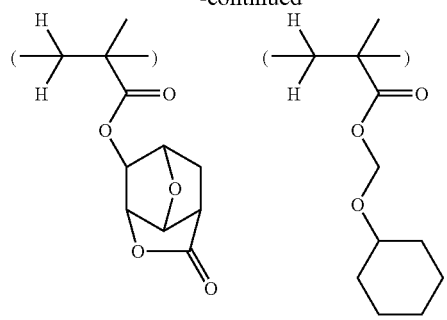
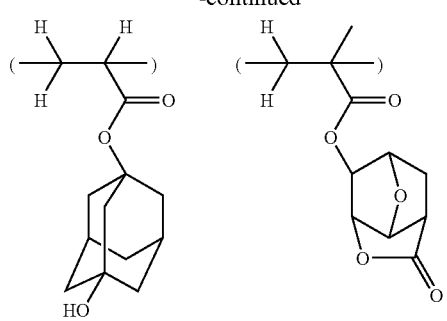
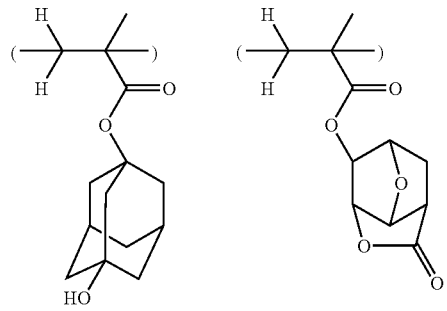
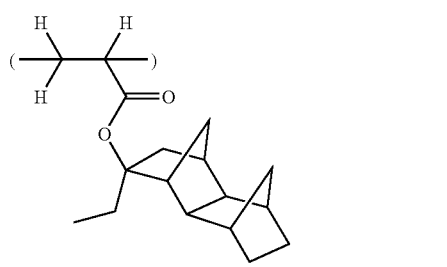
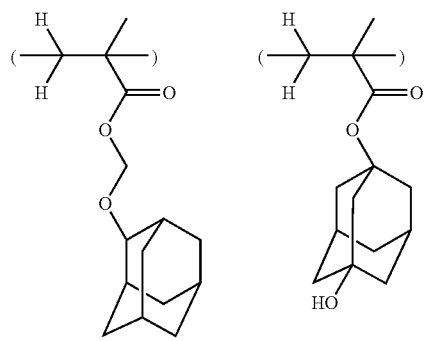
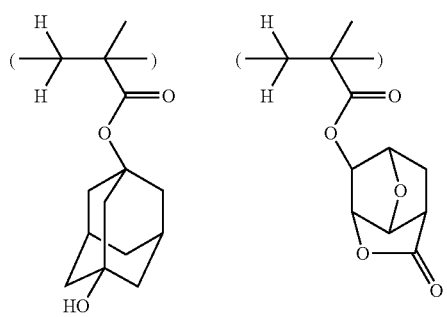
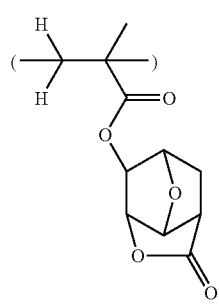
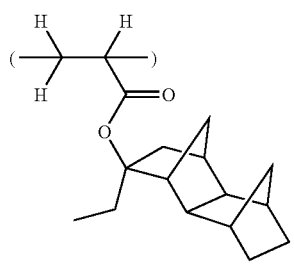
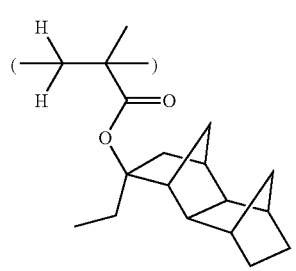
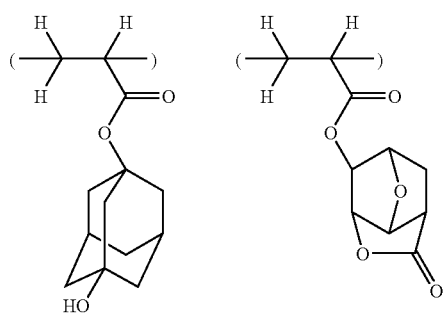

-continued
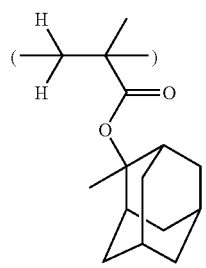 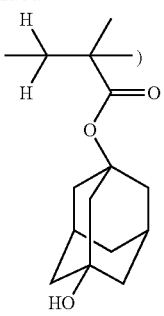 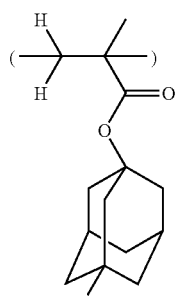 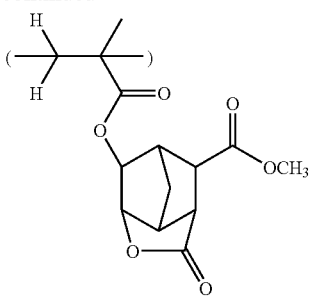
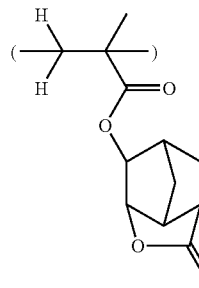 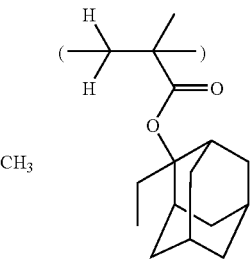 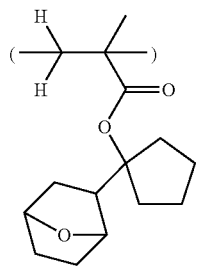 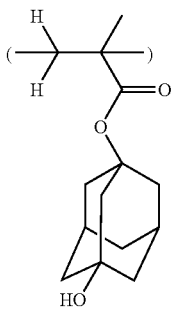
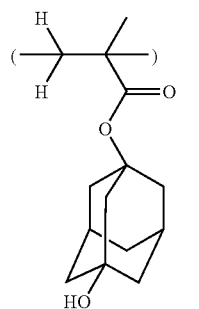 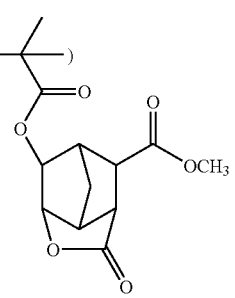 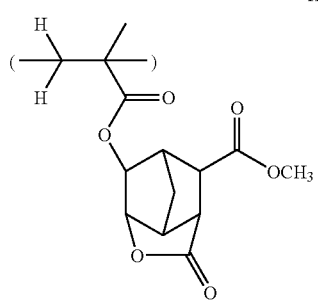
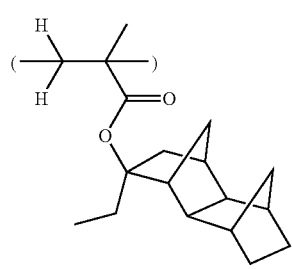 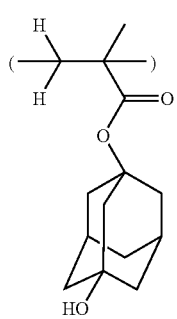 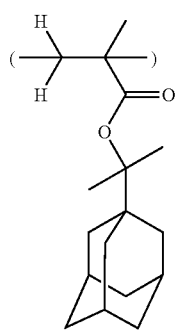 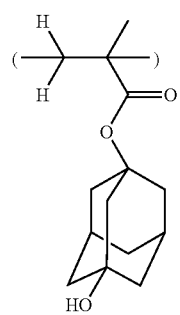
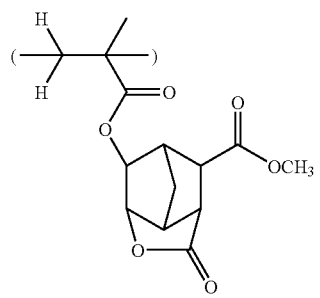 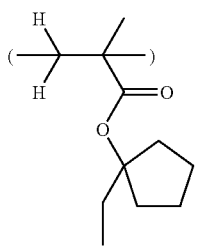 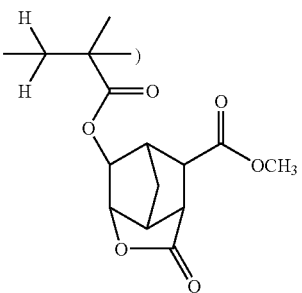

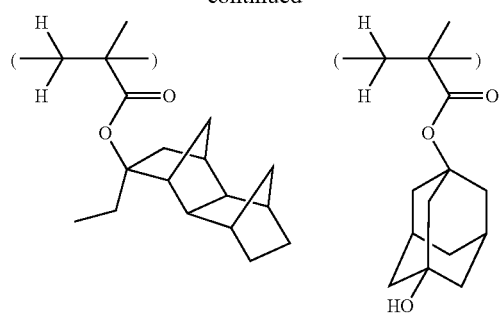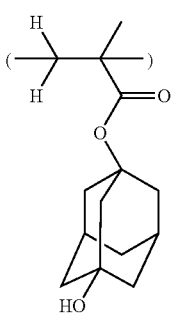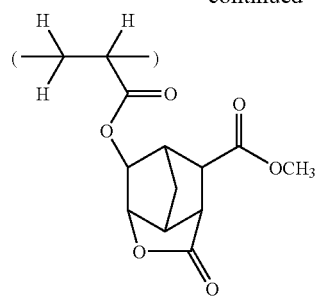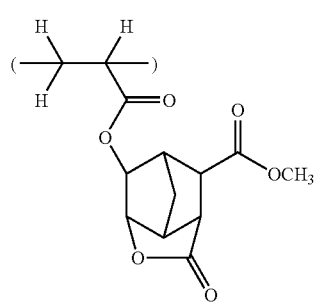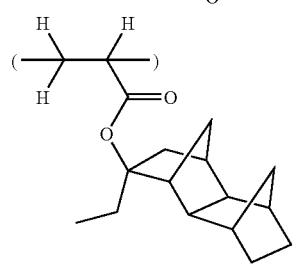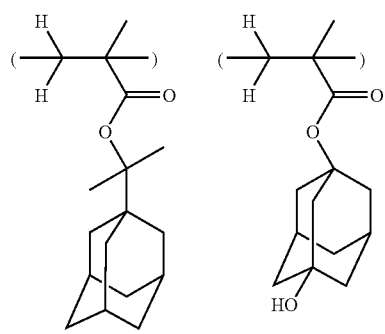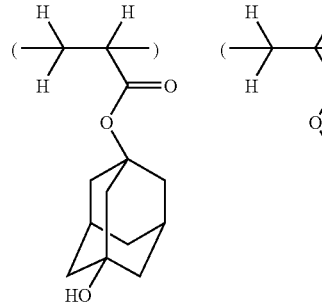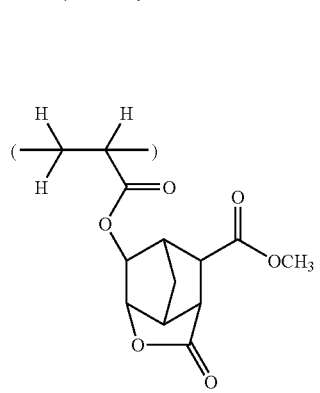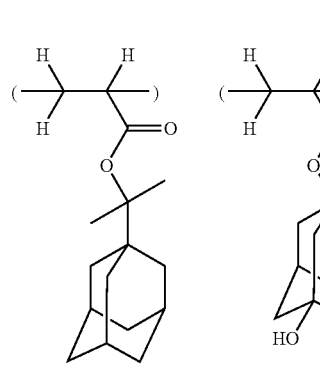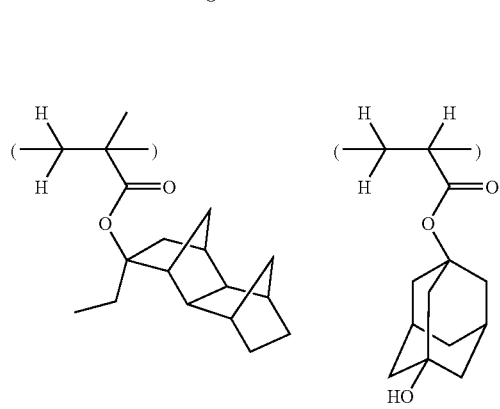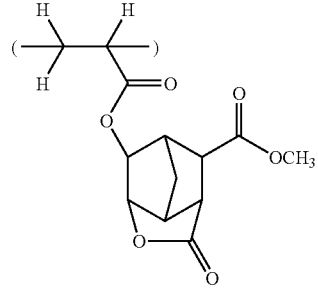

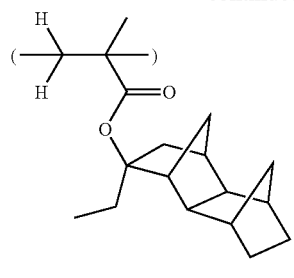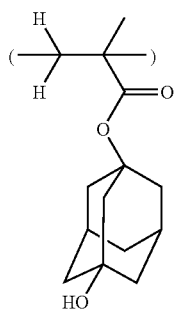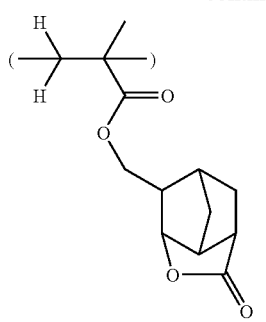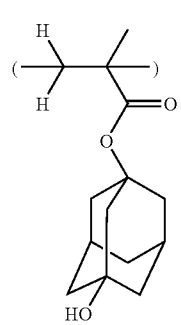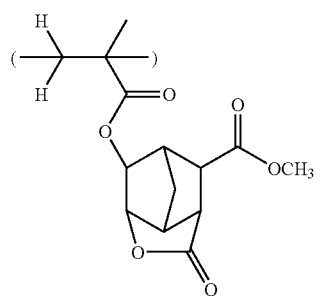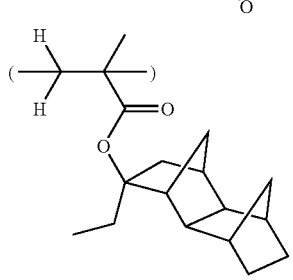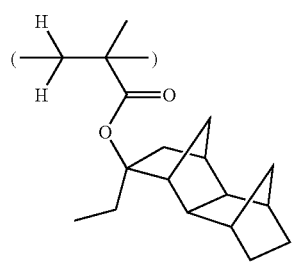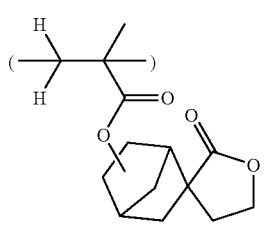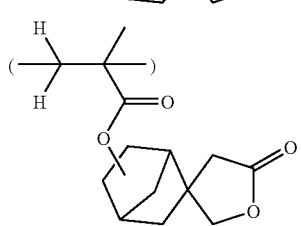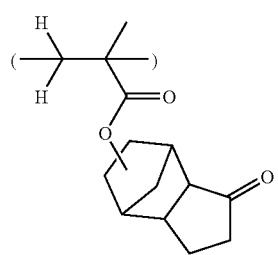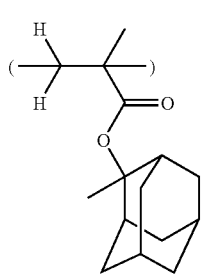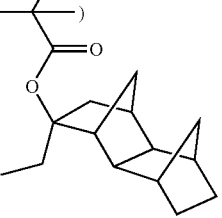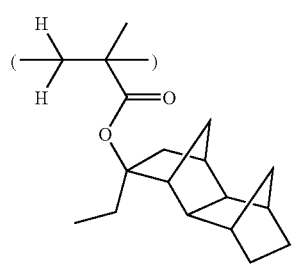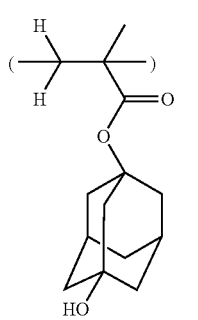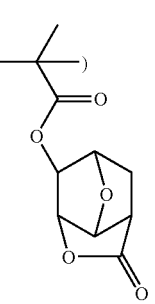

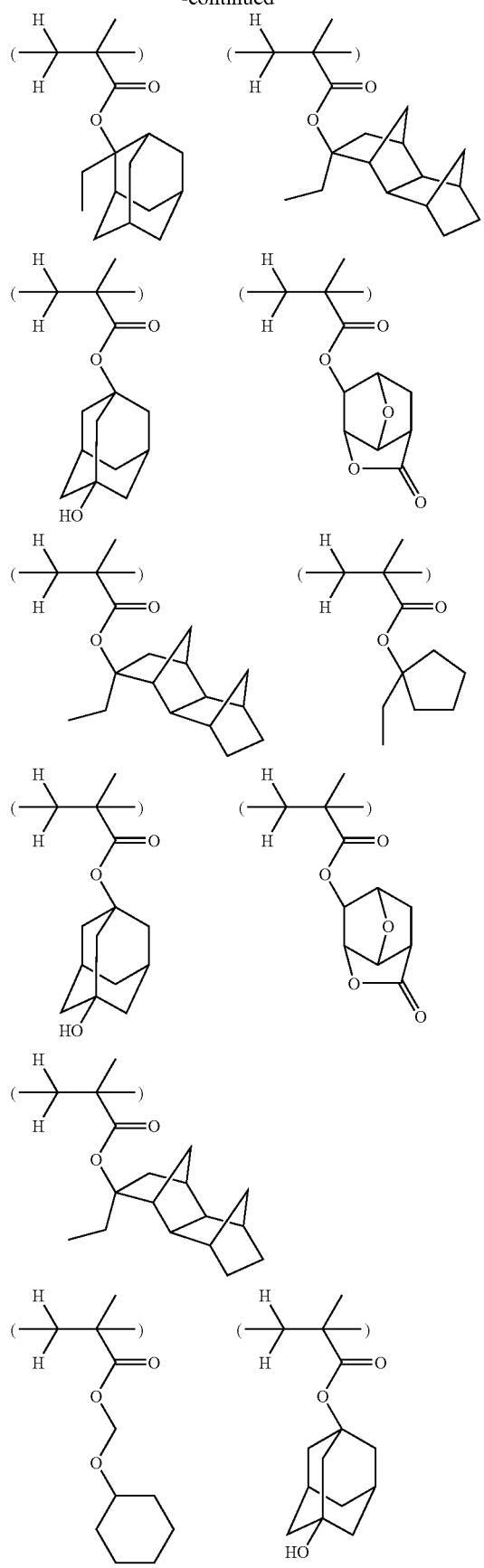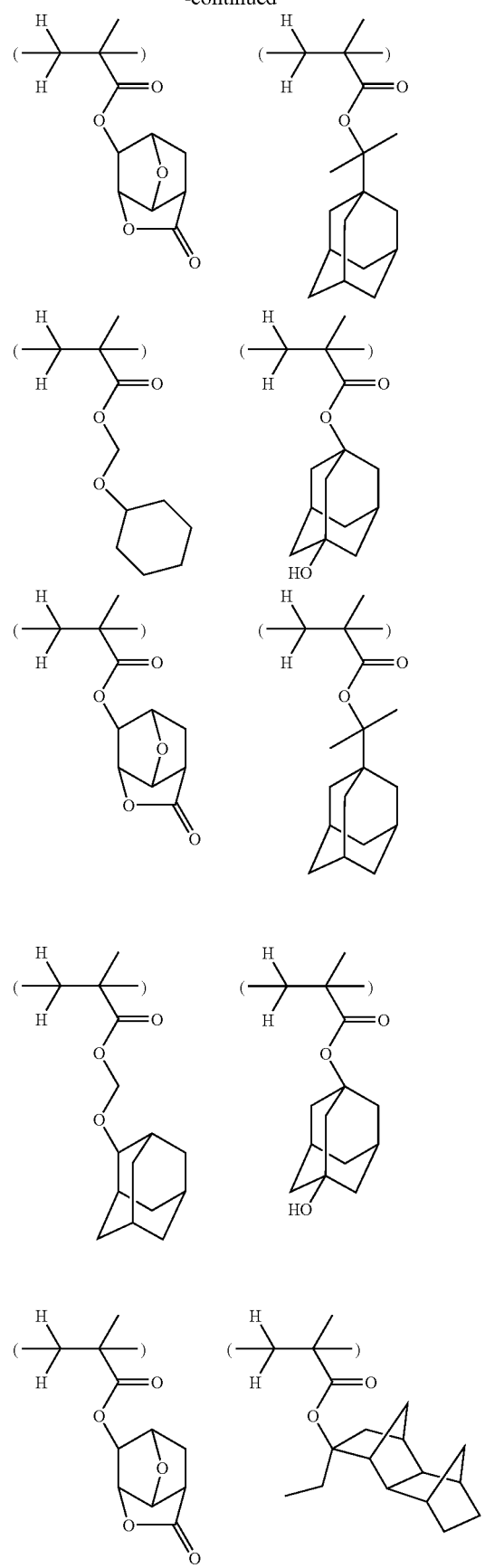

-continued
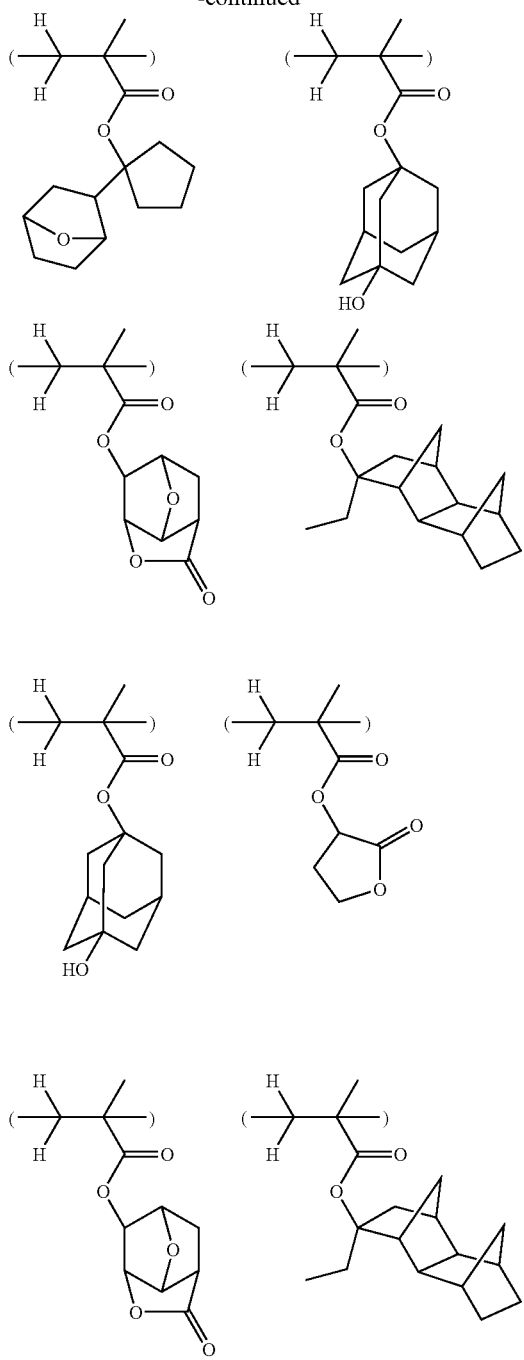
-continued
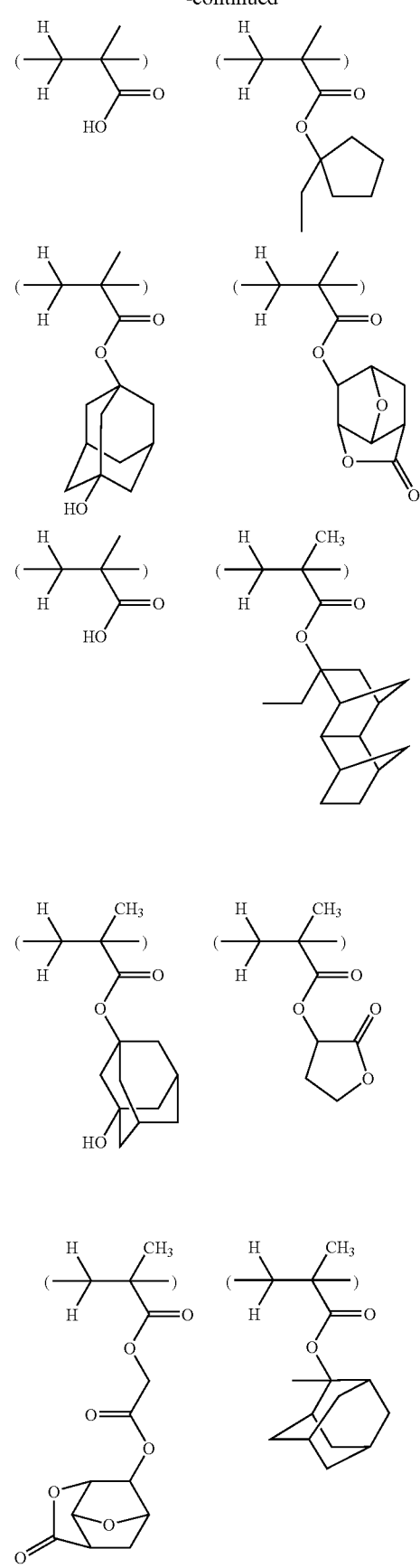

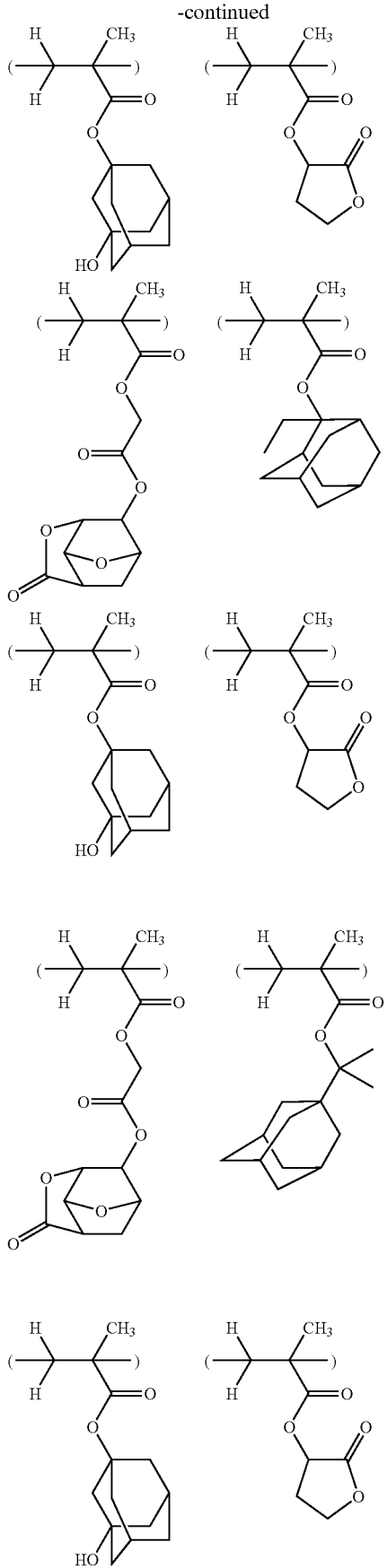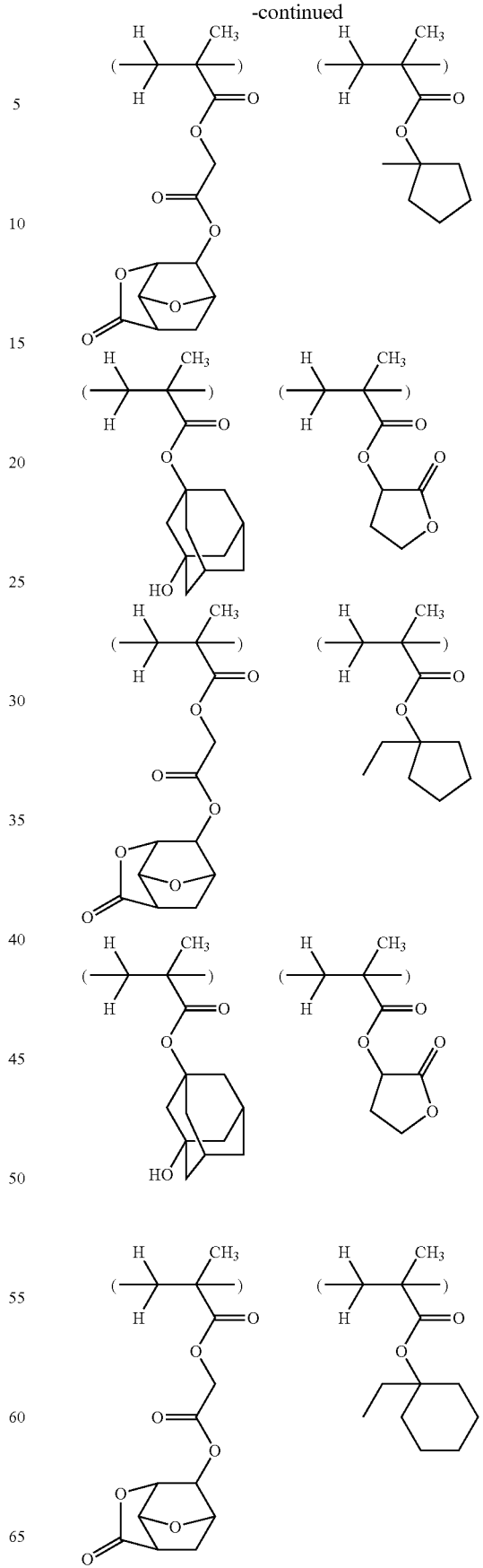

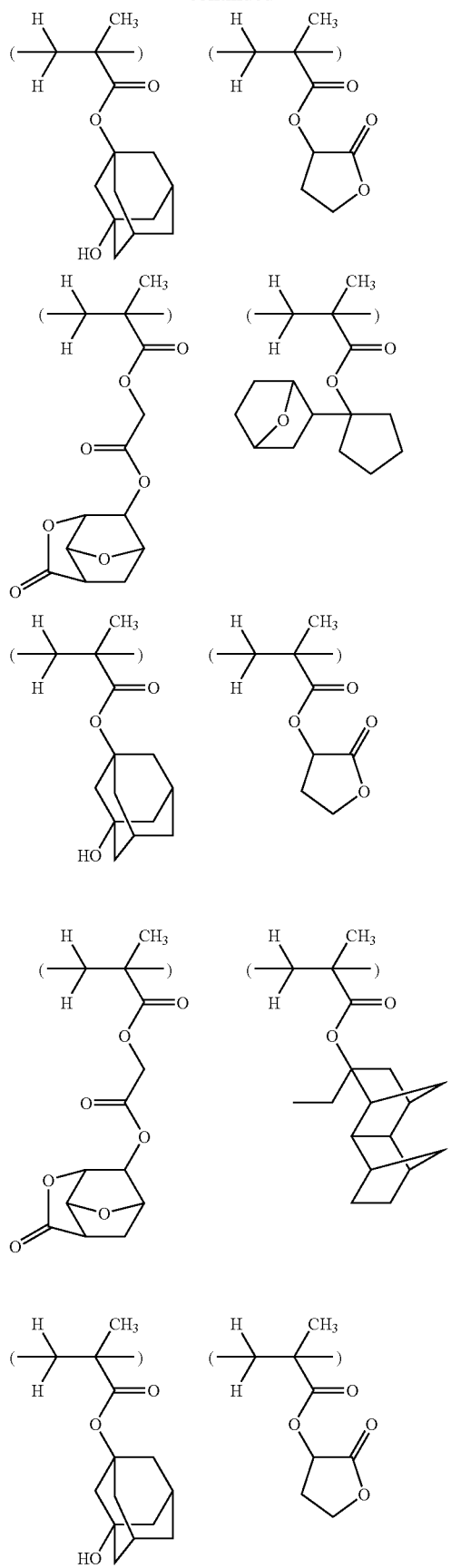
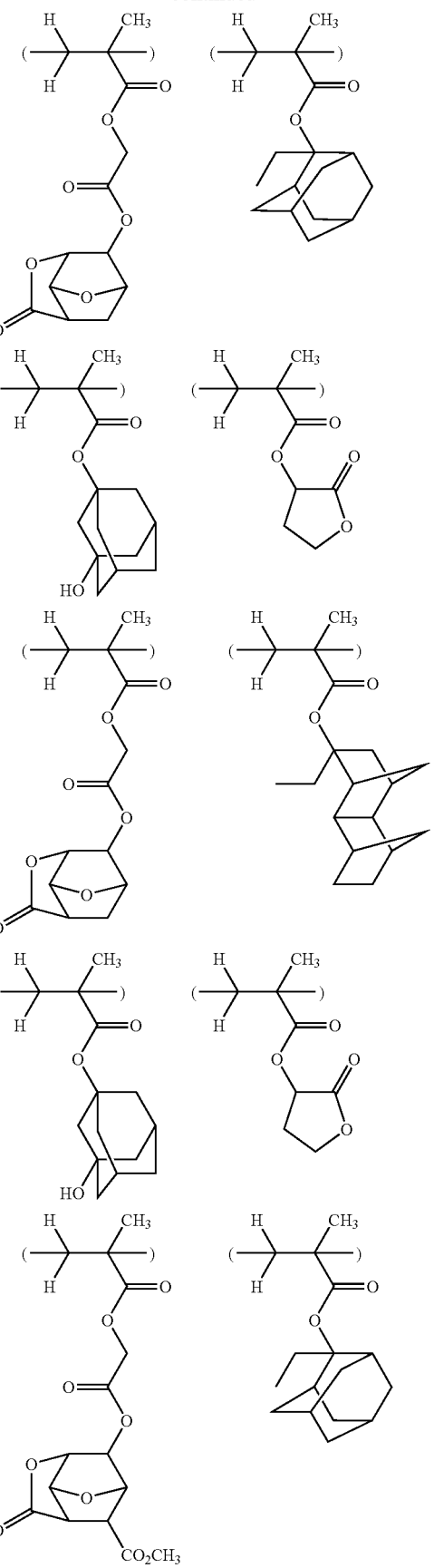

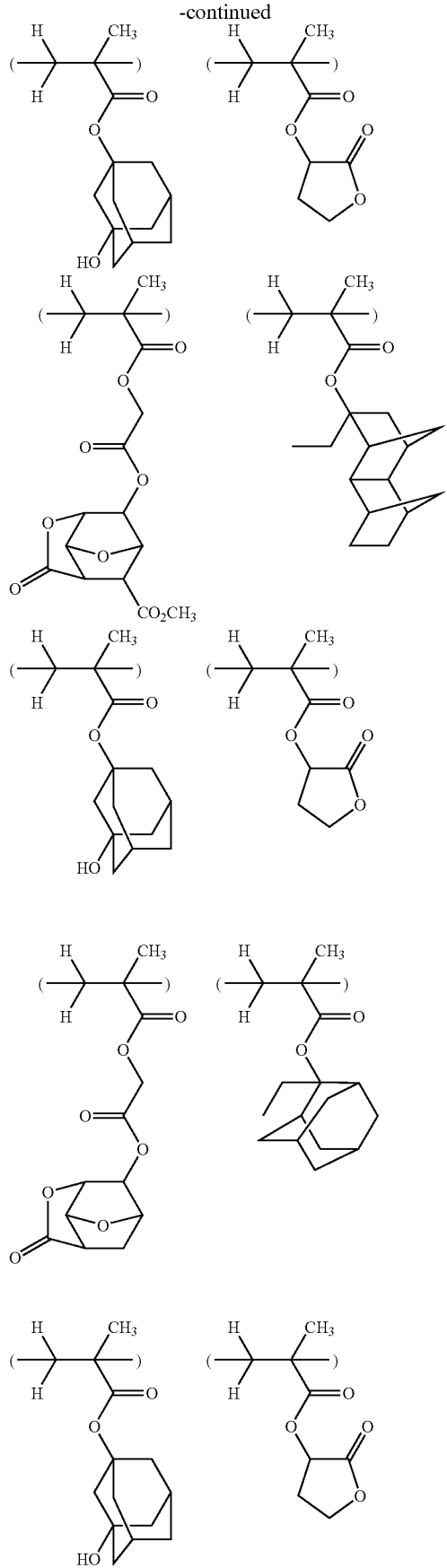
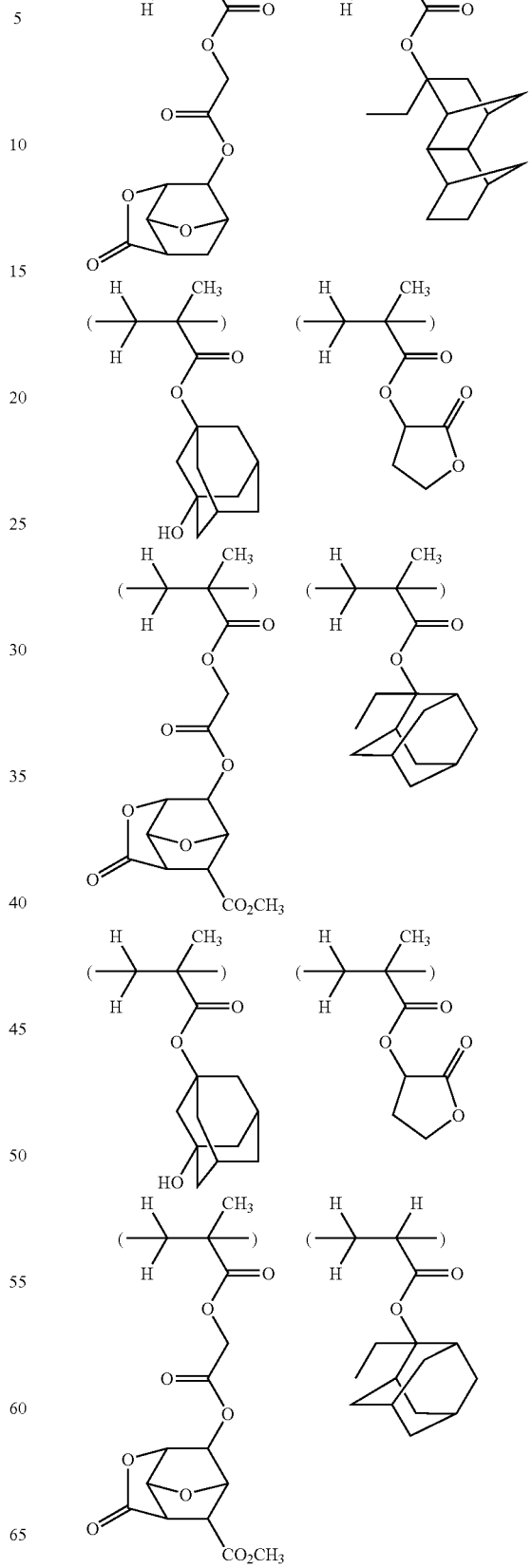

71
-continued
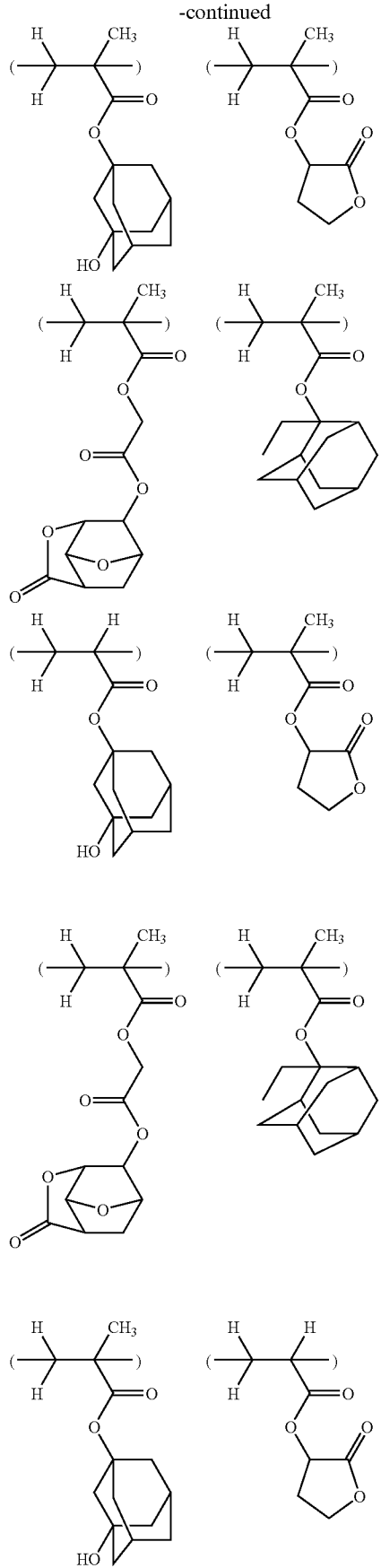
72
-continued
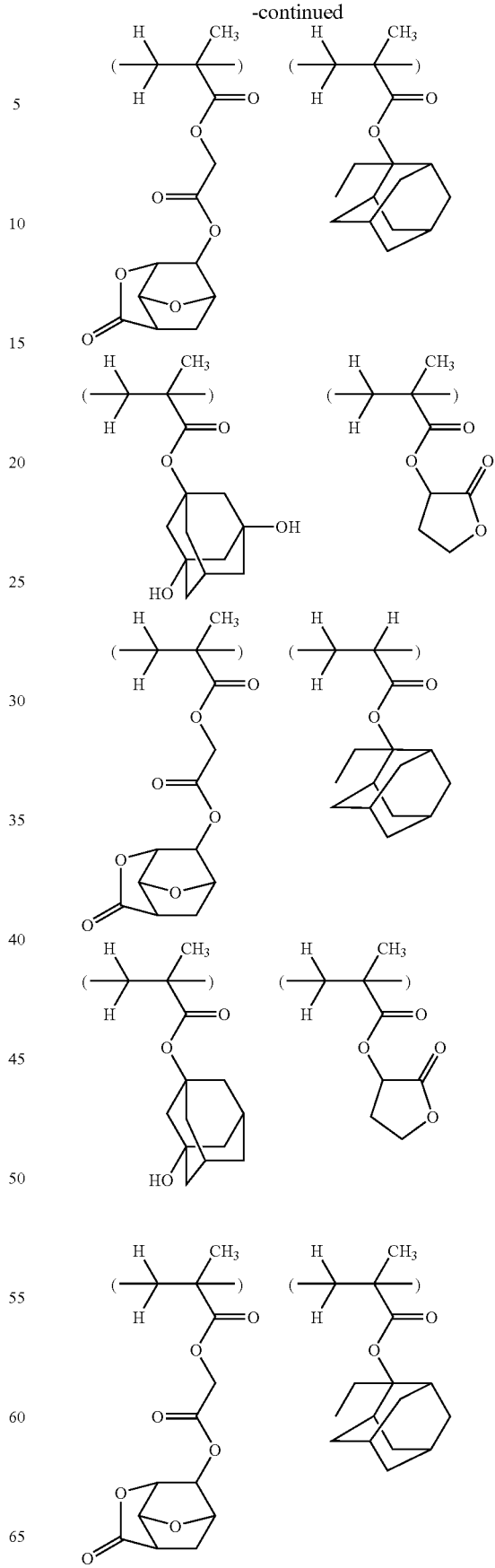

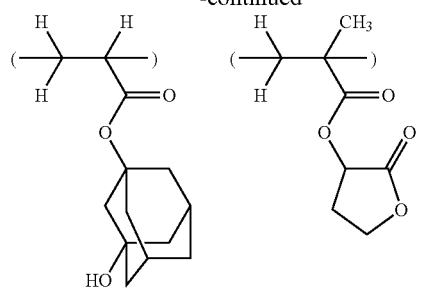
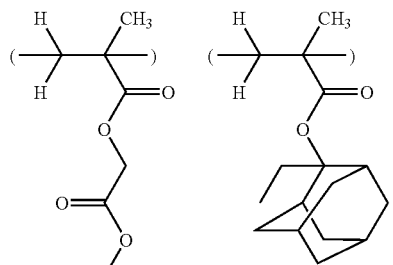
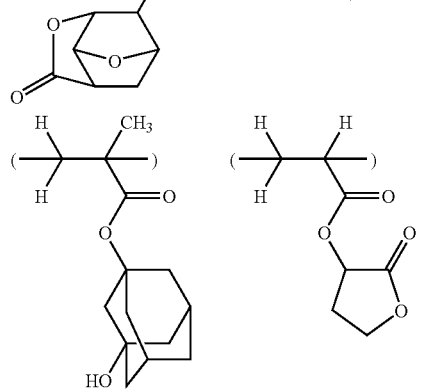
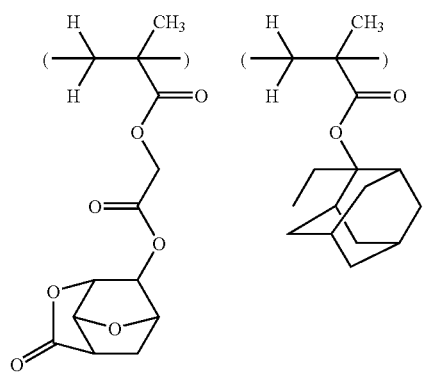
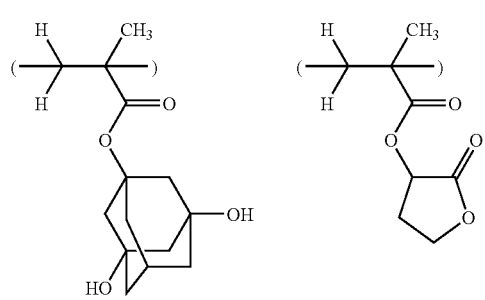
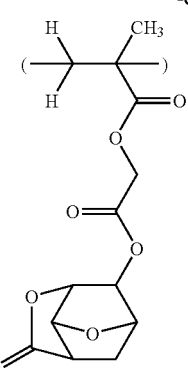
Exemplary polymers comprising recurring units incorporated at compositional ratios a2', b2', c2', d2' and e' in formula (R1) are shown below, but not limited thereto.
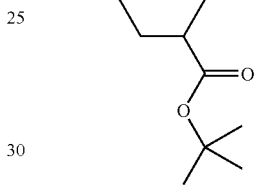
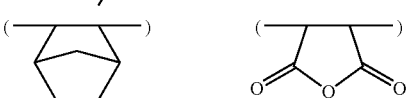
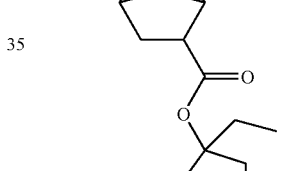
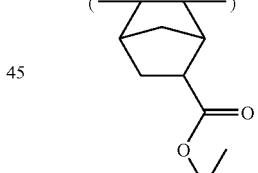
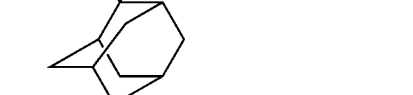
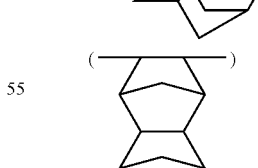
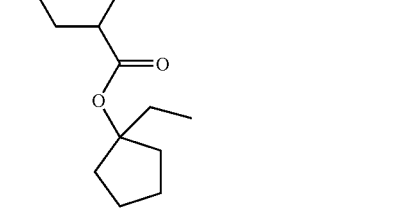

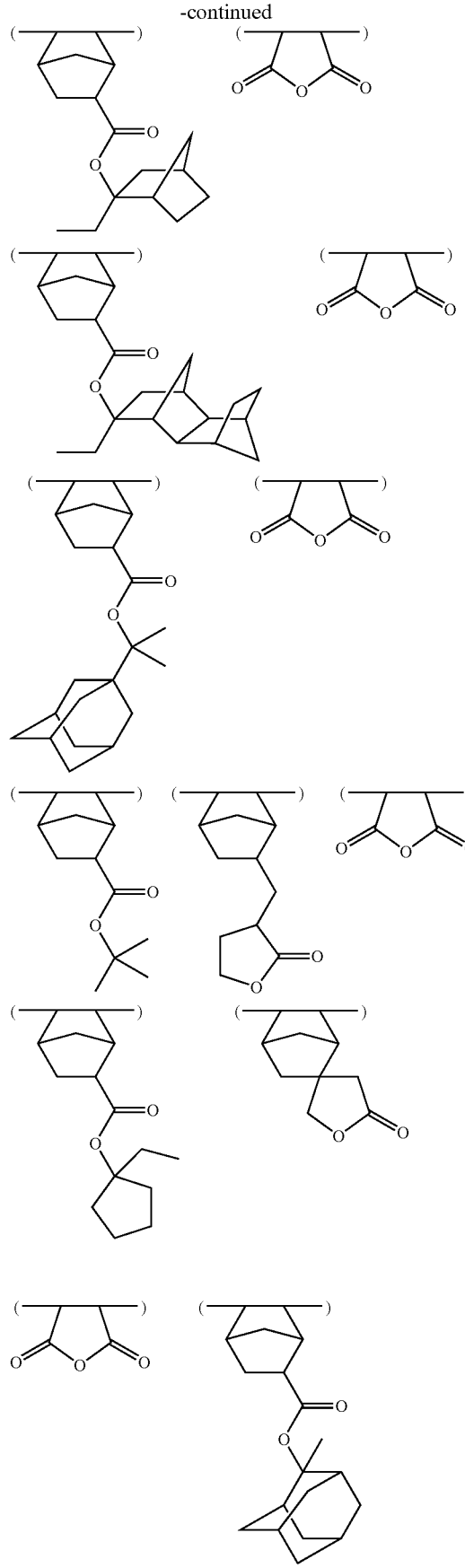
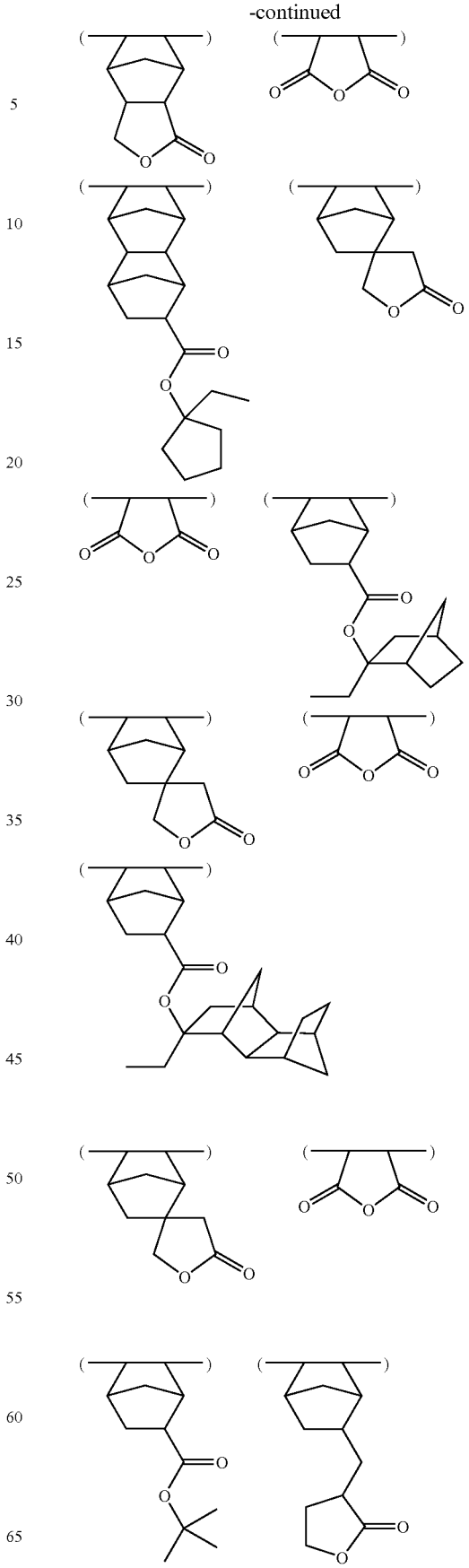

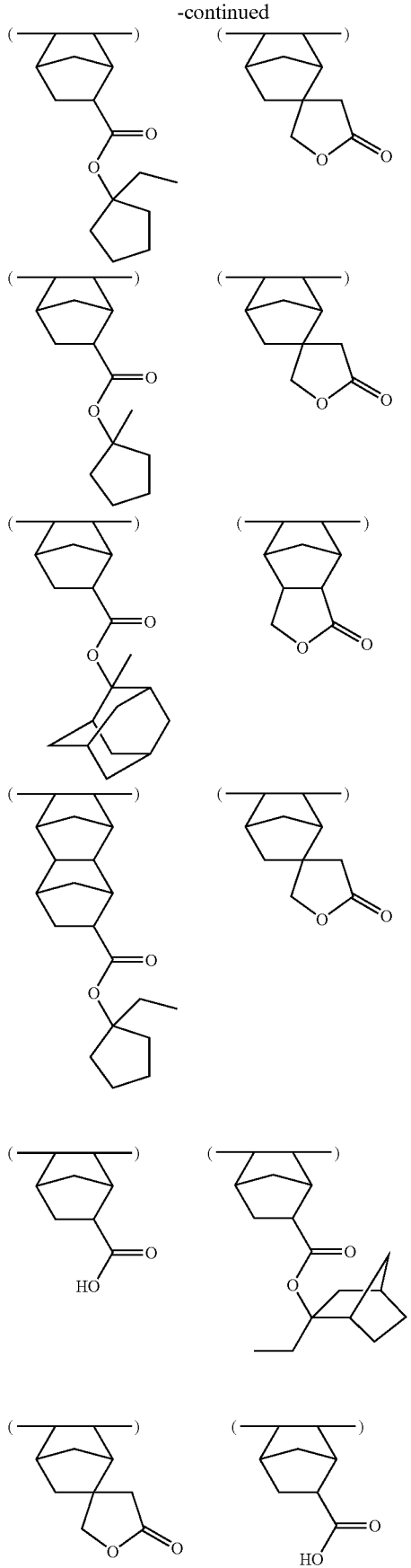
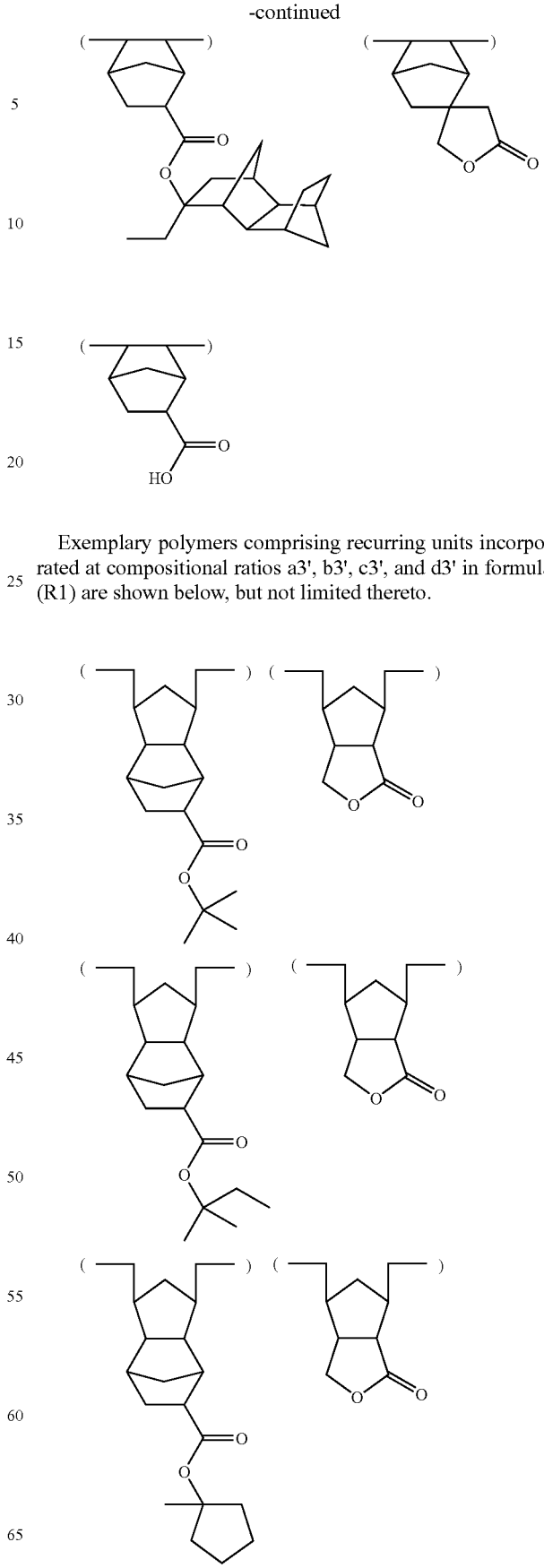
Exemplary polymers comprising recurring units incorporated at compositional ratios a3', b3', c3', and d3' in formula (R1) are shown below, but not limited thereto.

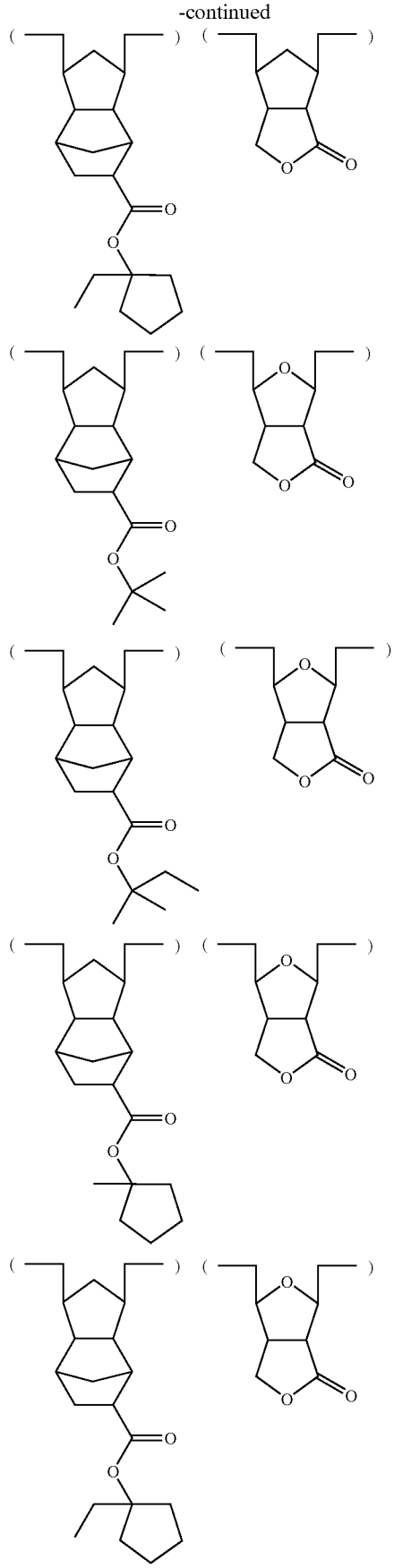

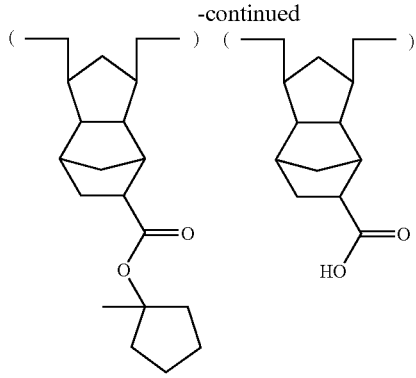
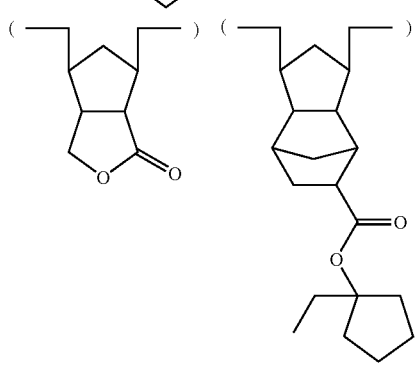
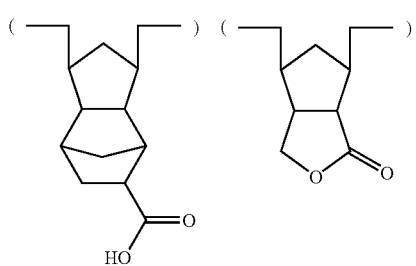
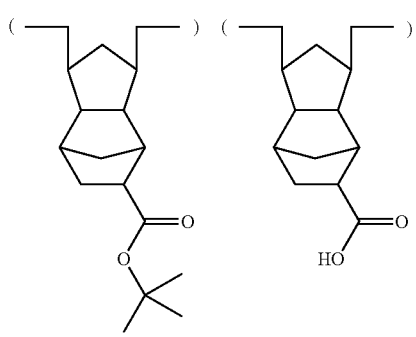
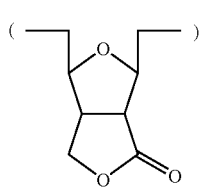
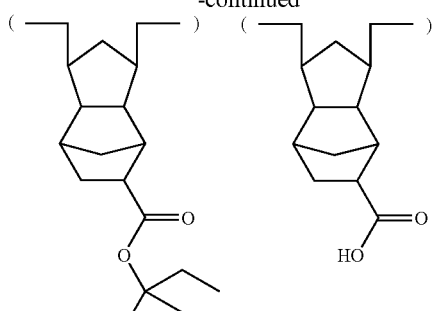
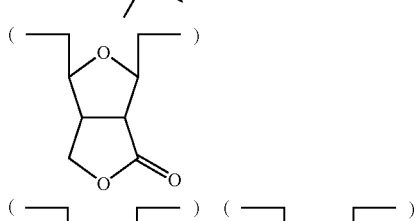
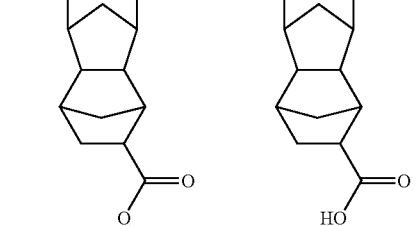
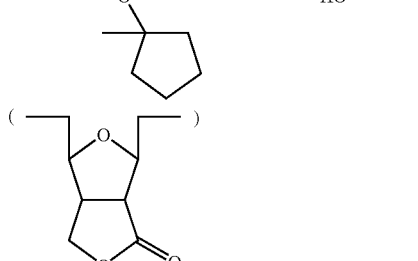
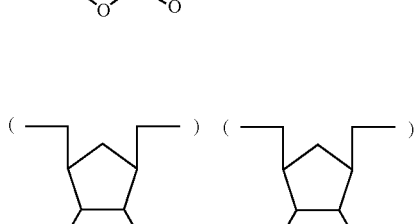
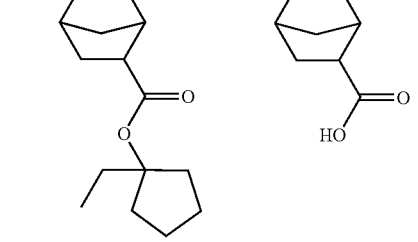
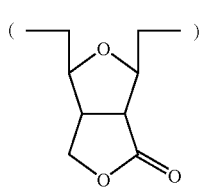

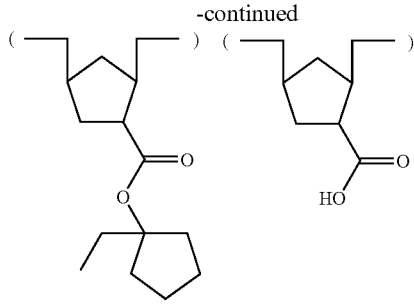
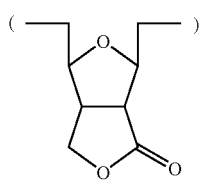
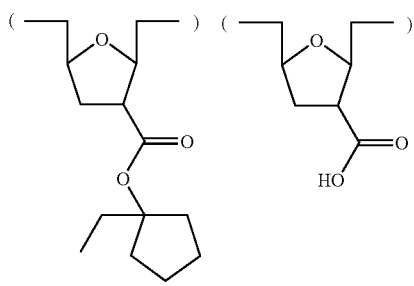
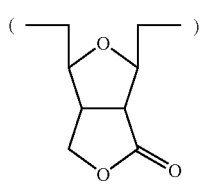
Examples of polymers having formula (R2) are shown below, but not limited thereto.
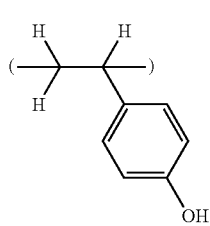
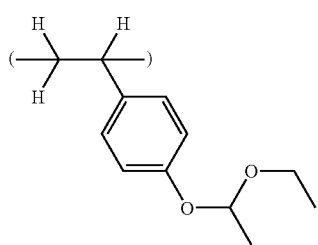
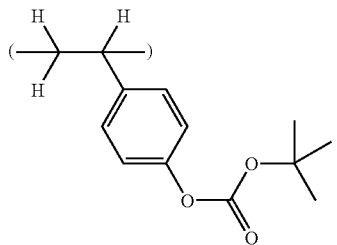
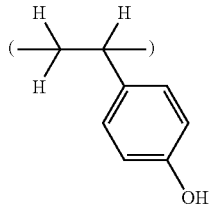
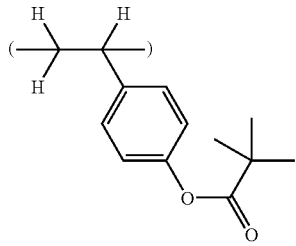
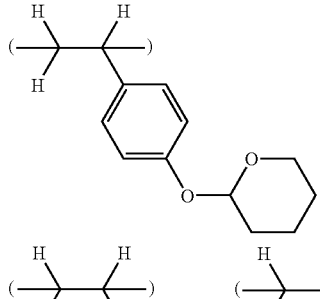
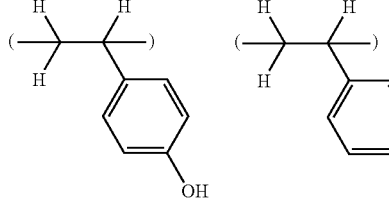
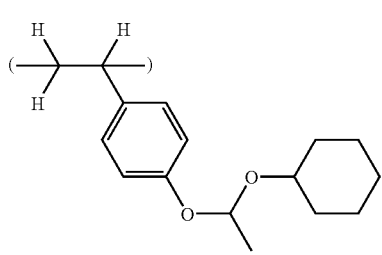
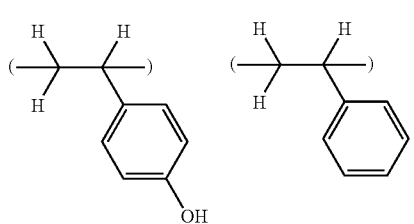

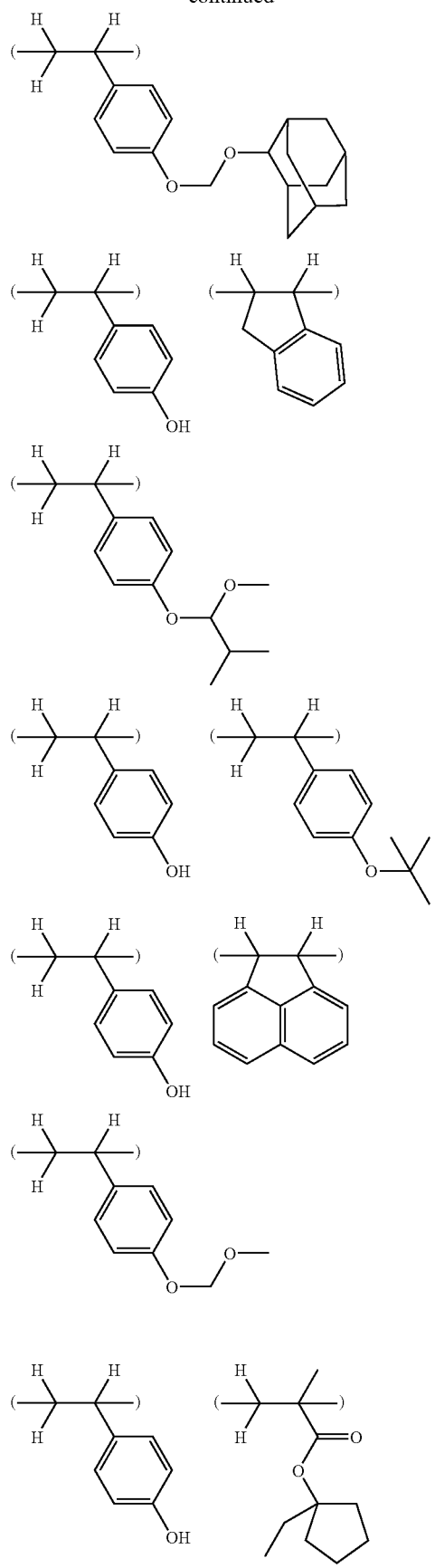
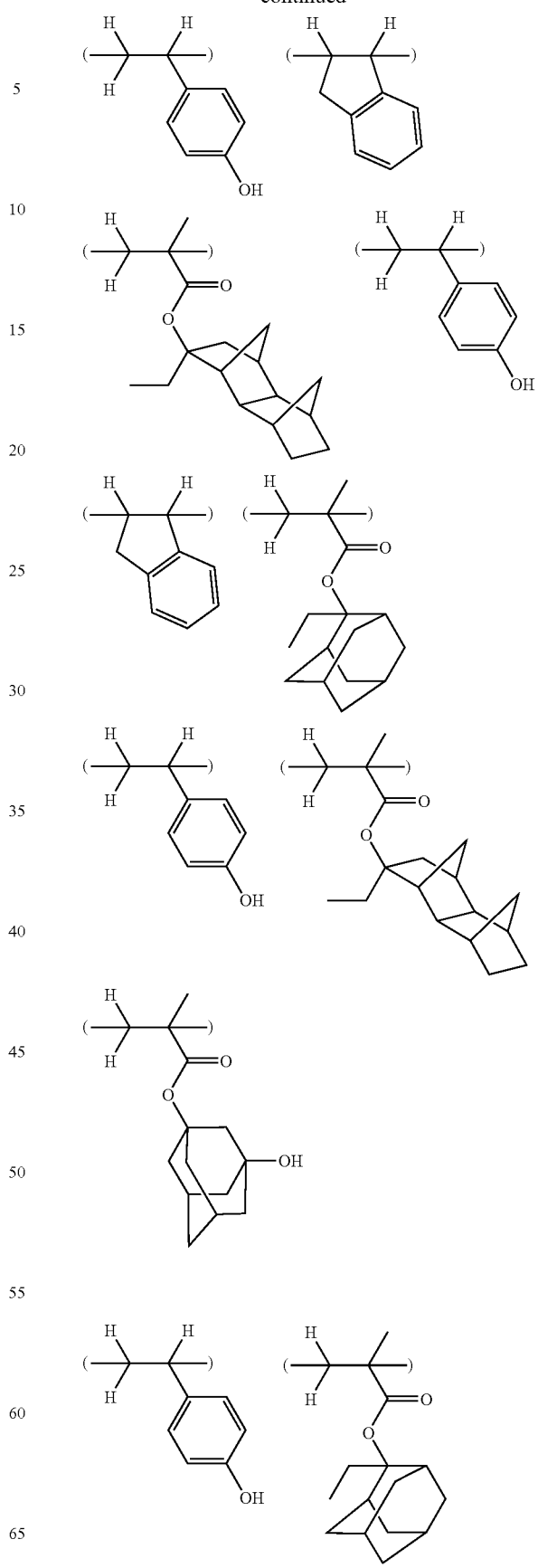

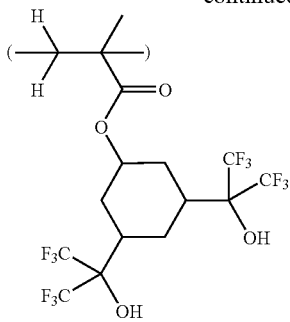

The other polymer is blended in an amount of preferably 0 to 80 parts, more preferably 0 to 60 parts, and even more preferably 0 to 50 parts by weight, provided that the total of the resin component (A) and the other polymer is 100 parts by weight. When blended, the amount of the other polymer is preferably at least 20 parts, more preferably at least 30 parts by weight. Too much amounts of the other polymer may prevent the resin component (A) from exerting its own effect, probably resulting in a lower resolution and degraded pattern profile. The other polymer is not limited to one type and a mixture of two or more other polymers may be added. The use of plural polymers allows for easy adjustment of resist properties.

Acid Generator

As the compound which generates an acid in response to actinic light or radiation (B), the resist composition of the invention may further comprise (B') such a compound other than the sulfonium compound of formula (2). Component (B') may be any compound which generates an acid upon exposure to high-energy radiation and specifically, any of well-known photoacid generators which are commonly used in prior art resist compositions, especially chemically amplified resist compositions. Suitable photoacid generators include sulfonium salts, iodonium salts, sulfonyldiazomethane, N-sulfonyloxyimide, and oxime-O-sulfonate acid generators. Exemplary acid generators are given below while they may be used alone or in admixture of two or more.

Sulfonium salts are salts of sulfonium cations with sulfonates, bis(substituted alkylsulfonyl)imides and tris(substituted alkylsulfonyl)methides. Exemplary sulfonium cations include triphenylsulfonium,
(4-tert-butoxyphenyl)diphenylsulfonium,
bis(4-tert-butoxyphenyl)phenylsulfonium,
tris(4-tert-butoxyphenyl)sulfonium,
(3-tert-butoxyphenyl)diphenylsulfonium,
bis(3-tert-butoxyphenyl)phenylsulfonium,
tris(3-tert-butoxyphenyl)sulfonium,
(3,4-di-tert-butoxyphenyl)diphenylsulfonium,
bis(3,4-di-tert-butoxyphenyl)phenylsulfonium,
tris(3,4-di-tert-butoxyphenyl)sulfonium,
diphenyl(4-thiophenoxyphenyl)sulfonium,
(4-tert-butoxycarbonylmethyloxyphenyl)diphenylsulfonium,
tris(4-tert-butoxycarbonylmethyloxyphenyl)sulfonium,
(4-tert-butoxyphenyl)bis(4-dimethylaminophenyl)sulfonium,
tris(4-dimethylaminophenyl)sulfonium,
2-naphthyldiphenylsulfonium, dimethyl-2-naphthylsulfonium,
4-hydroxyphenyldimethylsulfonium,
4-methoxyphenyldimethylsulfonium, trimethylsulfonium,
2-oxocyclohexylcyclohexylmethylsulfonium,
trinaphthylsulfonium, tribenzylsulfonium,
diphenylmethylsulfonium, dimethylphenylsulfonium,
2-oxo-2-phenylethylthiacyclopentanium,
4-n-butoxynaphthyl-1-thiacyclopentanium, and
2-n-butoxynaphthyl-1-thiacyclopentanium.

Exemplary sulfonates include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate,
4-trifluoromethylbenzenesulfonate, 4-fluorobenzenesulfonate,
mesitylenesulfonate, 2,4,6-triisopropylbenzenesulfonate, toluenesulfonate, benzenesulfonate,
4-(4'-toluenesulfonyloxy)benzenesulfonate,
naphthalenesulfonate, camphorsulfonate, octanesulfonate, dodecylbenzenesulfonate, butanesulfonate, methanesulfonate,
2-benzoyloxy-1,1,3,3,3-pentafluoropropanesulfonate,
1,1,3,3,3-pentafluoro-2-(4-phenylbenzoyloxy)propanesulfonate,
1,1,3,3,3-pentafluoro-2-pivaloyloxypropanesulfonate,
2-cyclohexanecarbonyloxy-1,1,3,3,3-pentafluoropropanesulfonate,
1,1,3,3,3-pentafluoro-2-furoyloxypropanesulfonate,
2-naphthoyloxy-1,1,3,3,3-pentafluoropropanesulfonate,
2-(4-tert-butylbenzoyloxy)-1,1,3,3,3-pentafluoropropanesulfonate,
2-adamantanecarbonyloxy-1,1,3,3,3-pentafluoropropanesulfonate,
2-acetyloxy-1,1,3,3,3-pentafluoropropanesulfonate,
1,1,3,3,3-pentafluoro-2-hydroxypropanesulfonate,
1,1,3,3,3-pentafluoro-2-tosyloxypropanesulfonate,
1,1-difluoro-2-naphthyl-ethanesulfonate,
1,1,2,2-tetrafluoro-2-(norbornan-2-yl)ethanesulfonate, and
1,1,2,2-tetrafluoro-2-(tetracyclo[6.2.1.1$^{3,6}$.0$^{2,7}$]dodec-4-en-9-yl)ethanesulfonate.

Exemplary bis(substituted alkylsulfonyl)imides include bistrifluoromethylsulfonylimide, bispentafluoroethylsulfonylimide, bisheptafluoropropylsulfonylimide, and 1,3-propylenebissulfonylimide. A typical tris(substituted alkylsulfonyl)methide is tristrifluoromethylsulfonylmethide. Sulfonium salts based on combination of the foregoing examples are included.

Iodonium salts are salts of iodonium cations with sulfonates, bis(substituted alkylsulfonyl)imides and tris(substituted alkylsulfonyl)methides. Exemplary iodonium cations are aryliodonium cations including diphenyliodinium, bis(4-tert-butylphenyl)iodonium,
4-tert-butoxyphenylphenyliodonium, and
4-methoxyphenylphenyliodonium. Exemplary sulfonates include trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate, 2,2,2-trifluoroethanesulfonate, pentafluorobenzenesulfonate,
4-trifluoromethylbenzenesulfonate, 4-fluorobenzenesulfonate,
mesitylenesulfonate, 2,4,6-triisopropylbenzenesulfonate, toluenesulfonate, benzenesulfonate,
4-(4-toluenesulfonyloxy)benzenesulfonate,
naphthalenesulfonate, camphorsulfonate, octanesulfonate, dodecylbenzenesulfonate, butanesulfonate, methanesulfonate,
2-benzoyloxy-1,1,3,3,3-pentafluoropropanesulfonate, 1,1,3,3,3-pentafluoro-2-(4-phenylbenzoyloxy)propane-sulfonate,
1,1,3,3,3-pentafluoro-2-pivaloyloxypropanesulfonate,
2-cyclohexanecarbonyloxy-1,1,3,3,3-pentafluoropropane-sulfonate,
1,1,3,3,3-pentafluoro-2-furoyloxypropanesulfonate,
2-naphthoyloxy-1,1,3,3,3-pentafluoropropanesulfonate,
2-(4-tert-butylbenzoyloxy)-1,1,3,3,3-pentafluoropropane-sulfonate,
2-adamantanecarbonyloxy-1,1,3,3,3-pentafluoropropane-sulfonate,
2-acetyloxy-1,1,3,3,3-pentafluoropropanesulfonate,
1,1,3,3,3-pentafluoro-2-hydroxypropanesulfonate,
1,1,3,3,3-pentafluoro-2-tosyloxypropanesulfonate,
1,1-difluoro-2-naphthyl-ethanesulfonate,
1,1,2,2-tetrafluoro-2-(norbornan-2-yl)ethanesulfonate, and
1,1,2,2-tetrafluoro-2-(tetracyclo[6.2.1.1$^{3,6}$.0$^{2,7}$]dodec-4-en-9-yl)ethanesulfonate. Exemplary bis(substituted alkylsulfonyl)imides include bistrifluoromethylsulfonylimide, bispentafluoroethylsulfonylimide, bisheptafluoropropyl-sulfonylimide, and
1,3-propylenebissulfonylimide. A typical tris(substituted alkylsulfonyl)methide is tristrifluoromethylsulfonyl-methide. Iodonium salts based on combination of the foregoing examples are included.

Exemplary sulfonyldiazomethane compounds include bis-sulfonyldiazomethane compounds and sulfonylcarbonyldiazomethane compounds such as
bis(ethylsulfonyl)diazomethane,
bis(1-methylpropylsulfonyl)diazomethane,
bis(2-methylpropylsulfonyl)diazomethane,
bis(1,1-dimethylethylsulfonyl)diazomethane,
bis(cyclohexylsulfonyl)diazomethane,
bis(perfluoroisopropylsulfonyl)diazomethane,
bis(phenylsulfonyl)diazomethane,
bis(4-methylphenylsulfonyl)diazomethane,
bis(2,4-dimethylphenylsulfonyl)diazomethane,
bis(2-naphthylsulfonyl)diazomethane,
bis(4-acetyloxyphenylsulfonyl)diazomethane,
bis(4-methanesulfonyloxyphenylsulfonyl)diazomethane,
bis(4-(4-toluenesulfonyloxy)phenylsulfonyl)diazomethane,
bis(4-(n-hexyloxy)phenylsulfonyl)diazomethane,
bis(2-methyl-4-(n-hexyloxy)phenylsulfonyl)diazomethane,
bis(2,5-dimethyl-4-(n-hexyloxy)phenylsulfonyl)diaz-omethane,
bis(3,5-dimethyl-4-(n-hexyloxy)phenylsulfonyl)diaz-omethane,
bis(2-methyl-5-isopropyl-4-(n-hexyloxy)phenylsulfonyl)diazo-methane,
4-methylphenylsulfonylbenzoyldiazomethane,
tert-butylcarbonyl-4-methylphenylsulfonyldiazomethane,
2-naphthylsulfonylbenzoyldiazomethane,
4-methylphenylsulfonyl-2-naphthoyldiazomethane,
methylsulfonylbenzoyldiazomethane, and
tert-butoxycarbonyl-4-methylphenylsulfonyldiazomethane.

N-sulfonyloxyimide photoacid generators include combinations of imide structures with sulfonates. Exemplary imide structures are succinimide, naphthalene dicarboxylic acid imide, phthalimide, cyclohexyldicarboxylic acid imide, 5-norbornene-2,3-dicarboxylic acid imide, and 7-oxabicyclo[2.2.1]-5-heptene-2,3-dicarboxylic acid imide.

Exemplary sulfonates include trifluoromethanesulfonate, pentafluoroethanesulfonate, nonafluorobutanesulfonate, dodecafluorohexanesulfonate, pentafluoroethylperfluoro-cyclohexanesulfonate, heptadecafluorooctanesulfonate, 2,2,2-trifluoroethanesulfonate, pentafluorobenzene-sulfonate,
4-trifluoromethylbenzenesulfonate, 4-fluorobenzene-sulfonate,
mesitylenesulfonate, 2,4,6-triisopropylbenzenesulfonate, toluenesulfonate, benzenesulfonate, naphthalenesulfonate, camphorsulfonate, octanesulfonate, dodecylbenzene-sulfonate,
butanesulfonate, methanesulfonate,
2-benzoyloxy-1,1,3,3,3-pentafluoropropanesulfonate,
1,1,3,3,3-pentafluoro-2-(4-phenylbenzoyloxy)propane-sulfonate,
1,1,3,3,3-pentafluoro-2-pivaloyloxypropanesulfonate,
2-cyclohexanecarbonyloxy-1,1,3,3,3-pentafluoropropane-sulfonate,
1,1,3,3,3-pentafluoro-2-furoyloxypropanesulfonate,
2-naphthoyloxy-1,1,3,3,3-pentafluoropropanesulfonate,
2-(4-tert-butylbenzoyloxy)-1,1,3,3,3-pentafluoropropane-sulfonate,
2-adamantanecarbonyloxy-1,1,3,3,3-pentafluoropropane-sulfonate,
2-acetyloxy-1,1,3,3,3-pentafluoropropanesulfonate,
1,1,3,3,3-pentafluoro-2-hydroxypropanesulfonate,
1,1,3,3,3-pentafluoro-2-tosyloxypropanesulfonate,
1,1-difluoro-2-naphthyl-ethanesulfonate,
1,1,2,2-tetrafluoro-2-(norbornan-2-yl)ethanesulfonate, and
1,1,2,2-tetrafluoro-2-(tetracyclo[6.2.1.1$^{3,6}$.0$^{2,7}$]dodec-4-en-9-yl)ethanesulfonate.

Benzoinsulfonate photoacid generators include benzoin tosylate, benzoin mesylate, and benzoin butanesulfonate.

Pyrogallol trisulfonate photoacid generators include pyrogallol, phloroglucinol, catechol, resorcinol, and hydroquinone, in which all the hydroxyl groups are substituted by trifluoromethanesulfonate, pentafluoroethanesulfonate, nonafluorobutanesulfonate, dodecafluorohexanesulfonate, pentafluoroethylperfluorocyclohexanesulfonate, heptadecafluorooctanesulfonate,
2,2,2-trifluoroethanesulfonate, pentafluorobenzene-sulfonate,
4-trifluoromethylbenzenesulfonate, 4-fluorobenzene-sulfonate,
toluenesulfonate, benzenesulfonate, naphthalenesulfonate, camphorsulfonate, octanesulfonate, dodecylbenzene-sulfonate,
butanesulfonate, methanesulfonate,
2-benzoyloxy-1,1,3,3,3-pentafluoropropanesulfonate,
1,1,3,3,3-pentafluoro-2-(4-phenylbenzoyloxy)propane-sulfonate,
1,1,3,3,3-pentafluoro-2-pivaloyloxypropanesulfonate,
2-cyclohexanecarbonyloxy-1,1,3,3,3-pentafluoropropane-sulfonate,
1,1,3,3,3-pentafluoro-2-furoyloxypropanesulfonate,
2-naphthoyloxy-1,1,3,3,3-pentafluoropropanesulfonate,
2-(4-tert-butylbenzoyloxy)-1,1,3,3,3-pentafluoropropane-sulfonate,
2-adamantanecarbonyloxy-1,1,3,3,3-pentafluoropropane-sulfonate,
2-acetyloxy-1,1,3,3,3-pentafluoropropanesulfonate,
1,1,3,3,3-pentafluoro-2-hydroxypropanesulfonate,
1,1,3,3,3-pentafluoro-2-tosyloxypropanesulfonate,
1,1-difluoro-2-naphthyl-ethanesulfonate,
1,1,2,2-tetrafluoro-2-(norbornan-2-yl)ethanesulfonate, and
1,1,2,2-tetrafluoro-2-(tetracyclo[6.2.1.1$^{3,6}$.0$^{2,7}$]dodec-4-en-9-yl)ethanesulfonate.

Nitrobenzyl sulfonate photoacid generators include 2,4-dinitrobenzyl sulfonates, 2-nitrobenzyl sulfonates, and 2,6-dinitrobenzyl sulfonates, with exemplary sulfonates including trifluoromethanesulfonate, pentafluoroethane-sulfonate, nonafluorobutanesulfonate, dodecafluorohexanesulfonate, pentafluoroethylperfluorocyclohexanesulfonate, heptadecafluorooctanesulfonate,
2,2,2-trifluoroethanesulfonate, pentafluorobenzenesulfonate,
4-trifluoromethylbenzenesulfonate, 4-fluorobenzenesultonate,
toluenesulfonate, benzenesulfonate, naphthalenesulfonate, camphorsulfonate, octanesulfonate, dodecylbenzenesulfonate,
butanesulfonate, methanesulfonate,
2-benzoyloxy-1,1,3,3,3-pentafluoropropanesulfonate,
1,1,3,3,3-pentafluoro-2-(4-phenylbenzoyloxy)propanesulfonate,
1,1,3,3,3-pentafluoro-2-pivaloyloxypropanesulfonate,
2-cyclohexanecarbonyloxy-1,1,3,3,3-pentafluoropropanesulfonate,
1,1,3,3,3-pentafluoro-2-furoyloxypropanesulfonate,
2-naphthoyloxy-1,1,3,3,3-pentafluoropropanesulfonate,
2-(4-tert-butylbenzoyloxy)-1,1,3,3,3-pentafluoropropanesulfonate,
2-adamantanecarbonyloxy-1,1,3,3,3-pentafluoropropanesulfonate,
2-acetyloxy-1,1,3,3,3-pentafluoropropanesulfonate,
1,1,3,3,3-pentafluoro-2-hydroxypropanesulfonate,
1,1,3,3,3-pentafluoro-2-tosyloxypropanesulfonate,
1,1-difluoro-2-naphthyl-ethanesulfonate,
1,1,2,2-tetrafluoro-2-(norbornan-2-yl)ethanesulfonate, and
1,1,2,2-tetrafluoro-2-(tetracyclo[6.2.1.1$^{3,6}$.0$^{2,7}$]dodec-4-en-9-yl)ethanesulfonate. Also useful are analogous nitrobenzyl sulfonate compounds in which the nitro group on the benzyl side is substituted by a trifluoromethyl group.

Sulfone photoacid generators include
bis(phenylsulfonyl)methane,
bis(4-methylphenylsulfonyl)methane,
bis(2-naphthylsulfonyl)methane,
2,2-bis(phenylsulfonyl)propane,
2,2-bis(4-methylphenylsulfonyl)propane,
2,2-bis(2-naphthylsulfonyl)propane,
2-methyl-2-(p-toluenesulfonyl)propiophenone,
2-cyclohexylcarbonyl-2-(p-toluenesulfonyl)propane, and
2,4-dimethyl-2-(p-toluenesulfonyl)pentan-3-one.

Photoacid generators in the form of glyoxime derivatives are described in Japanese Patent No. 2,906,999 and JP-A 9-301948 and include
bis-O-(p-toluenesulfonyl)-α-dimethylglyoxime,
bis-O-(p-toluenesulfonyl)-α-diphenylglyoxime,
bis-O-(p-toluenesulfonyl)-α-dicyclohexylglyoxime,
bis-O-(p-toluenesulfonyl)-2,3-pentanedioneglyoxime,
bis-O-(n-butanesulfonyl)-α-dimethylglyoxime,
bis-O-(n-butanesulfonyl)-α-diphenylglyoxime,
bis-O-(n-butanesulfonyl)-α-dicyclohexylglyoxime,
bis-O-(methanesulfonyl)-α-dimethylglyoxime,
bis-O-(trifluoromethanesulfonyl)-α-dimethylglyoxime,
bis-O-(2,2,2-trifluoroethanesulfonyl)-α-dimethylglyoxime,
bis-O-(10-camphorsulfonyl)-α-dimethylglyoxime,
bis-O-(benzenesulfonyl)-α-dimethylglyoxime,
bis-O-(p-fluorobenzenesulfonyl)-α-dimethylglyoxime,
bis-O-(p-trifluoromethylbenzenesulfonyl)-α-dimethylglyoxime,
bis-O-(xylenesulfonyl)-α-dimethylglyoxime,
bis-O-(trifluoromethanesulfonyl)-nioxime,
bis-O-(2,2,2-trifluoroethanesulfonyl)-nioxime,
bis-O-(10-camphorsulfonyl)-nioxime,
bis-O-(benzenesulfonyl)-nioxime,
bis-O-(p-fluorobenzenesulfonyl)-nioxime,
bis-O-(p-trifluoromethylbenzenesulfonyl)-nioxime, and
bis-O-(xylenesulfonyl)-nioxime.

Also included are the oxime sulfonates described in U.S. Pat. No. 6,004,724, for example,
(5-(4-toluenesulfonyl)oxyimino-5H-thiophen-2-ylidene)phenyl-acetonitrile,
(5-(10-camphorsulfonyl)oxyimino-5H-thiophen-2-ylidene)phenyl-acetonitrile,
(5-n-octanesulfonyloxyimino-5H-thiophen-2-ylidene)phenyl-acetonitrile,
(5-(4-toluenesulfonyl)oxyimino-5H-thiophen-2-ylidene)(2-methylphenyl)acetonitrile,
(5-(10-camphorsulfonyl)oxyimino-5H-thiophen-2-ylidene)(2-methylphenyl)acetonitrile,
(5-n-octanesulfonyloxyimino-5H-thiophen-2-ylidene)(2-methylphenyl)acetonitrile, etc.

Also included are the oxime sulfonates described in U.S. Pat. No. 6,916,591, for example,
(5-(4-(4-toluenesulfonyloxy)benzenesulfonyl)oxyimino-5H-thiophen-2-ylidene)phenylacetonitrile and
(5-(2,5-bis(4-toluenesulfonyloxy)benzenesulfonyl)oxyimino-5H-thiophen-2-ylidene)phenylacetonitrile.

Also included are the oxime sulfonates described in U.S. Pat. No. 6,261,738 and JP-A 2000-314956, for example, 2,2,2-trifluoro-1-phenyl-ethanone oxime-O-methylsulfonate; 2,2,2-trifluoro-1-phenyl-ethanone oxime-O-(10-camphorylsulfonate); 2,2,2-trifluoro-1-phenyl-ethanone oxime-O-(4-methoxyphenylsulfonate); 2,2,2-trifluoro-1-phenyl-ethanone oxime-O-(1-naphthylsulfonate); 2,2,2-trifluoro-1-phenyl-ethanone oxime-O-(2-naphthylsulfonate); 2,2,2-trifluoro-1-phenyl-ethanone oxime-O-(2,4,6-trimethylphenylsulfonate); 2,2,2-trifluoro-1-(4-methylphenyl)-ethanone oxime-O-(10-camphorylsulfonate); 2,2,2-trifluoro-1-(4-methylphenyl)-ethanone oxime-O-(methylsulfonate); 2,2,2-trifluoro-1-(2-methylphenyl)-ethanone oxime-O-(10-camphorylsulfonate); 2,2,2-trifluoro-1-(2,4-dimethylphenyl)-ethanone oxime-O-(10-camphorylsulfonate); 2,2,2-trifluoro-1-(2,4-dimethylphenyl)-ethanone oxime-O-(1-naphthylsulfonate); 2,2,2-trifluoro-1-(2,4-dimethylphenyl)-ethanone oxime-O-(2-naphthylsulfonate); 2,2,2-trifluoro-1-(2,4,6-trimethylphenyl)-ethanone oxime-O-(10-camphorylsulfonate); 2,2,2-trifluoro-1-(2,4,6-trimethyl-phenyl)-ethanone oxime-O-(1-naphthylsulfonate); 2,2,2-trifluoro-1-(2,4,6-trimethylphenyl)-ethanone oxime-O-(2-naphthylsulfonate); 2,2,2-trifluoro-1-(4-methoxyphenyl)-ethanone oxime-O-methylsulfonate; 2,2,2-trifluoro-1-(4-methylthiophenyl)-ethanone oxime-O-methylsulfonate; 2,2,2-trifluoro-1-(3,4-dimethoxyphenyl)-ethanone oxime-O-methylsulfonate; 2,2,3,3,4,4,4-heptafluoro-1-phenyl-butanone oxime-O-(10-camphorylsulfonate); 2,2,2-trifluoro-1-(phenyl)-ethanone oxime-O-methylsulfonate; 2,2,2-trifluoro-1-(phenyl)-ethanone oxime-O-10-camphorylsulfonate; 2,2,2-trifluoro-1-(phenyl)-ethanone oxime-O-(4-methoxyphenyl)sulfonate; 2,2,2-trifluoro-1-(phenyl)-ethanone oxime-O-(1-naphthyl)-sulfonate; 2,2,2-trifluoro-1-(phenyl)-ethanone oxime-O-(2-naphthyl)sulfonate; 2,2,2-trifluoro-1-(phenyl)-ethanone oxime-O-(2,4,6-trimethylphenyl)sulfonate; 2,2,2-trifluoro-1-(4-methylphenyl)-ethanone oxime-O-(10-camphoryl)sulfonate; 2,2,2-trifluoro-1-(4-methylphenyl)-ethanone oxime-O-methyl-sulfonate; 2,2,2-trifluoro-1-(2-methylphenyl)-ethanone oxime-O-(10-camphoryl)sulfonate; 2,2,2-trifluoro-1-(2,4-dimethyl-phenyl)-ethanone oxime-O-(1-naphthyl)sulfonate; 2,2,2-trifluoro-1-(2,4-dimethylphenyl)-ethanone oxime-O-(2-naphthyl)sulfonate; 2,2,2-trifluoro-1-(2,4,6-trimethyl-phenyl)-ethanone oxime-O-(10-camphoryl)sulfonate; 2,2,2-trifluoro-1-(2,4,6-trimethylphenyl)-ethanone oxime-O-(1-naphthyl)sulfonate; 2,2,2-trifluoro-1-

(2,4,6-trimethyl-phenyl)-ethanone oxime-O-(2-naphthyl)sulfonate; 2,2,2-trifluoro-1-(4-methoxyphenyl)-ethanone oxime-O-methylsulfonate; 2,2,2-trifluoro-1-(4-thiomethylphenyl)-ethanone oxime-O-(methylsulfonate; 2,2,2-trifluoro-1-(3,4-dimethoxyphenyl)-ethanone oxime-O-methyl-sulfonate; 2,2,2-trifluoro-1-(4-methoxyphenyl)-ethanone oxime-O-(4-methylphenyl)sulfonate; 2,2,2-trifluoro-1-(4-methoxyphenyl)-ethanone oxime-O-(4-methoxyphenyl)sulfonate; 2,2,2-trifluoro-1-(4-methoxyphenyl)-ethanone oxime-O-(4-dodecylphenyl)-sulfonate; 2,2,2-trifluoro-1-(4-methoxyphenyl)-ethanone oxime-O-octylsulfonate; 2,2,2-trifluoro-1-(4-thiomethyl-phenyl)-ethanone oxime-O-(4-methoxyphenyl)sulfonate; 2,2,2-trifluoro-1-(4-thiomethylphenyl)-ethanone oxime-O-(4-dodecylphenyl)sulfonate; 2,2,2-trifluoro-1-(4-thiomethyl-phenyl)-ethanone oxime-O-octylsulfonate; 2,2,2-trifluoro-1-(4-thiomethylphenyl)-ethanone oxime-O-(2-naphthyl)sulfonate; 2,2,2-trifluoro-1-(2-methylphenyl)-ethanone oxime-O-methyl-sulfonate; 2,2,2-trifluoro-1-(4-methylphenyl)ethanone oxime-O-phenylsulfonate; 2,2,2-trifluoro-1-(4-chlorophenyl)-ethanone oxime-O-phenylsulfonate; 2,2,3,3,4,4,4-heptafluoro-1-(phenyl)-butanone oxime-O-(10-camphoryl)sulfonate; 2,2,2-trifluoro-1-naphthyl-ethanone oxime-O-methylsulfonate; 2,2,2-trifluoro-2-naphthyl-ethanone oxime-O-methylsulfonate; 2,2,2-trifluoro-1-[4-benzylphenyl]-ethanone oxime-O-methyl-sulfonate; 2,2,2-trifluoro-1-[4-(phenyl-1,4-dioxa-but-1-yl)phenyl]-ethanone oxime-O-methylsulfonate; 2,2,2-trifluoro-1-naphthyl-ethanone oxime-O-propylsulfonate; 2,2,2-trifluoro-2-naphthyl-ethanone oxime-O-propylsulfonate; 2,2,2-trifluoro-1-[4-benzylphenyl]-ethanone oxime-O-propylsulfonate; 2,2,2-trifluoro-1-[4-methylsulfonylphenyl]-ethanone oxime-O-propylsulfonate; 1,3-bis[1-(4-phenoxyphenyl)-2,2,2-trifluoro-ethanone oxime-O-sulfonyl]phenyl; 2,2,2-trifluoro-1-[4-methylsulfonyloxyphenyl]-ethanone oxime-O-propylsulfonate; 2,2,2-trifluoro-1-[4-methylcarbonyloxyphenyl]-ethanone oxime-O-propylsulfonate; 2,2,2-trifluoro-1-[6H,7H-5,8-dioxonaphth-2-yl]-ethanone oxime-O-propylsulfonate; 2,2,2-trifluoro-1-[4-methoxycarbonylmethoxyphenyl]-ethanone oxime-O-propyl-sulfonate; 2,2,2-trifluoro-1-[4-(methoxycarbonyl)-(4-amino-1-oxa-pent-1-yl)-phenyl]-ethanone oxime-O-propylsulfonate; 2,2,2-trifluoro-1-[3,5-dimethyl-4-ethoxyphenyl]-ethanone oxime-O-propylsulfonate; 2,2,2-trifluoro-1-[4-benzyloxy-phenyl]-ethanone oxime-O-propylsulfonate; 2,2,2-trifluoro-1-[2-thiophenyl]-ethanone oxime-O-propylsulfonate; 2,2,2-trifluoro-1-[1-dioxa-thiophen-2-yl)]-ethanone oxime-O-propylsulfonate; 2,2,2-trifluoro-1-(4-(3-(4-(2,2,2-trifluoro-1-(trifluoromethane-sulfonyloxyimino)-ethyl)-phenoxy)-propoxy)-phenyl)ethanone oxime(trifluoromethanesulfonate); 2,2,2-trifluoro-1-(4-(3-(4-(2,2,2-trifluoro-1-(1-propane-sulfonyloxyimino)-ethyl)-phenoxy)-propoxy)-phenyl)ethanone oxime(1-propanesulfonate); and 2,2,2-trifluoro-1-(4-(3-(4-(2,2,2-trifluoro-1-(1-butanesulfonyloxyimino)-ethyl)-phenoxy)-propoxy)-phenyl)ethanone oxime(1-butanesulfonate).

Also included are the oxime sulfonates described in U.S. Pat. No. 6,916,591, for example, 2,2,2-trifluoro-1-(4-(3-(4-(2,2,2-trifluoro-1-(4-(4-methylphenylsulfonylbxy)phenyl-sulfonyl-oxyimino)-ethyl)-phenoxy)-propoxy)-phenyl)ethanone oxime(4-(4-methylphenylsulfonyloxy)phenylsulfonate) and 2,2,2-trifluoro-1-(4-(3-(4-(2,2,2-trifluoro-1-(2,5-bis(4-methylphenylsulfonyloxy)benzenesulfonyloxy)phenylsulfonyl-oxyimino)-ethyl)-phenoxy)-propoxy)-phenyl)ethanone oxime(2,5-bis(4-methylphenylsulfonyloxy)benzenesulfonyloxy)-phenylsulfonate).

Also included are the oxime sulfonates described in JP-A 9-95479 and JP-A 9-230588 and the references cited therein, for example,
α-(p-toluenesulfonyloxyimino)-phenylacetonitrile,
α-(p-chlorobenzenesulfonyloxyimino)-phenylacetonitrile,
α-(4-nitrobenzenesulfonyloxyimino)-phenylacetonitrile,
α-(4-nitro-2-trifluoromethylbenzenesulfonyloxyimino)-phenylacetonitrile,
α-(benzenesulfonyloxyimino)-4-chlorophenylacetonitrile,
α-(benzenesulfonyloxyimino)-2,4-dichlorophenylacetonitrile,
α-(benzenesulfonyloxyimino)-2,6-dichlorophenylacetonitrile,
α-(benzenesulfonyloxyimino)-4-methoxyphenylacetonitrile,
α-(2-chlorobenzenesulfonyloxyimino)-4-methoxyphenylaceto-nitrile,
α-(benzenesulfonyloxyimino)-2-thienylacetonitrile,
α-(4-dodecylbenzenesulfonyloxyimino)-phenylacetonitrile,
α-[(4-toluenesulfonyloxyimino)-4-methoxyphenyl]acetonitrile,
α-[(dodecylbenzenesulfonyloxyimino)-4-methoxyphenyl]aceto-nitrile,
α-(tosyloxyimino)-3-thienylacetonitrile,
α-(methylsulfonyloxyimino)-1-cyclopentenylacetonitrile,
α-(ethylsulfonyloxyimino)-1-cyclopentenylacetonitrile,
α-(isopropylsulfonyloxyimino)-1-cyclopentenylacetonitrile,
α-(n-butylsulfonyloxyimino)-1-cyclopentenylacetonitrile,
α-(ethylsulfonyloxyimino)-1-cyclohexenylacetonitrile,
α-(isopropylsulfonyloxyimino)-1-cyclohexenylacetonitrile, and
α-(n-butylsulfonyloxyimino)-1-cyclohexenylacetonitrile.

Also included are oxime sulfonates having the formula:

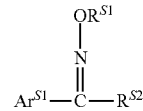

wherein $R^{s1}$ is a substituted or unsubstituted haloalkylsulfonyl or halobenzenesulfonyl group of 1 to 10 carbon atoms, $R^{s2}$ is a haloalkyl group of 1 to 11 carbon atoms, and $Ar^{s1}$ is substituted or unsubstituted aromatic or hetero-aromatic group, examples of which are described, for example, in WO 2004/074242.

Examples include
2-[2,2,3,3,4,4,5,5-octafluoro-1-(nonafluorobutylsulfonyloxy-imino)-pentyl]-fluorene,
2-[2,2,3,3,4,4-pentafluoro-1-(nonafluorobutylsulfonyloxy-imino)-butyl]-fluorene,
2-[2,2,3,3,4,4,5,5,6,6-decafluoro-1-(nonafluorobutylsulfonyl-oxyimino)-hexyl]-fluorene,
2-[2,2,3,3,4,4,5,5-octafluoro-1-(nonafluorobutylsulfonyloxy-imino)-pentyl]-4-biphenyl,
2-[2,2,3,3,4,4-pentafluoro-1-(nonafluorobutylsulfonyloxy-imino)-butyl]-4-biphenyl, and
2-[2,2,3,3,4,4,5,5,6,6-decafluoro-1-(nonafluorobutylsulfonyl-oxyimino)-hexyl]-4-biphenyl.

Suitable bisoxime sulfonates include those described in JP-A 9-208554, for example,
bis(α-(4-toluenesulfonyloxy)imino)-p-phenylenediacetonitrile,
bis(α-(benzenesulfonyloxy)imino)-p-phenylenediacetonitrile, bis(α-(methanesulfonyloxy)imino)-p-phenylenediacetonitrile,
bis(α-(butanesulfonyloxy)imino)-p-phenylenediacetonitrile,
bis(α-(10-camphorsulfonyloxy)imino)-p-phenylenediacetonitrile,
bis(α-(4-toluenesulfonyloxy)imino)-p-phenylenediacetonitrile,
bis(α-(trifluoromethanesulfonyloxy)imino)-p-phenylenediaceto-nitrile,
bis(α-(4-methoxybenzenesulfonyloxy)imino)-p-phenylenediaceto-nitrile,
bis(α-(4-toluenesulfonyloxy)imino)-m-phenylenediacetonitrile,
bis(α-(benzenesulfonyloxy)imino)-m-phenylenediacetonitrile,
bis(α-(methanesulfonyloxy)imino)-m-phenylenediacetonitrile,
bis(α-(butanesulfonyloxy)imino)-m-phenylenediacetonitrile,
bis(α-(10-camphorsulfonyloxy)imino)-m-phenylenediacetonitrile,
bis(α-(4-toluenesulfonyloxy)imino)-m-phenylenediacetonitrile,
bis(α-(trifluoromethanesulfonyloxy)imino)-m-phenylenediaceto-nitrile,
bis(α-(4-methoxybenzenesulfonyloxy)imino)-m-phenylenediaceto-nitrile, etc.

Of these, preferred photoacid generators are sulfonium salts, bissulfonyldiazomethanes, N-sulfonyloxyimides, oxime-O-sulfonates and glyoxime derivatives. More preferred photoacid generators are sulfonium salts, bissulfonyldiazomethanes, N-sulfonyloxyimides, and oxime-O-sulfonates. Typical examples include
triphenylsulfonium p-toluenesulfonate,
triphenylsulfonium camphorsulfonate,
triphenylsulfonium pentafluorobenzenesulfonate,
triphenylsulfonium nonafluorobutanesulfonate,
triphenylsulfonium 4-(4'-toluenesulfonyloxy)benzenesulfonate,
triphenylsulfonium 2,4,6-triisopropylbenzenesulfonate,
4-tert-butoxyphenyldiphenylsulfonium p-toluenesulfonate,
4-tert-butoxyphenyldiphenylsulfonium camphorsulfonate,
4-tert-butoxyphenyldiphenylsulfonium 4-(4'-toluenesulfonyl-oxy)benzenesulfonate,
tris(4-methylphenyl)sulfonium camphorsulfonate,
tris(4-tert-butylphenyl)sulfonium camphorsulfonate,
4-tert-butylphenyldiphenylsulfonium camphorsulfonate,
4-tert-butylphenyldiphenylsulfonium nonafluoro-1-butanesulfonate,
4-tert-butylphenyldiphenylsulfonium pentafluoroethyl-perfluorocyclohexanesulfonate,
4-tert-butylphenyldiphenylsulfonium perfluoro-1-octanesulfonate,
triphenylsulfonium 1,1-difluoro-2-naphthyl-ethanesulfonate,
triphenylsulfonium 1,1,2,2-tetrafluoro-2-(norbornan-2-yl)-ethanesulfonate,
bis(tert-butylsulfonyl)diazomethane,
bis(cyclohexylsulfonyl)diazomethane,
bis(2,4-dimethylphenylsulfonyl)diazomethane,
bis(4-(n-hexyloxy)phenylsulfonyl)diazomethane,
bis(2-methyl-4-(n-hexyloxy)phenylsulfonyl)diazomethane,
bis(2,5-dimethyl-4-(n-hexyloxy)phenylsulfonyl)diazomethane,
bis(3,5-dimethyl-4-(n-hexyloxy)phenylsulfonyl)diazomethane,
bis(2-methyl-5-isopropyl-4-(n-hexyloxy)phenylsulfonyl)-diazomethane,
bis(4-tert-butylphenylsulfonyl)diazomethane,
N-camphorsulfonyloxy-5-norbornene-2,3-dicarboxylic acid imide,
N-p-toluenesulfonyloxy-5-norbornene-2,3-dicarboxylic acid imide,
2-[2,2,3,3,4,4,5,5-octafluoro-1-(nonafluorobutylsulfonyloxy-imino)-pentyl]-fluorene,
2-[2,2,3,3,4,4-pentafluoro-1-(nonafluorobutylsulfonyloxy-imino)-butyl]-fluorene, and
2-[2,2,3,3,4,4,5,5,6,6-decafluoro-1-(nonafluorobutylsulfo-nyl-oxyimino)-hexyl]-fluorene.

In the resist composition, an appropriate amount of the photoacid generators (B) and (B') is, but not limited to, 0.1 to 40 parts, and especially 0.1 to 20 parts by weight per 100 parts by weight of the base polymer (i.e., resin component (A) and optional other resin component). Too high a proportion of the photoacid generators may give rise to problems of degraded resolution and foreign matter upon development and resist film peeling. Provided that [B] and [B'] stand for the amounts of generators (B) and (B') added, respectively, the preferred blending proportion of generators (B) and (B') is $0.1 \leq [B]/([B]+[B']) \leq 1$, more preferably $0.3 \leq [B]/([B]+[B']) \leq 1$, and even more preferably $0.5 \leq [B]/([B]+[B']) \leq 1$. If a blending proportion of generator (B) is too low, then exposure dose dependency, pattern density dependency and/or mask fidelity may be degraded. The photoacid generators (B) and (B') each may be used alone or in admixture of two or more. The transmittance of the resist film can be controlled by using a photoacid generator having a low transmittance at the exposure wavelength and adjusting the amount of the photoacid generator added.

In the resist composition, there may be added a compound which is decomposed with an acid to generate another acid, that is, acid-amplifier compound. For these compounds, reference should be made to J. Photopolym. Sci. and Tech., 8, 43-44, 45-46 (1995), and ibid., 9, 29-30 (1996).

Examples of the acid-amplifier compound include tert-butyl-2-methyl-2-tosyloxymethyl acetoacetate and 2-phenyl-2-(2-tosyloxyethyl)-1,3-dioxolane, but are not limited thereto. Of well-known photoacid generators, many of those compounds having poor stability, especially poor thermal stability exhibit an acid amplifier-like behavior.

In the resist composition, an appropriate amount of the acid-amplifier compound is 0 to 2 parts, and especially 0 to 1 part by weight per 100 parts by weight of the base polymer. Excessive amounts of the acid-amplifier compound make diffusion control difficult, leading to degradation of resolution and pattern profile.

In addition to components (A) and (B), the resist composition may further comprise (C) an organic solvent and optionally (D) an organic nitrogen-containing compound, (E) a surfactant, and (F) other components.

Organic Solvent

The organic solvent (C) used herein may be any organic solvent in which the base resin, acid generator, and additives are soluble. Illustrative, non-limiting, examples of the organic solvent include ketones such as cyclohexanone and methyl amyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate; and lactones such as γ-butyrolactone. These solvents may be used alone or in combinations of two or more thereof. Of the above organic solvents, it is recommended to use diethylene glycol dimethyl ether, 1-ethoxy-2-propanol, propylene glycol monomethyl ether acetate, and mixtures thereof because the acid generator is most soluble therein.

An appropriate amount of the organic solvent used is about 200 to 3,000 parts, especially about 400 to 2,500 parts by weight per 100 parts by weight of the base polymer.

Nitrogen-Containing Compound

In the resist composition, an organic nitrogen-containing compound or compounds may be compounded as component (D). The organic nitrogen-containing compound used herein is preferably a compound capable of suppressing the rate of diffusion when the acid generated by the acid generator diffuses within the resist film. The inclusion of organic nitrogen-containing compound holds down the rate of acid diffusion within the resist film, resulting in better resolution. In addition, it suppresses changes in sensitivity following exposure and reduces substrate and environment dependence, as well as improving the exposure latitude and the pattern profile.

The organic nitrogen-containing compound used herein may be any of well-known organic nitrogen-containing compounds which are commonly used in prior art resist compositions, especially chemically amplified resist compositions. Suitable organic nitrogen-containing compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amide derivatives, imide derivatives, and carbamate derivatives.

Of the organic nitrogen-containing compounds described above, tertiary amines are preferably selected as the acid diffusion regulator.

Examples of suitable primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, and tetraethylenepentamine. Examples of suitable secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethylmethylenediamine, N,N-dimethylethylenediamine, and N,N-dimethyltetraethylenepentamine. Examples of suitable tertiary aliphatic amines include trimethylamine, triethylamine, tri-n-propylamine, truisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethylmethylenediamine, N,N,N',N'-tetramethylethylenediamine, and N,N,N',N'-tetramethyltetraethylenepentamine.

Examples of suitable mixed amines include dimethylethylamine, methylethylpropylamine, benzylamine, phenethylamine, and benzyldimethylamine. Examples of suitable aromatic and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, and N,N-dimethyltoluidine), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, and N-methylpyrrole), oxazole derivatives (e.g., oxazole and isooxazole), thiazole derivatives (e.g., thiazole and isothiazole), imidazole derivatives (e.g., imidazole, 4-methylimidazole, and 4-methyl-2-phenylimidazole), pyrazole derivatives, furazan derivatives, pyrroline derivatives (e.g., pyrroline and 2-methyl-1-pyrroline), pyrrolidine derivatives (e.g., pyrrolidine, N-methylpyrrolidine, pyrrolidinone, and N-methylpyrrolidone), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 4-pyrrolidinopyridine, 2-(1-ethylpropyl)pyridine, aminopyridine, and dimethylaminopyridine), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline and 3-quinolinecarbonitrile), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, and uridine derivatives.

Examples of suitable nitrogen-containing compounds having carboxyl group include aminobenzoic acid, indolecarboxylic acid, and amino acid derivatives (e.g. nicotinic acid, alanine, alginine, aspartic acid, glutamic acid, glycine, histidine, isoleucine, glycylleucine, leucine, methionine, phenylalanine, threonine, lysine, 3-aminopyrazine-2-carboxylic acid, and methoxyalanine). Examples of suitable nitrogen-containing compounds having sulfonyl group include 3-pyridinesulfonic acid and pyridinium p-toluenesulfonate. Examples of suitable nitrogen-containing compounds having hydroxyl group, nitrogen-containing compounds having hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperldino-1,2-propanediol, 3-pyrrolidino-1,2-propanediol, 8-hydroxyjulolidine, 3-guinuclidinol, 3-tropanol, 1-methyl-2-pyrrolidine ethanol, 1-aziridine ethanol, N-(2-hydroxyethyl)phthalimide, and N-(2-hydroxyethyl)isonicotinamide. Examples of suitable amide derivatives include formamide, N-methylformamide, N,N-dimethylformamide, acetamide, N-methylacetamide, N,N- dimethylacetamide, propionamide, benzamide, and 1-cyclohexylpyrrolidone. Suitable imide derivatives include phthalimide, succinimide, and maleimide. Suitable carbamate derivatives include N-t-butoxycarbonyl-N,N-dicyclohexylamine, N-t-butoxycarbonylbenzimidazole and oxazolidinone.

In addition, organic nitrogen-containing compounds of the following general formula (B)-1 may also be included alone or in admixture.

$$N(X)_n(Y)_{3-n} \tag{B-1}$$

In the formula, n is equal to 1, 2 or 3; side chain Y is independently hydrogen or a straight, branched or cyclic $C_1$-$C_{20}$ alkyl group which may contain an ether or hydroxyl group; and side chain X is independently selected from groups of the following general formulas (X1) to (X3), and two or three X's may bond together to form a ring.

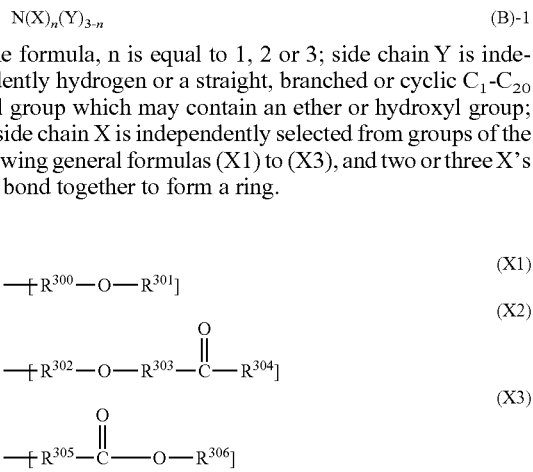

In the formulas, $R^{300}$, $R^{302}$ and $R^{305}$ are independently straight or branched $C_1$-$C_4$ alkylene groups; $R^{301}$ and $R^{304}$ are independently hydrogen, or straight, branched or cyclic $C_1$-$C_{20}$ alkyl groups which may contain at least one hydroxyl, ether, ester group or lactone ring; $R^{303}$ is a single bond or a straight or branched $C_1$-$C_4$ alkylene group; and $R^{306}$ is a straight, branched or cyclic $C_1$-$C_{20}$ alkyl group which may contain at least one hydroxyl, ether, ester group or lactone ring.

Illustrative examples of the compounds of formula (B)-1 include tris(2-methoxymethoxyethyl)amine,
tris{2-(2-methoxyethoxy)ethyl}amine,
tris{2-(2-methoxyethoxymethoxy)ethyl}amine,
tris{2-(1-methoxyethoxy)ethyl}amine,
tris{2-(1-ethoxyethoxy)ethyl}amine,
tris{2-(1-ethoxypropoxy)ethyl}amine,
tris[2-{2-(2-hydroxyethoxy)ethoxy}ethyl]amine,
4,7,13,16,21,24-hexaoxa-1,10-diazabicyclo[8.8.8]hexacosane,
4,7,13,18-tetraoxa-1,10-diazabicyclo[8.5.5]eicosane,
1,4,10,13-tetraoxa-7,16-diazabicyclooctadecane,
1-aza-12-crown-4, 1-aza-15-crown-5, 1-aza-18-crown-6,
tris(2-formyloxyethyl)amine, tris(2-acetoxyethyl)amine,
tris(2-propionyloxyethyl)amine, tris(2-butyryloxyethyl)amine,
tris(2-isobutyryloxyethyl)amine, tris(2-valeryloxyethyl)amine,
tris(2-pivaloyloxyethyl)amine,
N,N-bis(2-acetoxyethyl)-2-(acetoxyacetoxy)ethylamine,
tris(2-methoxycarbonyloxyethyl)amine,
tris(2-tert-butoxycarbonyloxyethyl)amine,
tris[2-(2-oxopropoxy)ethyl]amine,
tris[2-(methoxycarbonylmethyl)oxyethyl]amine,
tris[2-(tert-butoxycarbonylmethyloxy)ethyl]amine,
tris[2-(cyclohexyloxycarbonylmethyloxy)ethyl]amine,
tris(2-methoxycarbonylethyl)amine,
tris(2-ethoxycarbonylethyl)amine,
N,N-bis(2-hydroxyethyl)-2-(methoxycarbonyl)ethylamine,
N,N-bis(2-acetoxyethyl)-2-(methoxycarbonyl)ethylamine,
N,N-bis(2-hydroxyethyl)-2-(ethoxycarbonyl)ethylamine,
N,N-bis(2-acetoxyethyl)-2-(ethoxycarbonyl)ethylamine,
N,N-bis(2-hydroxyethyl)-2-(2-methoxyethoxycarbonyl)ethylamine,
N,N-bis(2-acetoxyethyl)-2-(2-methoxyethoxycarbonyl)ethylamine,
N,N-bis(2-hydroxyethyl)-2-(2-hydroxyethoxycarbonyl)ethylamine,
N,N-bis(2-acetoxyethyl)-2-(2-acetoxyethoxycarbonyl)ethylamine,
N,N-bis(2-hydroxyethyl)-2-[(methoxycarbonyl)methoxycarbonyl]-ethylamine,
N,N-bis(2-acetoxyethyl)-2-[(methoxycarbonyl)methoxycarbonyl]-ethylamine,
N,N-bis(2-hydroxyethyl)-2-(2-oxopropoxycarbonyl)ethylamine,
N,N-bis(2-acetoxyethyl)-2-(2-oxopropoxycarbonyl)ethylamine,
N,N-bis(2-hydroxyethyl)-2-(tetrahydrofurfuryloxycarbonyl)-ethylamine,
N,N-bis(2-acetoxyethyl)-2-(tetrahydrofurfuryloxycarbonyl)-ethylamine,
N,N-bis(2-hydroxyethyl)-2-[(2-oxotetrahydrofuran-3-yl)oxy-carbonyl]ethylamine,
N,N-bis(2-acetoxyethyl)-2-[(2-oxotetrahydrofuran-3-yl)oxy-carbonyl]ethylamine,
N,N-bis(2-hydroxyethyl)-2-(4-hydroxybutoxycarbonyl)ethylamine,
N,N-bis(2-formyloxyethyl)-2-(4-formyloxybutoxycarbonyl)-ethylamine,
N,N-bis(2-formyloxyethyl)-2-(2-formyloxyethoxycarbonyl)-ethylamine,
N,N-bis(2-methoxyethyl)-2-(methoxycarbonyl)ethylamine,
N-(2-hydroxyethyl)-bis[2-(methoxycarbonyl)ethyl]amine,
N-(2-acetoxyethyl)-bis[2-(methoxycarbonyl)ethyl]amine,
N-(2-hydroxyethyl)-bis[2-(ethoxycarbonyl)ethyl]amine,
N-(2-acetoxyethyl)-bis[2-(ethoxycarbonyl)ethyl]amine,
N-(3-hydroxy-1-propyl)-bis[2-(methoxycarbonyl)ethyl]amine,
N-(3-acetoxy-1-propyl)-bis[2-(methoxycarbonyl)ethyl]amine,
N-(2-methoxyethyl)-bis[2-(methoxycarbonyl)ethyl]amine,
N-butyl-bis[2-(methoxycarbonyl)ethyl]amine,
N-butyl-bis[2-(2-methoxyethoxycarbonyl)ethyl]amine,
N-methyl-bis(2-acetoxyethyl)amine,
N-ethyl-bis(2-acetoxyethyl)amine,
N-methyl-bis(2-pivaloyloxyethyl)amine,
N-ethyl-bis[2-(methoxycarbonyloxy)ethyl]amine,
N-ethyl-bis[2-(tert-butoxycarbonyloxy)ethyl]amine,
tris(methoxycarbonylmethyl)amine,
tris(ethoxycarbonylmethyl)amine,
N-butyl-bis(methoxycarbonylmethyl)amine,
N-hexyl-bis(methoxycarbonylmethyl)amine, and
β-(diethylamino)-δ-valerolactone.

Also useful are one or more organic nitrogen-containing compounds having cyclic structure represented by the following general formula (B)-2.

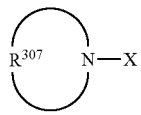

Herein X is as defined above, and $R^{307}$ is a straight or branched $C_2$-$C_{20}$ alkylene group which may contain one or more carbonyl, ether, ester or sulfide groups.

Illustrative examples of the organic nitrogen-containing compounds having formula (B)-2 include
1-[2-(methoxymethoxy)ethyl]pyrrolidine,
1-[2-(methoxymethoxy)ethyl]piperidine,
4-[2-(methoxymethoxy)ethyl]morpholine,
1-[2-[(2-methoxyethoxy)methoxy]ethyl]pyrrolidine,
1-[2-[(2-methoxyethoxy)methoxy]ethyl]piperidine,
4-[2-[(2-methoxyethoxy)methoxy]ethyl]morpholine,
2-(1-pyrrolidinyl)ethyl acetate, 2-piperidinoethyl acetate,
2-morpholinoethyl acetate, 2-(1-pyrrolidinyl)ethyl formate,
2-piperidinoethyl propionate,
2-morpholinoethyl acetoxyacetate,
2-(1-pyrrolidinyl)ethyl methoxyacetate,
4-[2-(methoxycarbonyloxy)ethyl]morpholine,
1-[2-(t-butoxycarbonyloxy)ethyl]piperidine,
4-[2-(2-methoxyethoxycarbonyloxy)ethyl]morpholine,
methyl 3-(1-pyrrolidinyl)propionate,
methyl 3-piperidinopropionate, methyl 3-morpholinopropionate,
methyl 3-(thiomorpholino)propionate,
methyl 2-methyl-3-(1-pyrrolidinyl)propionate,
ethyl 3-morpholinopropionate,
methoxycarbonylmethyl 3-piperidinopropionate,
2-hydroxyethyl 3-(1-pyrrolidinyl)propionate,
2-acetoxyethyl 3-morpholinopropionate,
2-oxotetrahydrofuran-3-yl 3-(1-pyrrolidinyl)propionate,
tetrahydrofurfuryl 3-morpholinopropionate,
glycidyl 3-piperidinopropionate,
2-methoxyethyl 3-morpholinopropionate,
2-(2-methoxyethoxy)ethyl 3-(1-pyrrolidinyl)propionate,
butyl 3-morpholinopropionate,
cyclohexyl 3-piperidinopropionate,
α-(1-pyrrolidinyl)methyl-γ-butyrolactone,
β-piperidino-γ-butyrolactone, β-morpholino-δ-valerolactone,
methyl 1-pyrrolidinylacetate, methyl piperidinoacetate,
methyl morpholinoacetate, methyl thiomorpholinoacetate,
ethyl 1-pyrrolidinylacetate, 2-methoxyethyl morpholinoacetate,
2-morpholinoethyl 2-methoxyacetate,
2-morpholinoethyl 2-(2-methoxyethoxy)acetate,
2-morpholinoethyl 2-[2-(2-methoxyethoxy)ethoxy]acetate,
2-morpholinoethyl hexanoate, 2-morpholinoethyl octanoate,
2-morpholinoethyl decanoate, 2-morpholinoethyl laurate,
2-morpholinoethyl myristate, 2-morpholinoethyl palmitate, and
2-morpholinoethyl stearate.

Also, one or more organic nitrogen-containing compounds having cyano group represented by the following general formulae (B)-3 to (B)-6 may be blended.

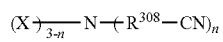
(B)-3

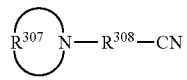
(B)-4

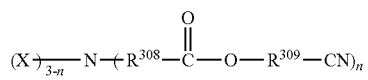
(B)-5

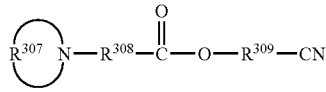
(B)-6

Herein, X, $R^{307}$ and n are as defined above, and $R^{308}$ and $R^{309}$ are each independently a straight or branched $C_1$-$C_4$ alkylene group.

Illustrative examples of the organic nitrogen-containing compounds having cyano represented by formulae (B)-3 to (B)-6 include
3-(diethylamino)propiononitrile,
N,N-bis(2-hydroxyethyl)-3-aminopropiononitrile,
N,N-bis(2-acetoxyethyl)-3-aminopropiononitrile,
N,N-bis(2-formyloxyethyl)-3-aminopropiononitrile,
N,N-bis(2-methoxyethyl)-3-aminopropiononitrile,
N,N-bis[2-(methoxymethoxy)ethyl]-3-aminopropiononitrile,
methyl N-(2-cyanoethyl)-N-(2-methoxyethyl)-3-aminopropionate,
methyl N-(2-cyanoethyl)-N-(2-hydroxyethyl)-3-aminopropionate,
methyl N-(2-acetoxyethyl)-N-(2-cyanoethyl)-3-aminopropionate,
N-(2-cyanoethyl)-N-ethyl-3-aminopropiononitrile,
N-(2-cyanoethyl)-N-(2-hydroxyethyl)-3-aminopropiononitrile,
N-(2-acetoxyethyl)-N-(2-cyanoethyl)-3-aminopropiononitrile,
N-(2-cyanoethyl)-N-(2-formyloxyethyl)-3-aminopropiononitrile,
N-(2-cyanoethyl)-N-(2-methoxyethyl)-3-aminopropiononitrile,
N-(2-cyanoethyl)-N-[2-(methoxymethoxy)ethyl]-3-aminopropiono-nitrile,
N-(2-cyanoethyl)-N-(3-hydroxy-1-propyl)-3-aminopropiononitrile,
N-(3-acetoxy-1-propyl)-N-(2-cyanoethyl)-3-aminopropiononitrile,
N-(2-cyanoethyl)-N-(3-formyloxy-1-propyl)-3-aminopropiono-nitrile,
N-(2-cyanoethyl)-N-tetrahydrofurfuryl-3-aminopropiononitrile,
N,N-bis(2-cyanoethyl)-3-aminopropiononitrile, diethylaminoacetonitrile,
N,N-bis(2-hydroxyethyl)aminoacetonitrile,
N,N-bis(2-acetoxyethyl)aminoacetonitrile,
N,N-bis(2-formyloxyethyl)aminoacetonitrile,
N,N-bis(2-methoxyethyl)aminoacetonitrile,
N,N-bis[2-(methoxymethoxy)ethyl]aminoacetonitrile,
methyl N-cyanomethyl-N-(2-methoxyethyl)-3-aminopropionate,
methyl N-cyanomethyl-N-(2-hydroxyethyl)-3-aminopropionate,
methyl N-(2-acetoxyethyl)-N-cyanomethyl-3-aminopropionate,
N-cyanomethyl-N-(2-hydroxyethyl)aminoacetonitrile,
N-(2-acetoxyethyl)-N-(cyanomethyl)aminoacetonitrile,
N-cyanomethyl-N-(2-formyloxyethyl)aminoacetonitrile,
N-cyanomethyl-N-(2-methoxyethyl)aminoacetonitrile,
N-cyanomethyl-N-[2-(methoxymethoxy)ethyl]aminoacetonitrile,
N-cyanomethyl-N-(3-hydroxy-1-propyl)aminoacetonitrile,
N-(3-acetoxy-1-propyl)-N-(cyanomethyl)aminoacetonitrile, N-cyanomethyl-N-(3-formyloxy-1-propyl)aminoacetonitrile,
N,N-bis(cyanomethyl)aminoacetonitrile,
1-pyrrolidinepropiononitrile, 1-piperidinepropiononitrile,
4-morpholinepropiononitrile, 1-pyrrolidineacetonitrile,
1-piperidineacetonitrile, 4-morpholineacetonitrile,
cyanomethyl 3-diethylaminopropionate,
cyanomethyl N,N-bis(2-hydroxyethyl)-3-aminopropionate,
cyanomethyl N,N-bis(2-acetoxyethyl)-3-aminopropionate,
cyanomethyl N,N-bis(2-formyloxyethyl)-3-aminopropionate,
cyanomethyl N,N-bis(2-methoxyethyl)-3-aminopropionate,
cyanomethyl N,N-bis[2-(methoxymethoxy)ethyl]-3-aminopropionate,
2-cyanoethyl 3-diethylaminopropionate,
2-cyanoethyl N,N-bis(2-hydroxyethyl)-3-aminopropionate,
2-cyanoethyl N,N-bis(2-acetoxyethyl)-3-aminopropionate,
2-cyanoethyl N,N-bis(2-formyloxyethyl)-3-aminopropionate,
2-cyanoethyl N,N-bis(2-methoxyethyl)-3-aminopropionate,
2-cyanoethyl N,N-bis[2-(methoxymethoxy)ethyl]-3-aminopropionate,
cyanomethyl 1-pyrrolidinepropionate,
cyanomethyl 1-piperidinepropionate,
cyanomethyl 4-morpholinepropionate,
2-cyanoethyl 1-pyrrolidinepropionate,
2-cyanoethyl 1-piperidinepropionate, and
2-cyanoethyl 4-morpholinepropionate.

Also included are organic nitrogen-containing compounds having an imidazole structure and a polar functional group, represented by the general formula (B)-7.

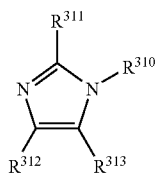

(B)-7

Herein, $R^{310}$ is a straight, branched or cyclic $C_2$-$C_{20}$ alkyl group bearing at least one polar functional group selected from among hydroxyl, carbonyl, ester, ether, sulfide, carbonate, cyano and acetal groups; $R^{311}$, $R^{312}$ and $R^{313}$ are each independently a hydrogen atom, a straight, branched or cyclic $C_1$-$C_{10}$ alkyl group, aryl group or aralkyl group.

Also included are organic nitrogen-containing compounds having a benzimidazole structure and a polar functional group, represented by the general formula (B)-8.

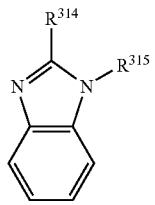

(B)-8

Herein, $R^{314}$ is a hydrogen atom, a straight, branched or cyclic $C_1$-$C_{10}$ alkyl group, aryl group or aralkyl group. $R^{315}$ is a polar functional group-bearing, straight, branched or cyclic $C_1$-$C_{20}$ alkyl group, and the alkyl group contains as the polar functional group at least one group selected from among ester, acetal and cyano groups, and may additionally contain at least one group selected from among hydroxyl, carbonyl, ether, sulfide and carbonate groups.

Further included are heterocyclic nitrogen-containing compounds having a polar functional group, represented by the general formulae (B)-9 and (B)-10.

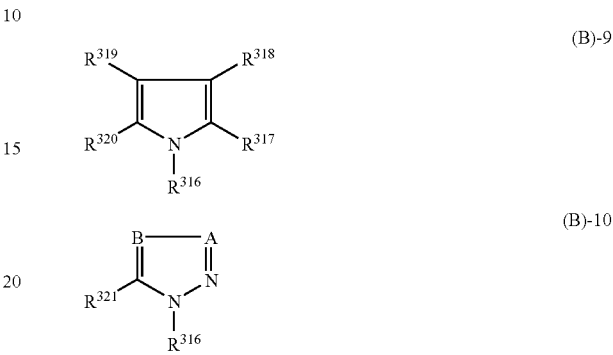

Herein, A is a nitrogen atom or $=C-R^{322}$, B is a nitrogen atom or $=C-R^{323}$, $R^{316}$ is a straight, branched or cyclic $C_2$-$C_{20}$ alkyl group bearing at least one polar functional group selected from among hydroxyl, carbonyl, ester, ether, sulfide, carbonate, cyano and acetal groups; $R^{317}$, $R^{318}$, $R^{319}$ and $R^{320}$ are each independently a hydrogen atom, a straight, branched or cyclic $C_1$-$C_{10}$ alkyl group or aryl group, or a pair of $R^{317}$ and $R^{318}$ or a pair of $R^{319}$ and $R^{320}$ may bond together to form a benzene, naphthalene or pyridine ring with the carbon atoms to which they are attached; $R^{321}$ is a hydrogen atom, a straight, branched or cyclic $C_1$-$C_{10}$ alkyl group or aryl group; $R^{322}$ and $R^{323}$ each are a hydrogen atom, a straight, branched or cyclic $C_1$-$C_{10}$ alkyl group or aryl group, or a pair of $R^{321}$ and $R^{323}$, taken together, may form a benzene or naphthalene ring.

Also included are organic nitrogen-containing compounds of aromatic carboxylic ester structure having the general formulae (B)-11 to (B)-14.

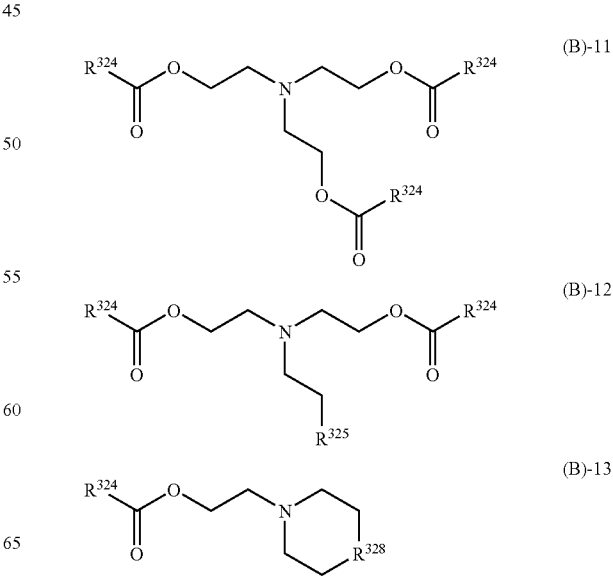

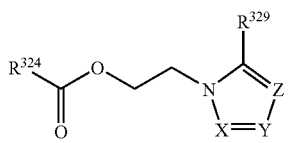

Herein $R^{324}$ is a $C_6$-$C_{20}$ aryl group or $C_4$-$C_{20}$ hetero-aromatic group, in which some or all of hydrogen atoms may be replaced by halogen atoms, straight, branched or cyclic $C_1$-$C_{20}$ alkyl groups, $C_6$-$C_{20}$ aryl groups, $C_7$-$C_{20}$ aralkyl groups, $C_1$-$C_{10}$ alkoxy groups, $C_1$-$C_{10}$ acyloxy groups or $C_1$-$C_{10}$ alkylthio groups. $R^{325}$ is $CO_2R^{326}$, $OR^{327}$ or cyano group. $R^{326}$ is a $C_1$-$C_{10}$ alkyl group, in which some methylene groups may be replaced by oxygen atoms. $R^{327}$ is a $C_1$-$C_{10}$ alkyl or acyl group, in which some methylene groups may be replaced by oxygen atoms. $R^{328}$ is a single bond, methylene, ethylene, sulfur atom or —$O(CH_2CH_2O)_n$— group wherein n is 0, 1, 2, 3 or 4. $R^{329}$ is hydrogen, methyl, ethyl or phenyl. X is a nitrogen atom or $CR^{330}$. Y is a nitrogen atom or $CR^{331}$. Z is a nitrogen atom or $CR^{332}$. $R^{330}$, $R^{331}$ and $R^{332}$ are each independently hydrogen, methyl or phenyl. Alternatively, a pair of $R^{330}$ and $R^{331}$ or a pair of $R^{331}$ and $R^{332}$ may bond together to form a $C_6$-$C_{20}$ aromatic ring or $C_2$-$C_{20}$ hetero-aromatic ring with the carbon atoms to which they are attached.

Further included are organic nitrogen-containing compounds of 7-oxanorbornane-2-carboxylic ester structure having the general formula (B)-15.

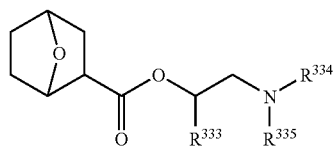

Herein $R^{333}$ is hydrogen or a straight, branched or cyclic $C_1$-$C_{10}$ alkyl group. $R^{334}$ and $R^{335}$ are each independently a $C_1$-$C_{20}$ alkyl group, $C_6$-$C_{20}$ aryl group or $C_7$-$C_{20}$ aralkyl group, which may contain one or more polar functional groups selected from among ether, carbonyl, ester, alcohol, sulfide, nitrile, amine, imine, and amide and in which some hydrogen atoms may be replaced by halogen atoms. $R^{334}$ and $R^{335}$ may bond together to form a heterocyclic or hetero-aromatic ring of 2 to 20 carbon atoms with the nitrogen atom to which they are attached.

The organic nitrogen-containing compounds may be used alone or in admixture of two or more. The organic nitrogen-containing compound is preferably formulated in an amount of 0.001 to 4 parts, and especially 0.01 to 2 parts by weight, per 100 parts by weight of the base polymer. Less than 0.001 part of the nitrogen-containing compound achieves no or little addition effect whereas more than 4 parts may result in too low a sensitivity.

Other Components

The resist composition of the invention may include optional ingredients, for example, a surfactant which is commonly used for improving the coating characteristics. Optional ingredients may be added in conventional amounts so long as this does not compromise the objects of the invention.

Nonionic surfactants are preferred, examples of which include perfluoroalkylpolyoxyethylene ethanols, fluorinated alkyl esters, perfluoroalkylamine oxides, perfluoroalkyl EO-addition products, and fluorinated organosiloxane compounds. Useful surfactants are commercially available under the trade names Fluorad FC-430, FC-431, FC-4430 and FC-4432 from Sumitomo 3M, Ltd., Surflon S-141, S-145, KH-10, KH-20, KH-30 and KH-40 from Asahi Glass Co., Ltd., Unidyne DS-401, DS-403 and DS-451 from Daikin Industry Co., Ltd., Megaface F-8151 from Dai-Nippon Ink & Chemicals, Inc., and X-70-092 and X-70-093 from Shin-Etsu Chemical Co., Ltd. Preferred surfactants are Fluorad FC-430 and FC-4430 from Sumitomo 3M, Ltd., KH-20 and KH-30 from Asahi Glass Co., Ltd., and X-70-093 from Shin-Etsu Chemical Co., Ltd.

Optionally, there may be added to the resist composition of the invention a polymer which will be locally distributed at the top of a coating and functions to adjust a hydrophilic/hydrophobic balance at the surface, to enhance water repellency, or to prevent low-molecular-weight components from flowing into or out of the coating when the coating comes in contact with water or similar liquids, that is, a polymeric surfactant which is insoluble in water and soluble in alkaline developer. The functional polymer may be added in customary amounts as long as it does not compromise the objects of the invention. The preferred amount of the functional polymer added is 0 to 10 parts by weight per 100 parts by weight of the base polymer, and when added, at least 0.1 part by weight.

Preferred examples of the functional polymer which will be localized at the coating top include polymers and copolymers comprising fluorinated units of one or more types, and copolymers comprising fluorinated units and other units. Illustrative examples of suitable fluorinated units and other units are shown below, but not limited thereto. They are described in JP-A 2007-297590.

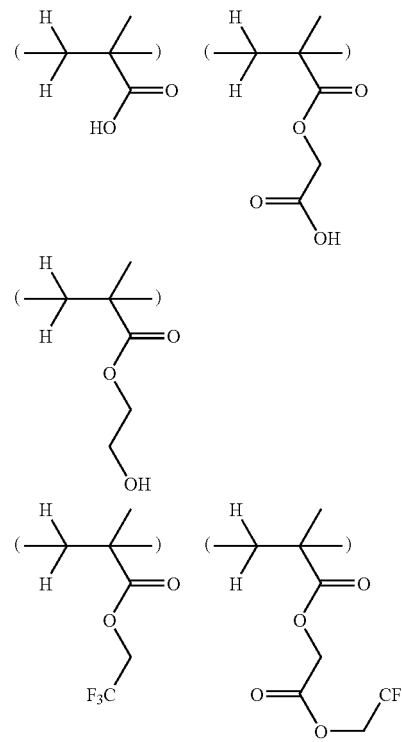

107
-continued
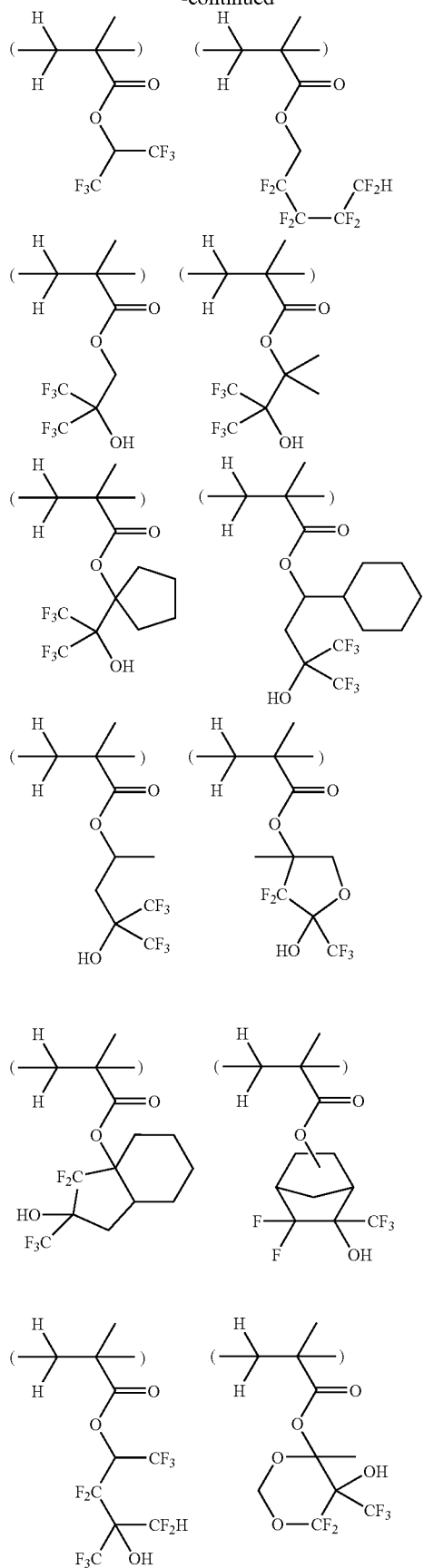
108
-continued
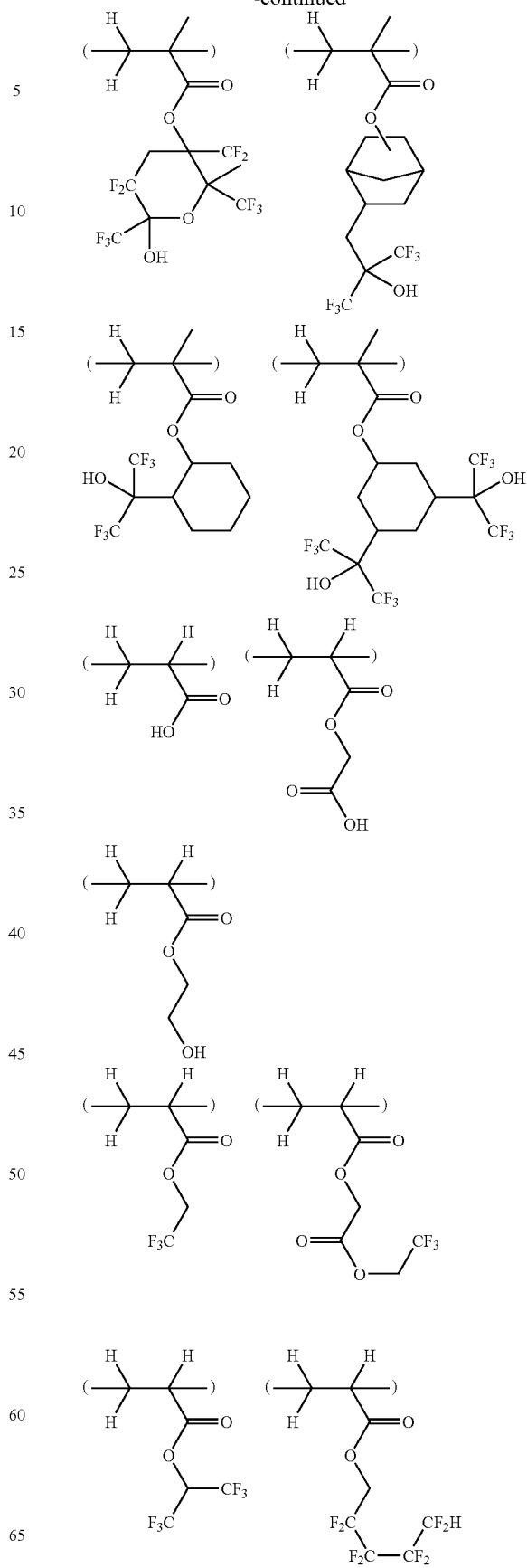

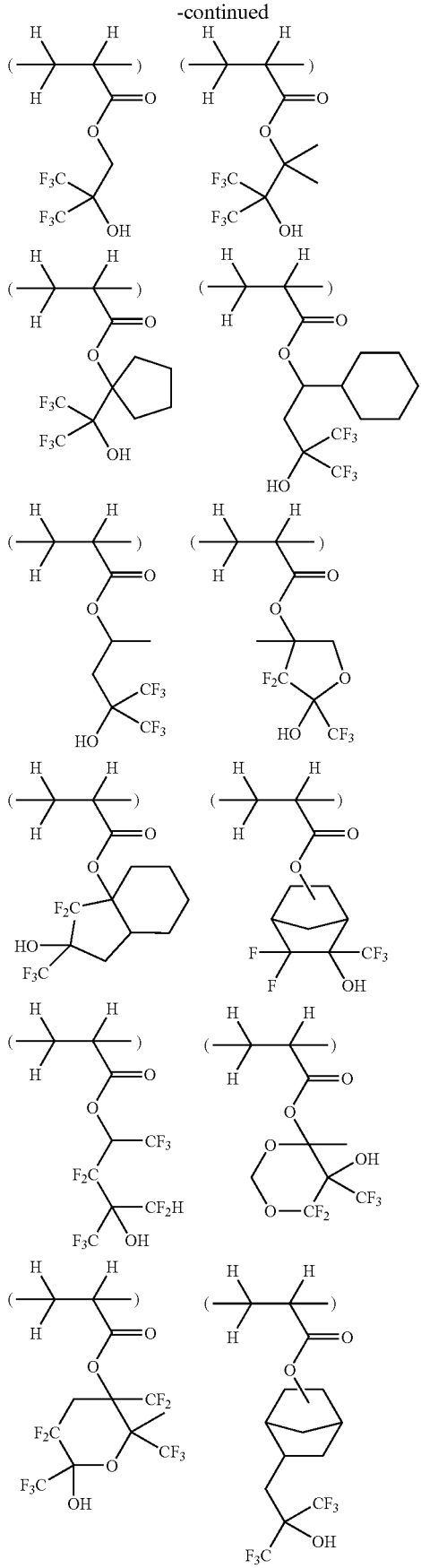

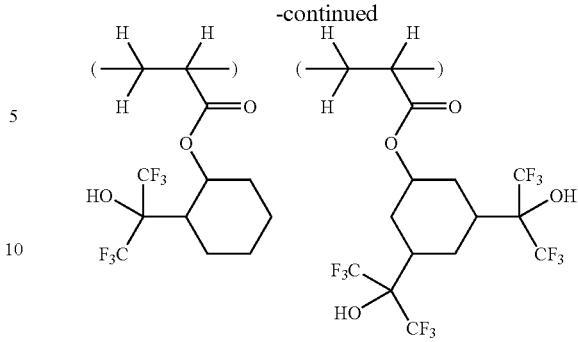

The functional polymer which will be localized at the coating top should preferably have a weight average molecular weight of 1,000 to 50,000, more preferably 2,000 to 20,000, as measured by GPC versus polystyrene standards. Outside the s range, the polymer may have insufficient surface-modifying effect or cause development defects.

To the resist composition of the invention, other components such as dissolution regulators, carboxylic acid compounds and acetylene alcohol derivatives may be added if necessary. Optional components may be added in conventional amounts so long as this does not compromise the objects of the invention.

The dissolution regulator which can be added to the resist composition is a compound having on the molecule at least two phenolic hydroxyl groups, in which an average of from 0 to 100 mol % of all the hydrogen atoms on the phenolic hydroxyl groups are replaced by acid labile groups or a compound having on the molecule at least one carboxyl group, in which an average of 50 to 100 mol % of all the hydrogen atoms on the carboxyl groups are replaced by acid labile groups, both the compounds having a weight average molecular weight within a range of 100 to 1,000, and preferably 150 to 800.

The degree of substitution of the hydrogen atoms on the phenolic hydroxyl groups with acid labile groups is on average at least 0 mol %, and preferably at least 30 mol %, of all the phenolic hydroxyl groups. The upper limit is 100 mol %, and preferably 80 mol %. The degree of substitution of the hydrogen atoms on the carboxyl groups with acid labile groups is on average at least 50 mol %, and preferably at least 70 mol %, of all the carboxyl groups, with the upper limit being 100 mol %.

Preferable examples of such compounds having two or more phenolic hydroxyl groups or compounds having a carboxyl group include those of formulas (D1) to (D14) below.

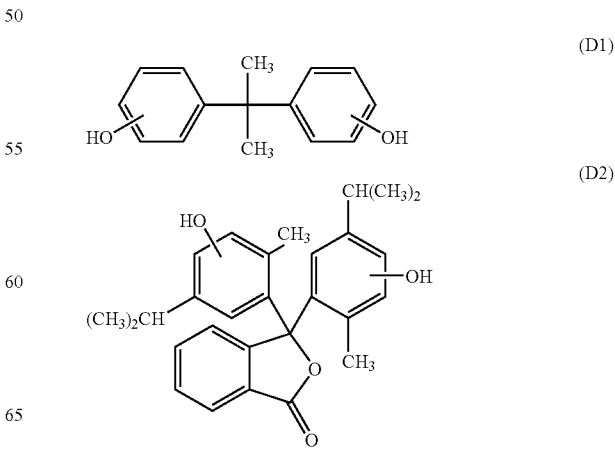

-continued

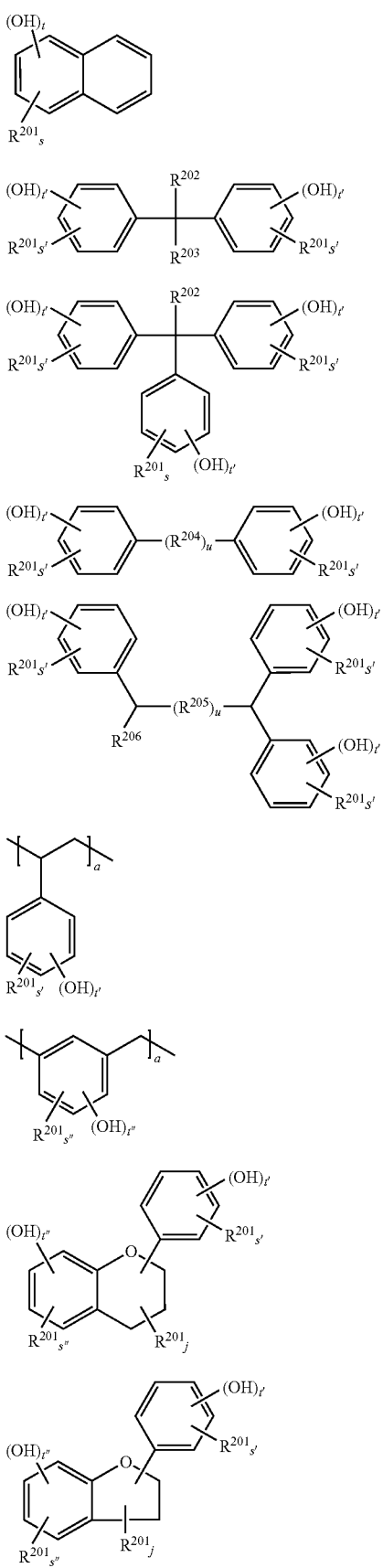

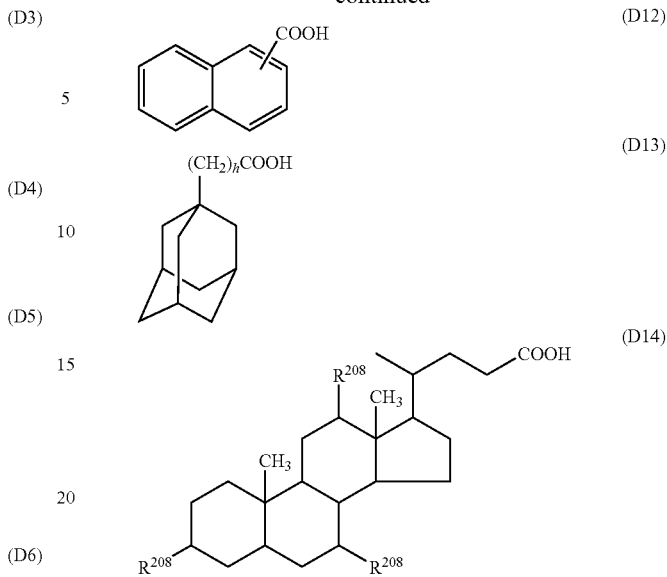

In these formulas, $R^{201}$ and $R^{202}$ are each hydrogen or a straight or branched $C_1$-$C_8$ alkyl or alkenyl group, for example, hydrogen, methyl, ethyl, butyl, propyl, ethynyl and cyclohexyl.

$R^{203}$ is hydrogen, a straight or branched $C_1$-$C_8$ alkyl or alkenyl group, or —$(R^{207})_h$—COOH wherein $R^{207}$ is a straight or branched $C_1$-$C_{10}$ alkylene, for example, those exemplified for $R^{201}$ and $R^{202}$ and —COOH and —CH$_2$COOH.

$R^{204}$ is —(CH$_2$)$_i$— wherein i=2 to 10, $C_6$-$C_{10}$ arylene, carbonyl, sulfonyl, an oxygen atom, or a sulfur atom, for example, ethylene, phenylene, carbonyl, sulfonyl, oxygen atom or sulfur atom.

$R^{205}$ is a $C_1$-$C_{10}$ alkylene, a $C_6$-$C_{10}$ arylene, carbonyl, sulfonyl, an oxygen atom, or a sulfur atom, for example, methylene and those exemplified for $R^{204}$.

$R^{206}$ is hydrogen, a straight or branched $C_1$-$C_8$ alkyl or alkenyl, or a phenyl or naphthyl group in which at least one hydrogen atom is substituted by a hydroxyl group, for example, hydrogen, methyl, ethyl, butyl, propyl, ethynyl, cyclohexyl, hydroxyl-substituted phenyl, and hydroxyl-substituted naphthyl.

$R^{208}$ is hydrogen or hydroxyl.

The letter j is an integer from 0 to 5; u and h are each 0 or 1; s, t, s', t', s'', and t'' are each numbers which satisfy s+t=8, s'+t'=5, and s''+t''=4, and are such that each phenyl structure has at least one hydroxyl group; and α is a number such that the compounds of formula (D8) or (D9) have a weight average molecular weight of from 100 to 1,000.

Exemplary acid labile groups on the dissolution regulator include a variety of such groups, typically groups of the general formulae (L1) to (L4), tertiary $C_4$-$C_{20}$ alkyl groups, trialkylsilyl groups in which each of the alkyls has 1 to 6 carbon atoms, and $C_4$-$C_{20}$ oxoalkyl groups. Examples of the respective groups are as previously described.

The dissolution regulator may be formulated in an amount of 0 to 50 parts, preferably 0 to 40 parts, and more preferably 0 to 30 parts by weight, per 100 parts by weight of the base polymer, and may be used singly or as a mixture of two or more thereof. The use of more than 50 parts of the dissolution regulator may lead to slimming of the patterned film, and thus a decline in resolution.

The dissolution regulator can be synthesized by introducing acid labile groups into a compound having phenolic hydroxyl or carboxyl groups in accordance with an organic chemical formulation.

In the resist composition, a carboxylic acid compound may be blended. The carboxylic acid compound used herein may be one or more compounds selected from Groups I and II below, but is not limited thereto. Including this compound improves the PED stability of the resist and ameliorates edge roughness on nitride film substrates.

Group I:

Compounds of general formulas (A1) to (A10) below in which some or all of the hydrogen atoms on the phenolic hydroxyl groups are replaced by —$R^{401}$—COOH (wherein $R^{401}$ is a straight or branched $C_1$-$C_{10}$ alkylene group), and in which the molar ratio C/(C+D) of phenolic hydroxyl groups (C) to ≡C—COOH groups (D) in the molecule is from 0.1 to 1.0.

Group II:

Compounds of general formulas (A11) to (A15) below.

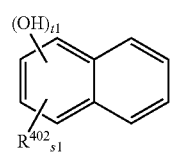 (A1)

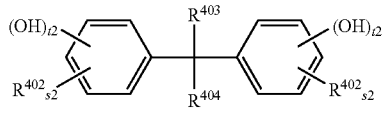 (A2)

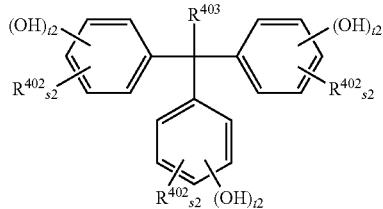 (A3)

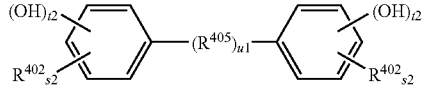 (A4)

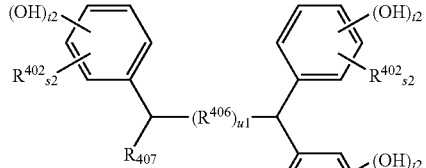 (A5)

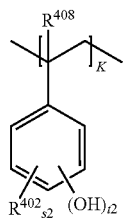 (A6)

-continued

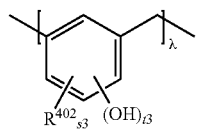 (A7)

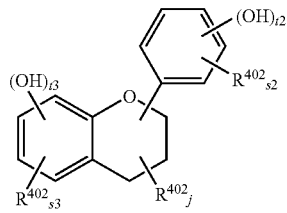 (A8)

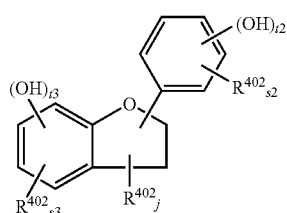 (A9)

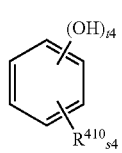 (A10)

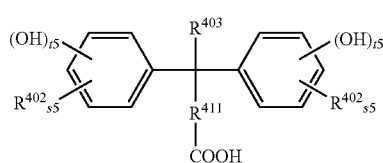 (A11)

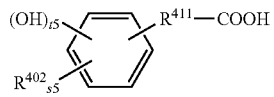 (A12)

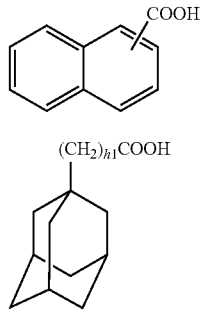 (A13)

(CH$_2$)$_{h1}$COOH (A14)

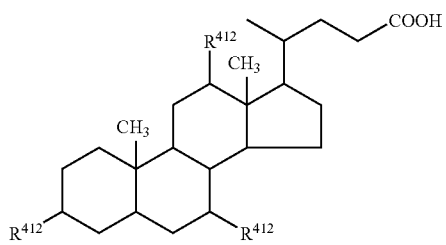 (A15)

In these formulas, $R^{402}$ and $R^{403}$ are each hydrogen or a straight or branched $C_1$-$C_8$ alkyl or alkenyl. $R^{404}$ is hydrogen, a straight or branched $C_1$-$C_8$ alkyl or alkenyl, or a $-(R^{409})_{h1}$-COOR' group wherein R' is hydrogen or $-R^{409}$-COOH.

$R^{405}$ is $-(CH_2)_i-$ (wherein i is 2 to 10), a $C_6$-$C_{10}$ arylene, carbonyl, sulfonyl, an oxygen atom, or a sulfur atom. $R^{406}$ is a $C_1$-$C_{10}$ alkylene, a $C_6$-$C_{10}$ arylene, carbonyl, sulfonyl, an oxygen atom, or a sulfur atom. $R^{407}$ is hydrogen, a straight or branched $C_1$-$C_8$ alkyl or alkenyl, or a hydroxyl-substituted phenyl or naphthyl. $R^{408}$ is hydrogen or methyl. $R^{409}$ is a straight or branched $C_1$-$C_{10}$ alkylene. $R^{410}$ is hydrogen, a straight or branched $C_1$-$C_8$ alkyl or alkenyl, or a $-R^{411}-$COOH group wherein $R^{411}$ is a straight or branched $C_1$-$C_{10}$ alkylene. $R^{412}$ is hydrogen or hydroxyl.

The letter j is a number from 0 to 3; s1, t1, s2, t2, s3, t3, s4, and t4 are each numbers which satisfy s1+t1=8, s2+t2=5, s3+t3=4, and s4+t4=6, and are such that each phenyl structure has at least one hydroxyl group; s5 and t5 are numbers which satisfy s5≧0, t5≧0, and s5+t5=5; u1 is a number from 1 to 4; h1 is a number from 0 to 4; κ is a number such that the compound of formula (A6) may have a weight average molecular weight of 1,000 to 5,000; and λ is a number such that the compound of formula (A7) may have a weight average molecular weight of 1,000 to 10,000.

Illustrative, non-limiting examples of the compound having a carboxyl group include compounds of the general formulas AI-1 to AI-14 and AII-1 to AII-10 below.

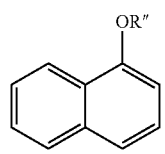
(AI-1)

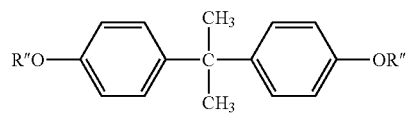
(AI-2)

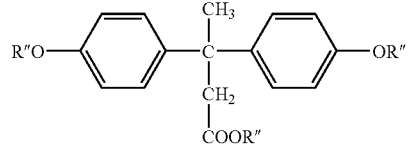
(AI-3)

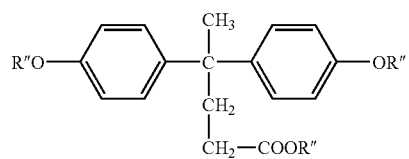
(AI-4)

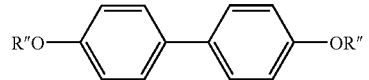
(AI-5)

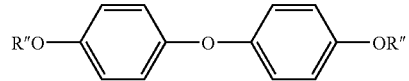
(AI-6)

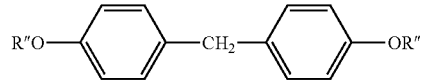
(AI-7)

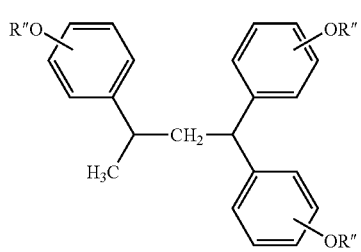
(AI-8)

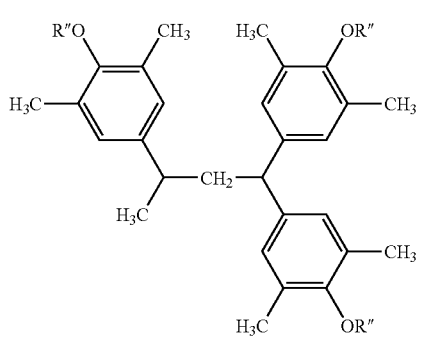
(AI-9)

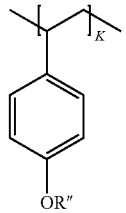
(AI-10)

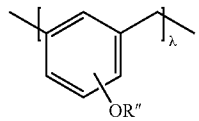
(AI-11)

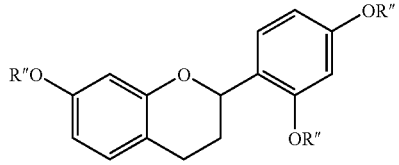
(AI-12)

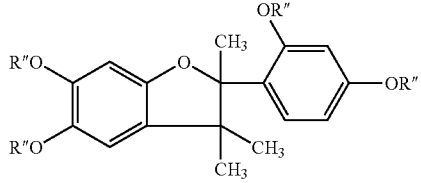
(AI-13)

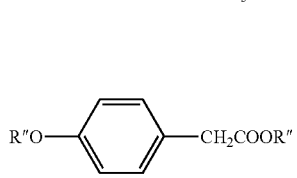
(AI-14)

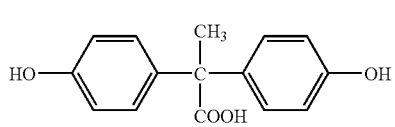
(AII-1)

(AII-2)

HO—⟨C₆H₄⟩—C(CH₃)(CH₂CH₂—COOH)—⟨C₆H₄⟩—OH (AII-3)

Ph—C(CH₃)(COOH)—Ph (AII-4)

Ph—C(CH₃)(CH₂CH₂—COOH)—Ph (AII-5)

⟨C₆H₅⟩—CH₂COOH (AII-6)

HO—⟨C₆H₄⟩—CH₂COOH (AII-7)

Naphthalene-1-COOH (AII-8)

Adamantane-COOH (AII-9)

Adamantane-CH₂COOH (AII-10)

Cholic acid-type steroid with COOH and OH

In the above formulas, R" is hydrogen or a —CH₂COOH group such that the —CH₂COOH group accounts for 10 to 100 mol % of R" in each compound, κ and λ are as defined above.

The compound having a ≡C—COOH group may be used singly or as combinations of two or more thereof. The compound having a ≡C—COOH group is added in an amount ranging from 0 to 5 parts, preferably 0.1 to 5 parts, more preferably 0.1 to 3 parts, further preferably 0.1 to 2 parts by weight, per 100 parts by weight of the base polymer. More than 5 parts of the compound can reduce the resolution of the resist composition.

Preferred examples of the acetylene alcohol derivative which can be added to the resist composition include those having the general formula (S1) or (S2) below.

$$R^{501}-C\equiv C-\underset{\underset{O-(CH_2CH_2O)_YH}{|}}{\overset{R^{502}}{\underset{|}{C}}}-R^{503} \quad (S1)$$

$$R^{505}-\underset{\underset{H(OCH_2CH_2)_X-O}{|}}{\overset{R^{504}}{\underset{|}{C}}}-C\equiv C-\underset{\underset{O-(CH_2CH_2O)_YH}{|}}{\overset{R^{502}}{\underset{|}{C}}}-R^{503} \quad (S2)$$

In the formulas, $R^{501}$, $R^{502}$, $R^{503}$, $R^{504}$, and $R^{505}$ are each hydrogen or a straight, branched or cyclic $C_1$-$C_8$ alkyl; and X and Y are each 0 or a positive number, satisfying $0\leq X\leq 30$, $0\leq Y\leq 30$, and $0\leq X+Y\leq 40$.

Preferable examples of the acetylene alcohol derivative include Surfynol 61, Surfynol 82, Surfynol 104, Surfynol 104E, Surfynol 104H, Surfynol 104A, Surfynol TG, Surfynol PC, Surfynol 440, Surfynol 465, and Surfynol 485 from Air Products and Chemicals Inc., and Surfynol E1004 from Nisshin Chemical Industries Ltd.

The acetylene alcohol derivative is preferably added in an amount of 0 to 2 parts, more preferably 0.01 to 2 parts, and even more preferably 0.02 to 1 part by weight per 100 parts by weight of the base polymer in the resist composition. More than 2 parts by weight may result in a resist having a low resolution.

Process

Pattern formation using the resist composition of the invention may be performed by well-known lithography processes. The process generally involves coating, heat treatment (or prebaking), exposure, heat treatment (post-exposure baking, PEB), and development. If necessary, any other steps may be added.

For pattern formation, the resist composition is first applied onto a substrate (on which an integrated circuit is to be formed, e.g., Si, $SiO_2$, SiN, SiON, TiN, WSi, BPSG, SOG, organic antireflective coating, Cr, CrO, CrON, MoSi, etc.) by a suitable coating technique such as spin coating, roll coating, flow coating, dip coating, spray coating or doctor coating. The coating is prebaked on a hot plate at a temperature of 60 to 150° C. for about 1 to 10 minutes, preferably 80 to 140° C. for 1 to 5 minutes. The resulting resist film is generally 0.01 to 2.0 µm thick.

A relationship of a reduced thickness of resist film to an etch selectivity ratio between resist film and processable substrate imposes severer limits on the process. Under consideration is the tri-layer process in which a resist layer, a silicon-containing intermediate layer, an undercoat layer having a high carbon density and high etch resistance, and a processable substrate are laminated in sequence from top to bottom. On etching with oxygen gas, hydrogen gas, ammonia gas or the like, a high etch selectivity ratio is available between the silicon-containing intermediate layer and the undercoat layer, which allows for thickness reduction of the silicon-containing intermediate layer. A relatively high etch selectivity ratio is also available between the monolayer resist and the silicon-containing intermediate layer, which allows for thickness reduction of the monolayer resist. The method for forming the undercoat layer in this case includes a coating and baking method and a CVD method. In the case of coating, novolac resins and resins obtained by polymerization of fused ring-containing olefins are used. In the CVD film formation, gases such as butane, ethane, propane, ethylene and acetylene are used. For the silicon-containing intermediate layer, either a coating method or a CVD method may be employed. The coating method uses silsesquioxane, polyhedral oligomeric silsesquioxane (POSS) and the like while the CVD method uses silane gases as the reactant. The silicon-containing intermediate layer may have an antireflection function with a light absorbing ability and have photo-absorptive groups like phenyl groups, or it may be a SiON film. An organic film may be formed between the silicon-containing intermediate layer and the photoresist, and the organic film in this case may be an organic antireflective coating. After the photoresist film is formed, deionized water rinsing (or post-soaking) may be carried out for extracting the acid generator and the like from the film surface or washing away particles, or a protective film may be coated.

With a mask having a desired pattern placed above the resist film, the resist film is then exposed to actinic radiation such as UV, deep-UV, electron beams, x-rays, excimer laser light, γ-rays and synchrotron radiation. Alternatively, pattern formation may be performed by direct writing imagewise with an electron beam without a mask. The exposure dose is preferably about 1 to 200 mJ/cm$^2$, more preferably about 10 to 100 mJ/cm$^2$. The film is further baked on a hot plate at 60 to 150° C. for 1 to 5 minutes, preferably 80 to 120° C. for 1 to 3 minutes (post-exposure baking=PEB). Thereafter the resist film is developed with a developer in the form of an aqueous base solution, for example, 0.1 to 5 wt %, preferably 2 to 3 wt % aqueous solution of tetramethylammonium hydroxide (TMAH) for 0.1 to 3 minutes, preferably 0.5 to 2 minutes by conventional techniques such as dip, puddle or spray techniques. In this way, a desired resist pattern is formed on the substrate. It is appreciated that the resist composition of the invention is suited for micro-patterning using such high-energy radiation as deep UV with a wavelength of 254 to 193 nm, vacuum UV with a wavelength of 157 nm, electron beams, soft x-rays, x-rays, excimer laser light, γ-rays and synchrotron radiation, and best suited for micro-patterning using high-energy radiation in the wavelength range of 180 to 200 nm.

Immersion lithography can be applied to the resist composition of the invention. The ArF immersion lithography uses a liquid having a refractive index of at least 1 and least absorptive to exposure radiation, such as deionized water or alkanes as the immersion solvent. The immersion lithography involves prebaking a resist film and exposing the resist film to light through a projection lens, with deionized water or similar liquid interposed between the resist film and the projection lens. Since this allows projection lenses to be designed to a numerical aperture (NA) of 1.0 or higher, formation of finer patterns is possible. The immersion lithography is important for the ArF lithography to survive to the 45-nm node, with a further development thereof being accelerated. In the case of immersion lithography, deionized water rinsing (or post-soaking) may be carried out after exposure for removing water droplets left on the resist film, or a protective coating may be applied onto the resist film after pre-baking for preventing any dissolution from the resist and improving water slip on the film surface. The resist protective coating used in the immersion lithography is preferably formed from a solution of a polymer having 1,1,1,3,3,3-hexafluoro-2-propanol residue which is insoluble in water and soluble in an alkaline developer liquid, in a solvent selected from alcohols of at least 4 carbon atoms, ethers of 8 to 12 carbon atoms, and mixtures thereof.

Also useful is a solution of a surfactant which is insoluble in water and soluble in an alkaline developer liquid, in a solvent selected from alcohols of at least 4 carbon atoms, ethers of 8 to 12 carbon atoms, and mixtures thereof.

In the process for pattern formation, after formation of a photoresist film, deionized water rinsing (or post-soaking) may be carried out for the purposes of extracting the acid generator from the film surface or washing away particles, or rinsing (or post-soaking) may be carried out for the purposes of removing water remaining on the resist film after exposure.

The technique enabling the ArF lithography to survive to the 32-nm node is a double patterning process. The double patterning process includes a trench process of processing an underlay to a 1:3 trench pattern by a first step of exposure and etching, shifting the position, and forming a 1:3 trench pattern by a second step of exposure, for forming a 1:1 pattern; and a line process of processing a first underlay to a 1:3 isolated left pattern by a first step of exposure and etching, shifting the position, processing a second underlay formed below the first underlay by a second step of exposure through the 1:3 isolated left pattern, for forming a half-pitch 1:1 pattern.

EXAMPLE

Examples of the invention are given below by way of illustration and not by way of limitation. Mw is weight average molecular weight.
Synthesis of Photoacid Generator Reference Example Synthesis of sodium 2-(1-adamantanecarbonyloxy)-1,1-difluoroethanesulfonate [Anion-1]

In tetrahydrofuran, 1-adamantanecarbonyl chloride and 2-bromo-2,2-difluoroethanol were mixed and ice cooled. Triethylamine was added to the mixture. By standard separation operation and solvent distillation, 2-bromo-2,2-difluoroethyl 1-adamantanecarboxylate was obtained. This compound was converted into a sodium sulfinate with sodium dithionite and then oxidized with hydrogen peroxide, yielding the target compound, sodium 2-(1-adamantanecarbonyloxy)-1,1-difluoroethane-sulfonate.

Synthesis of carboxylic ester is well known, and synthesis of sulfinic acid and sulfonic acid from alkyl halide is also well known. The latter is described, for example, in JP-A 2004-2252.

Synthesis of sodium
2-(pivaloyloxy)-1,1-difluoroethane-sulfonate
[Anion-2]

The target compound was obtained as was Anion-1 except that pivalic acid chloride was used in lieu of 1-adamantanecarbonyl chloride.

Synthesis of triphenylsulfonium
2-(pivaloyloxy)-1,1-difluoroethanesulfonate [PAG-1]

In 700 g of dichloromethane and 400 g of water were dissolved 159 g (0.37 mole) of sodium 2-(pivaloyloxy)-1,1-difluoroethanesulfonate (purity 63%) and 132 g (0.34 mole) of triphenylsulfonium iodide. The organic layer was separated, washed three times with 200 g of water, and concentrated. Diethyl ether was added to the residue for recrystallization, obtaining the target compound as white crystals. 164 g (yield 95%).

Synthesis of triphenylsulfonium 2-(1-adamantan-ecarbonyl-oxy)-1,1-difluoroethanesulfonate [PAG-2]

In 100 g of dichloromethane were dissolved 10 g (0.02 mole) of sodium 2-(1-adamantanecarbonyloxy)-1,1-difluoro-ethanesulfonate (purity 70%) and 50 g (0.02 mole) of a triphenylsulfonium chloride aqueous solution. The organic layer was separated, washed three times with 20 g of water, and concentrated. Diethyl ether was added to the residue for recrystallization, obtaining the target compound as white crystals. 10 g (yield 85%).

Synthesis of 4-tert-butylphenyldiphenylsulfonium 2-(pivaloyloxy)-1,1-difluoroethanesulfonate [PAG-3]

In 150 g of dichloromethane were dissolved 20 g (0.052 mole) of sodium 2-(pivaloyloxy)-1,1-difluoroethanesulfonate (purity 70%) and 217 g (0.052 mole) of a 4-tert-butylphenyl-diphenylsulfonium bromide aqueous solution. The organic layer was separated, washed three times with 50 g of water, and concentrated. Diethyl ether was added to the residue for recrystallization, obtaining the target compound as white crystals. 26 g (yield 79%).

Synthesis of 4-tert-butylphenyldiphenylsulfonium 2-(1-adamantanecarbonyloxy)-1,1-difluoroethane-sulfonate [PAG-4]

In 100 g of dichloromethane were dissolved 10 g (0.02 mole) of sodium 2-(1-adamantanecarbonyloxy)-1,1-difluoro-ethanesulfonate (purity 70%) and 80 g (0.02 mole) of a 4-tert-butylphenyldiphenylsulfonium bromide aqueous solution. The organic layer was separated, washed three times with 20 g of water, and concentrated. Diethyl ether was added to the residue for recrystallization, obtaining the target compound as white crystals. 11 g (yield 86%).

Synthesis of triphenylsulfonium 1,1-difluoro-2-hydroxy-ethanesulfonate (intermediate)

Triphenylsulfonium 2-(pivaloyloxy)-1,1-difluoroethanesulfonate, 243.5 g (0.48 mole), was dissolved in 760 g of methanol and ice cooled. An aqueous solution of 40 g sodium hydroxide in 120 g water was added dropwise to the solution at a temperature below 5° C. It was aged at room temperature for 8 hours. At a temperature below 10° C., dilute hydrochloric acid (99.8 g of 12N hydrochloric acid in 200 g of water) was added to quench the reaction. The methanol was distilled off in vacuum, after which 1,000 g of dichloromethane was added to the residue. The organic layer was washed with 30 g of a saturated sodium chloride solution three times. The organic layer was concentrated, after which 1 L of diusopropyl ether was added to the residue for crystallization. The crystals were filtered and dried, obtaining the target compound. 187 g (purity 78%, net yield 78%).

Synthesis of triphenylsulfonium 2-(4-adamantanone-1-carbonyloxy)-1,1-difluoroethanesulfonate [PAG-5]

4-adamantanone-1-carboxylic acid was synthesized through reaction of 5-hydroxy-2-adamantanone with sulfuric acid and formic acid and then converted into a corresponding carboxylic acid chloride, using oxalyl chloride.

In 20 g of acetonitrile, 5.4 g (0.01 mole) of the intermediate, triphenylsulfonium 1,1-difluoro-2-hydroxy-ethane-sulfonate (purity 78%), 1.0 g (0.01 mole) of triethylamine and 0.24 g (0.002 mole) of N,N-dimethylaminopyridine were dissolved and ice cooled. 2.6 g (0.012 mole) of 4-adamantanone-1-carbonyl chloride, prepared above, was added dropwise to the solution at a temperature below 5° C. It was stirred at room temperature for 1 hour. Dilute hydrochloric acid (1 g of 12N hydrochloric acid in 10 g of water) was added to the solution. The acetonitrile was distilled off in vacuum, after which 50 g of dichloromethane, 50 g of methyl isobutyl ketone, and 20 g of water were added to the residue. The organic layer was separated and washed with 20 g of water. The solvent was distilled off in vacuum. Ether was added to the residue for crystallization. The crystals were filtered and dried, obtaining the target compound. 4.8 g (yield 80%). On $^1$H-NMR analysis, methyl isobutyl ketone and ether were observed as a trace amount of residual solvent.

These compounds PAG-1 to PAG-5 have the structural formulae shown below.

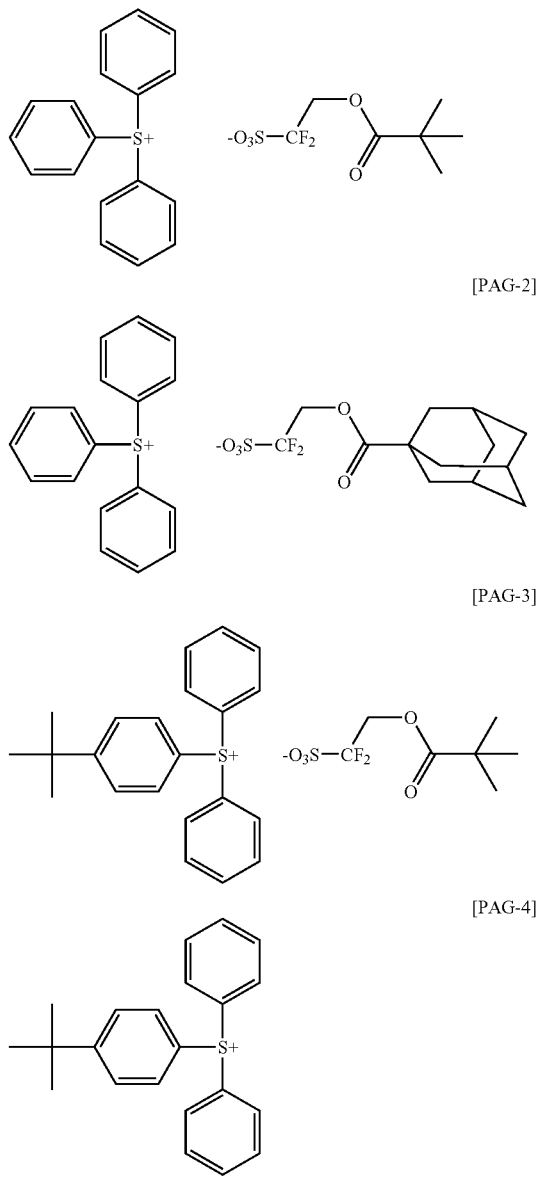

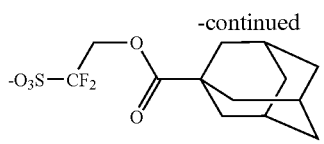
-continued

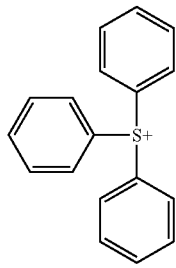
[PAG-5]

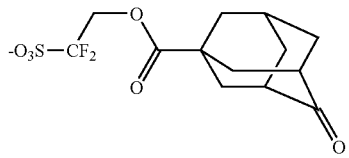

Figure 2:
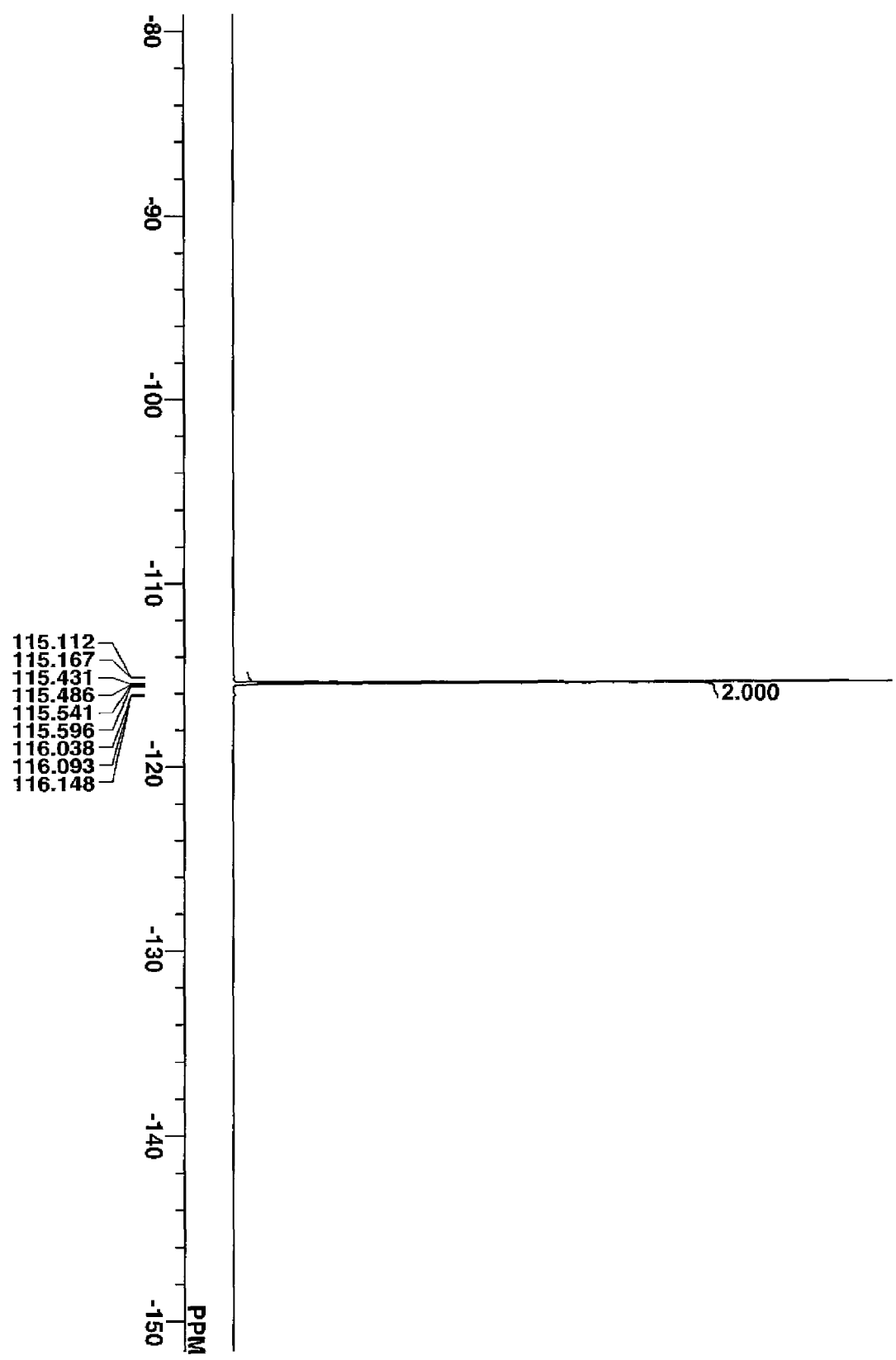
FIG. 2 is a diagram showing the $^{19}$F-NMR (DMSO-$d_6$) spectrum of PAG-1.
Figure 3:
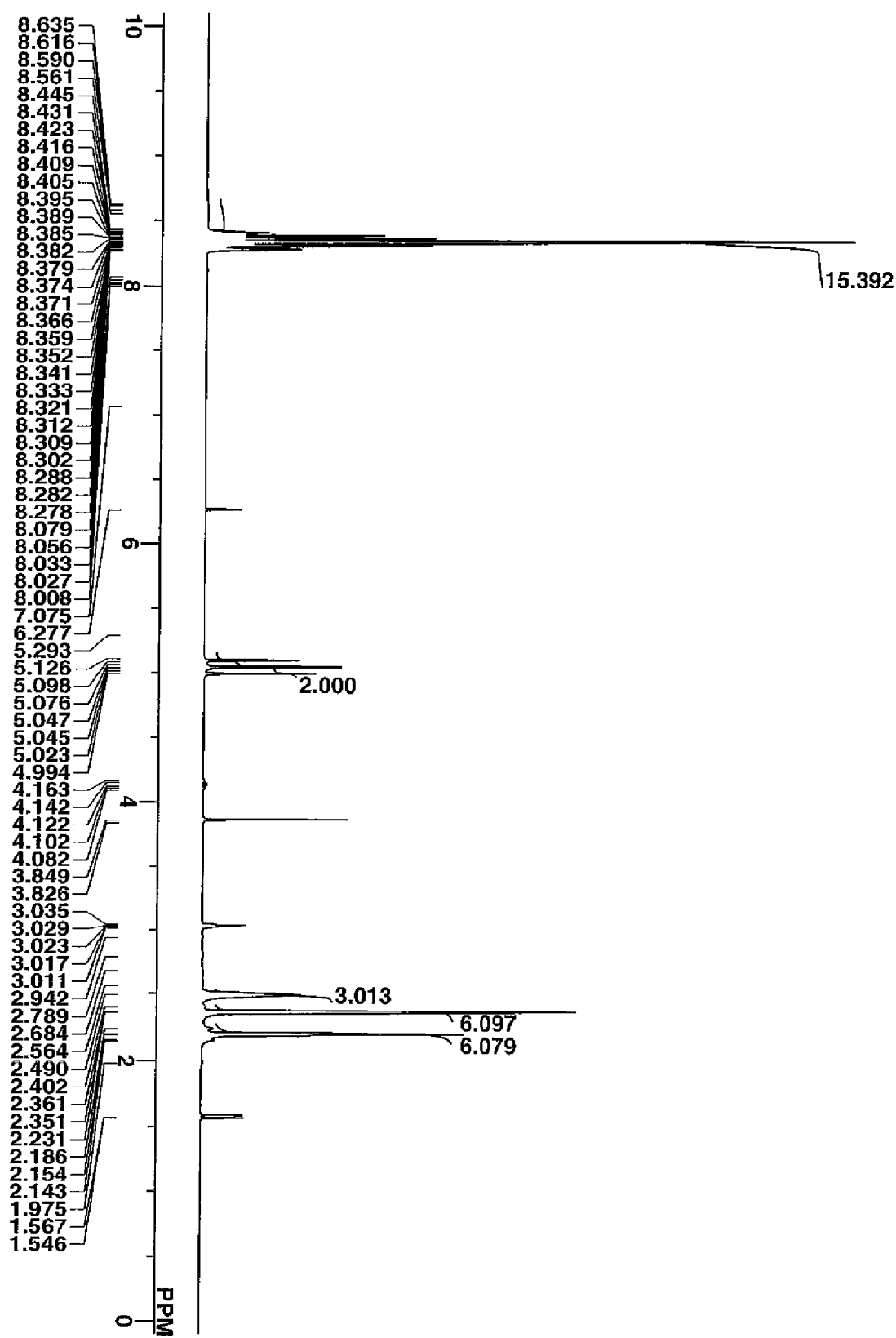
FIG. 3 is a diagram showing the $^1$H-NMR (DMSO-$d_6$) spectrum of PAG-2 in Example.
Figure 4:
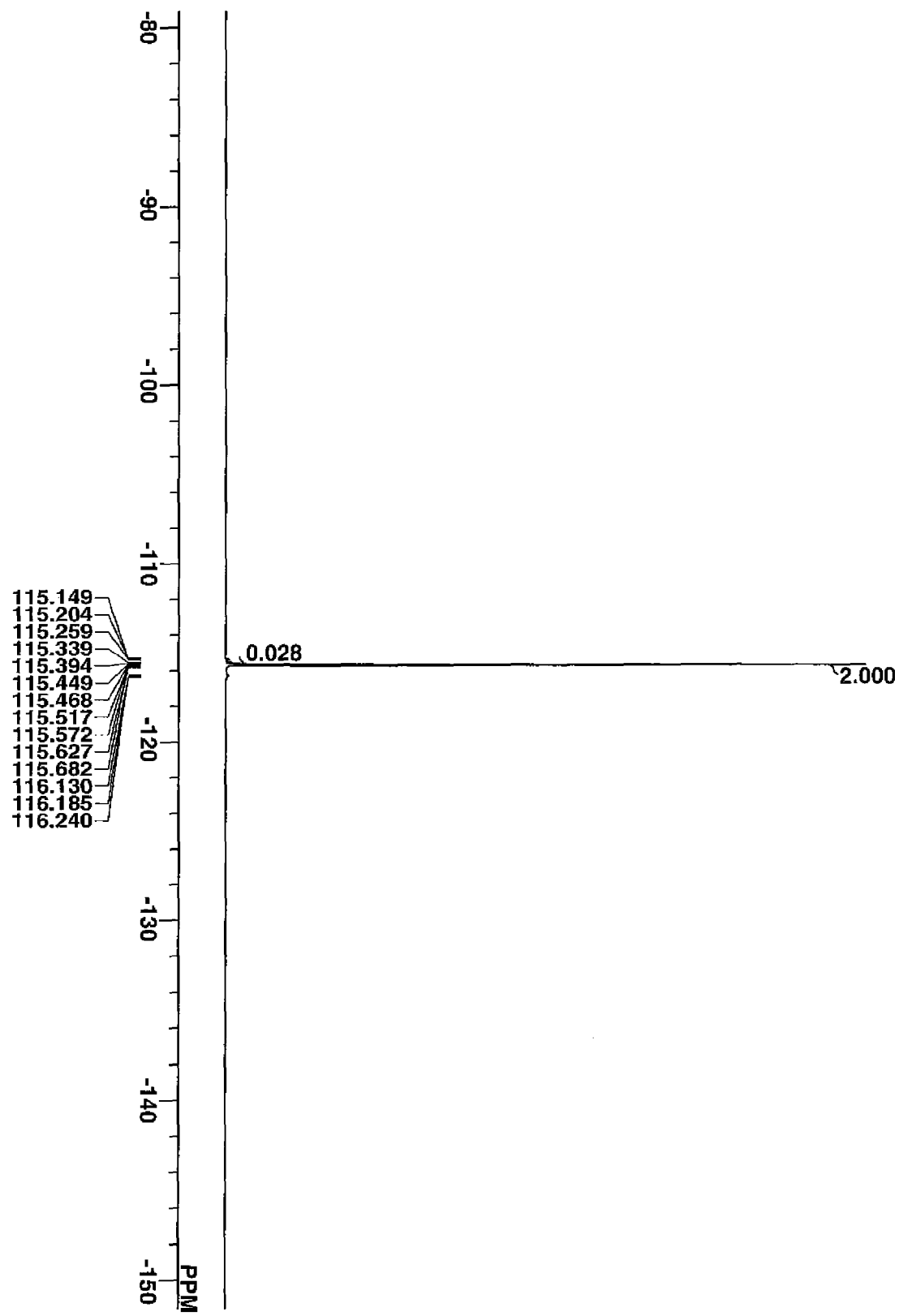
FIG. 4 is a diagram showing the $^{19}$F-NMR (DMSO-$d_6$) spectrum of PAG-2.
Figure 5:
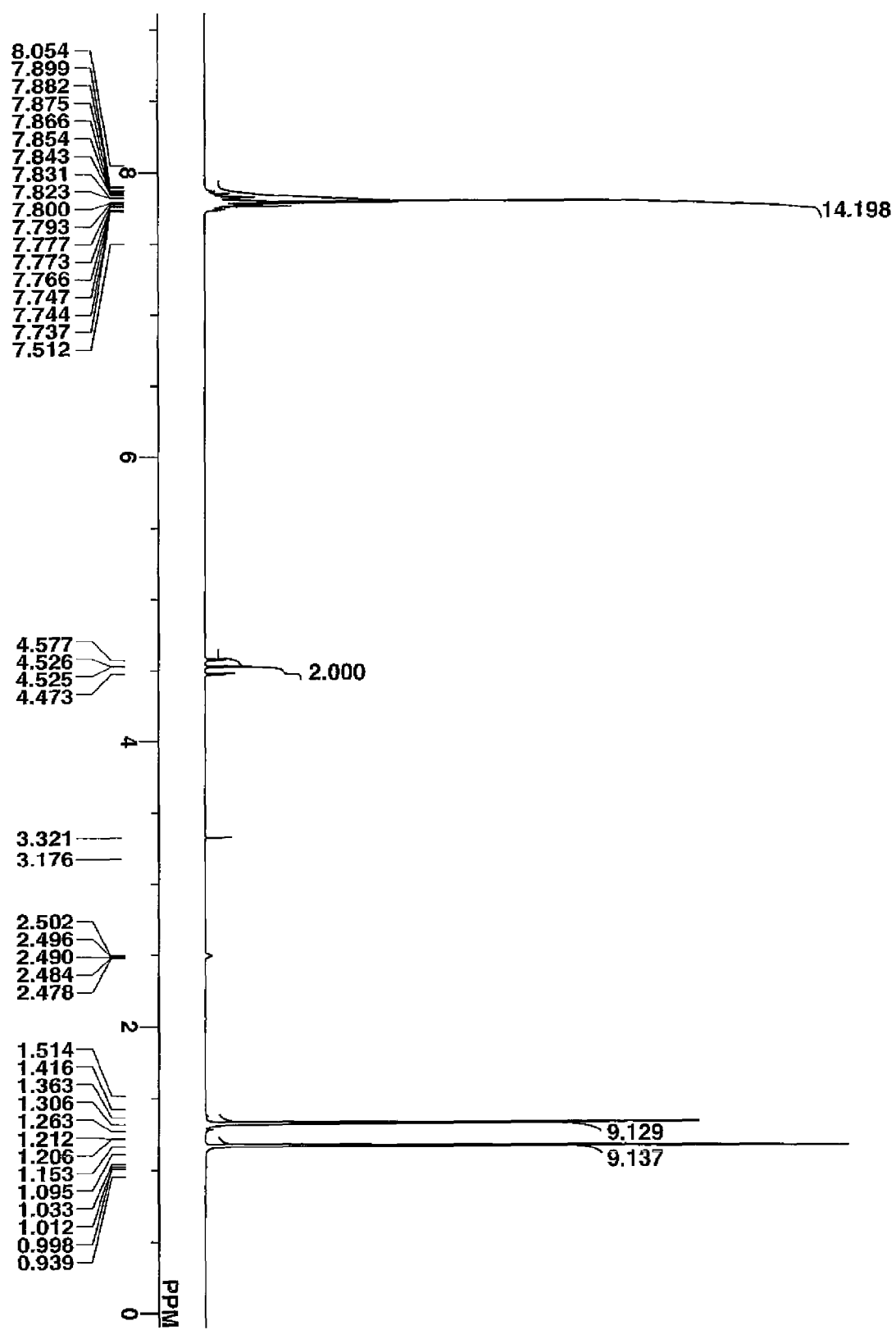
FIG. 5 is a diagram showing the $^1$H-NMR (DMSO-$d_6$) spectrum of PAG-3 in Example.
Figure 6:
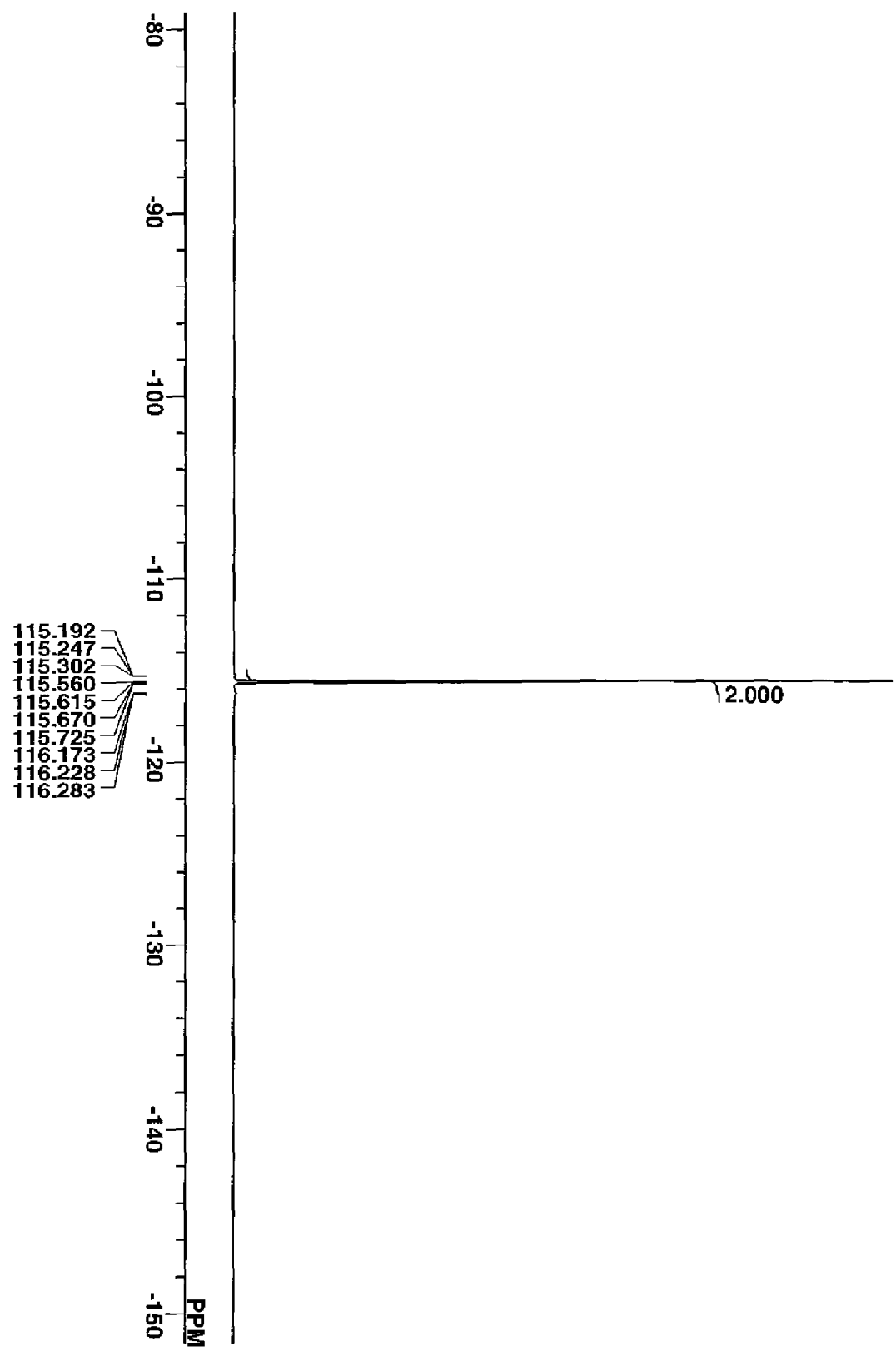
FIG. 6 is a diagram showing the $^{19}$F-NMR (DMSO-$d_6$) spectrum of PAG-3.
Figure 7:
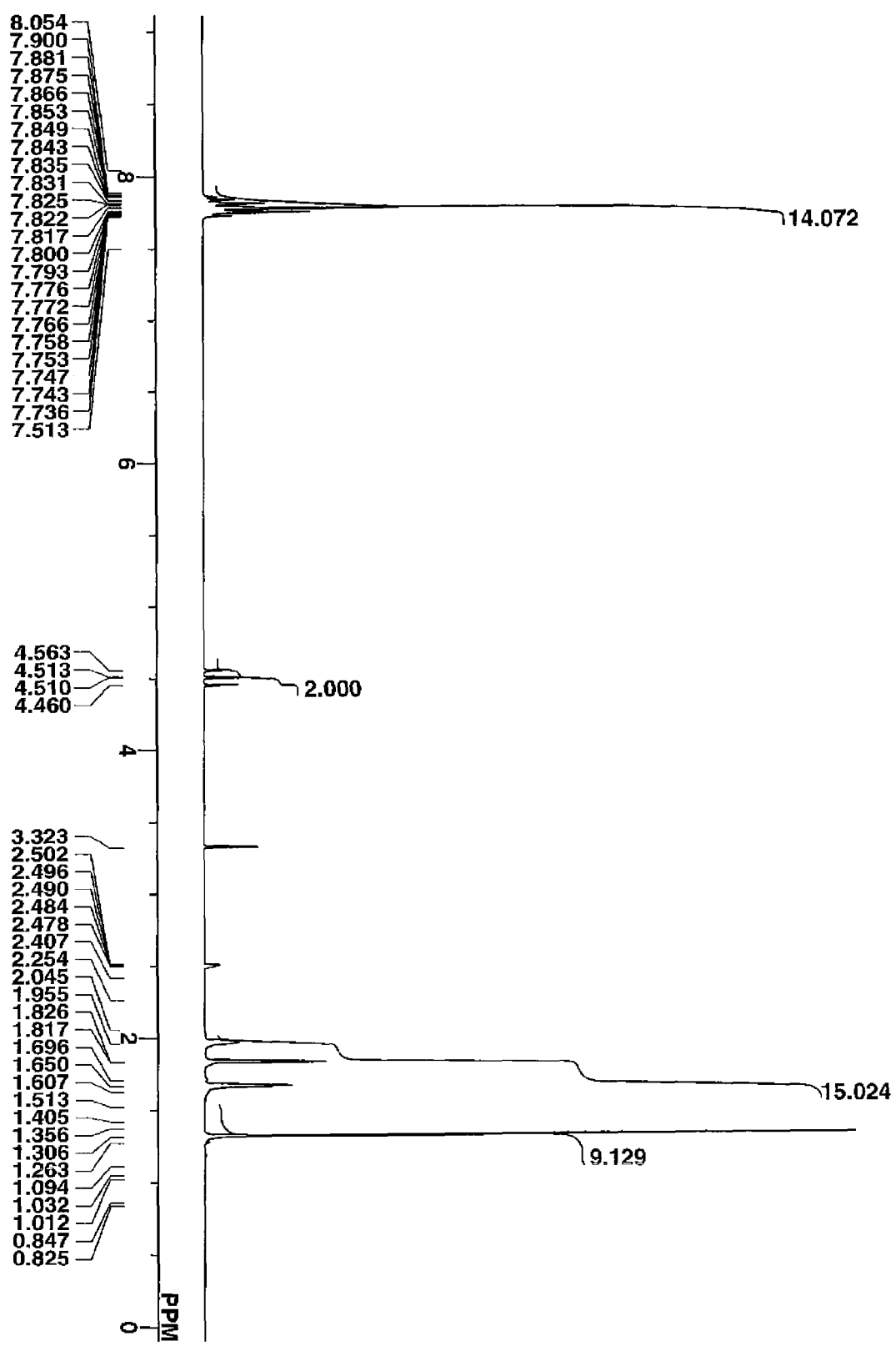
FIG. 7 is a diagram showing the $^1$H-NMR (DMSO-$d_6$) spectrum of PAG-4 in Example.
Figure 8:
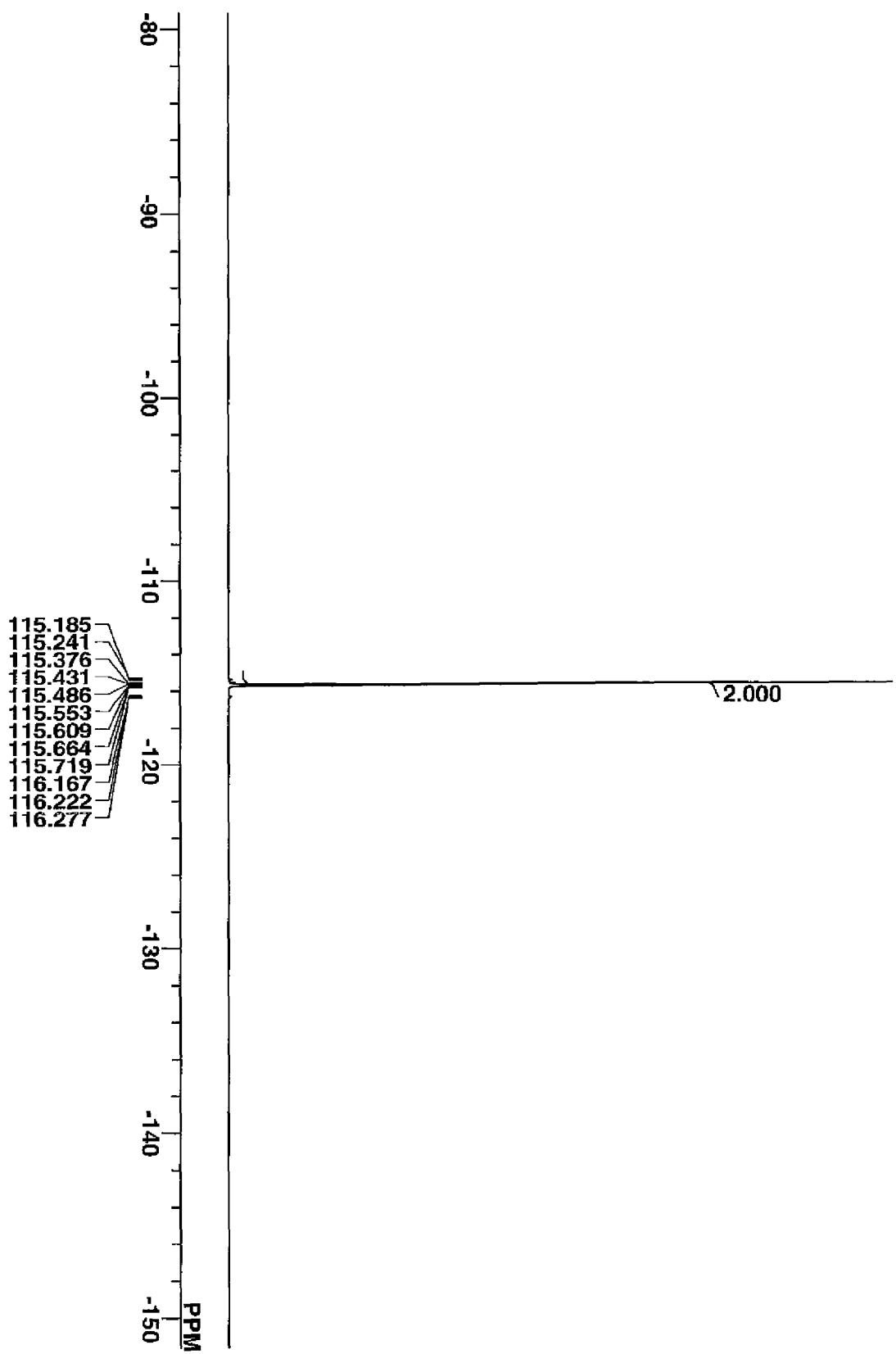
FIG. 8 is a diagram showing the $^{19}$F-NMR (DMSO-$d_6$) spectrum of PAG-4.
Figure 9:
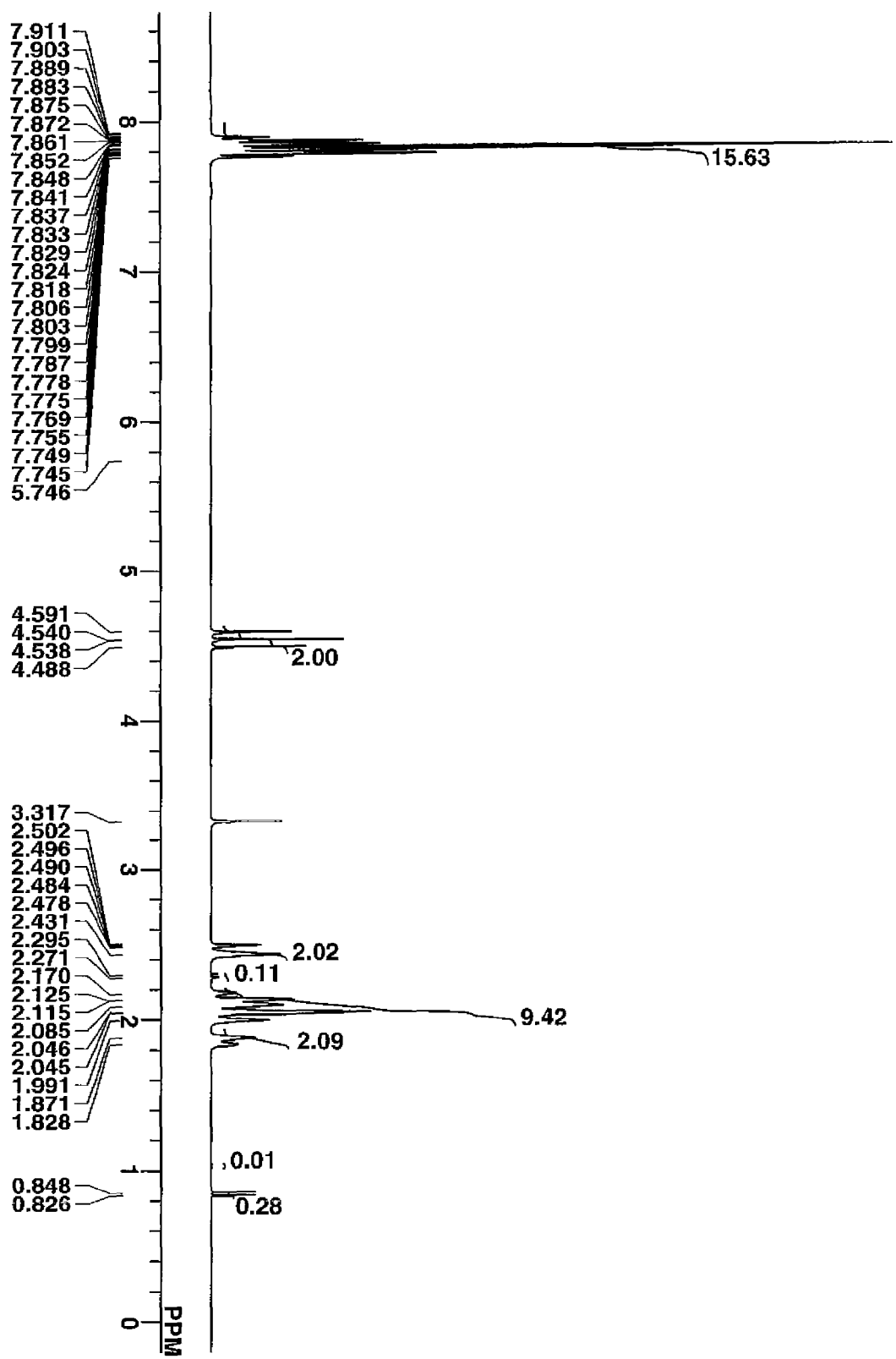
FIG. 9 is a diagram showing the $^1$H-NMR (DMSO-$d_6$) spectrum of PAG-5 in Example.
Figure 10:
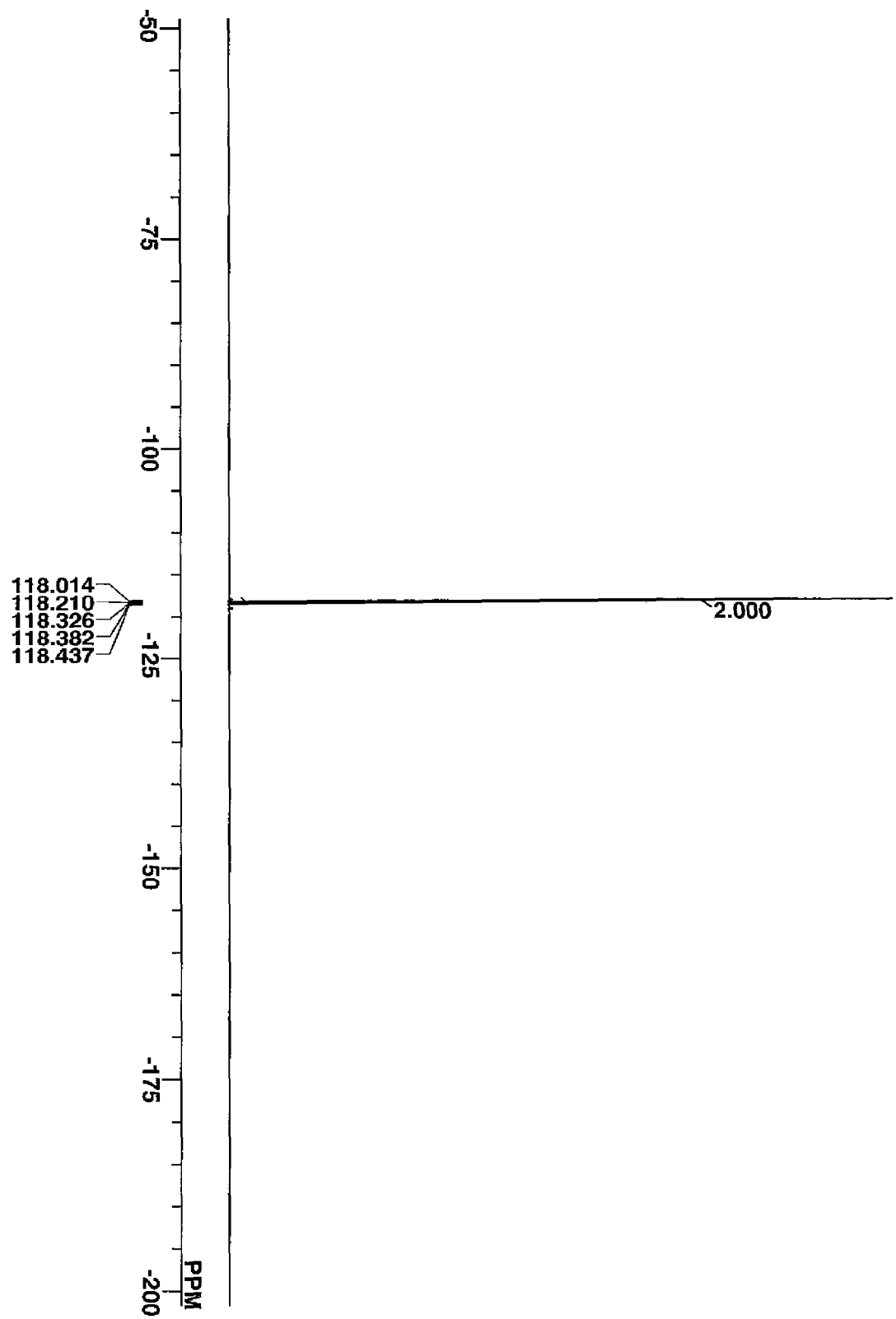
FIG. 10 is a diagram showing the $^{19}$F-NMR (DMSO-$d_6$) spectrum of PAG-5.

FIGS. 1 to 10 are nuclear magnetic resonance spectra, $^1$H-NMR and $^{19}$F-NMR of PAG-1 to PAG-5.

Preparation of Resist Composition

Resist compositions were prepared by mixing and dissolving a polymer, acid generator, and basic compound in a solvent according to the formulation shown in Table 1. They were filtered through a Teflon® filter having a pore size of 0.2 μm, giving resist solutions. In all runs, the solvent contained 0.01 wt % of surfactant KH-20 (Asahi Glass Co., is Ltd.). Comparative resist compositions were similarly prepared according to the formulation shown in Table 2.

In Tables 1 and 2, numerical values in parentheses are in parts by weight. The abbreviations for the basic compounds and solvents have the following meaning.

Base-1: tri(2-methoxymethoxyethyl)amine

Base-2: 1-[2-{2-(2-methoxyethoxy)ethoxy}ethyl]benzimidazole

PGMEA: 1-methoxy-2-propyl acetate

CyHO: cyclohexanone

Polymers designated P-01 to P-11 are as shown in Tables 3 to 7.

TABLE 3

| Resin | Unit 1 (ratio) | Unit 2 (ratio) | Unit 3 (ratio) | Unit 4 (ratio) | Mw |
|---|---|---|---|---|---|
| P-01 | A-1M(0.30) | B-1M(0.40) | C-2M(0.30) | | 6,200 |
| P-02 | A-1M(0.30) | B-1M(0.40) | C-1M(0.30) | | 6,300 |
| P-03 | A-1M(0.30) | B-1M(0.25) | C-2M(0.35) | D-3M(0.10) | 6,100 |
| P-04 | A-1M(0.30) | B-2M(0.25) | C-2M(0.45) | | 6,300 |
| P-05 | A-1M(0.30) | B-1M(0.35) | C-2M(0.30) | D-4M(0.05) | 6,300 |
| P-06 | A-1M(0.30) | B-2M(0.25) | C-2M(0.35) | D-2M(0.10) | 6,300 |
| P-07 | A-1M(0.30) | B-2M(0.20) | C-2M(0.40) | D-1M(0.10) | 6,000 |
| P-08 | A-1M(0.30) | B-1M(0.20) | C-2M(0.40) | D-2M(0.10) | 6,000 |
| P-09 | A-1M(0.25) | B-1M(0.40) | C-1M(0.35) | | 6,300 |
| P-10 | A-1M(0.30) | B-1M(0.40) | C-3M(0.30) | | 6,100 |
| P-11 | A-2M(0.30) | B-1M(0.40) | C-2M(0.30) | | 6,300 |

The "ratio" is a molar ratio of a certain unit incorporated in the polymer.

TABLE 1

| Resist | Resin | Acid generator | Base | Solvent 1 | Solvent 2 |
|---|---|---|---|---|---|
| R-01 | P-01(80) | PAG-5(9.3) | Base-1(1.4) | PGMEA(910) | CyHO(390) |
| R-02 | P-02(80) | PAG-5(9.3) | Base-1(1.4) | PGMEA(910) | CyHO(390) |
| R-03 | P-03(80) | PAG-5(9.3) | Base-1(1.4) | PGMEA(910) | CyHO(390) |
| R-04 | P-04(80) | PAG-5(9.3) | Base-1(1.4) | PGMEA(910) | CyHO(390) |
| R-05 | P-05(80) | PAG-5(9.3) | Base-1(1.4) | PGMEA(910) | CyHO(390) |
| R-06 | P-06(80) | PAG-5(9.3) | Base-1(1.4) | PGMEA(910) | CyHO(390) |
| R-07 | P-07(80) | PAG-5(9.3) | Base-1(1.4) | PGMEA(910) | CyHO(390) |
| R-08 | P-08(80) | PAG-5(9.3) | Base-1(1.4) | PGMEA(910) | CyHO(390) |
| R-09 | P-09(80) | PAG-5(9.3) | Base-1(1.4) | PGMEA(910) | CyHO(390) |
| R-10 | P-01(80) | PAG-1(7.9) | Base-1(1.4) | PGMEA(910) | CyHO(390) |
| R-11 | P-01(80) | PAG-2(9.1) | Base-1(1.4) | PGMEA(910) | CyHO(390) |
| R-12 | P-01(80) | PAG-4(9.9) | Base-1(1.4) | PGMEA(910) | CyHO(390) |
| R-13 | P-03(80) | PAG-2(9.1) | Base-1(1.4) | PGMEA(910) | CyHO(390) |
| R-14 | P-04(80) | PAG-2(9.1) | Base-1(1.4) | PGMEA(910) | CyHO(390) |
| R-15 | P-04(80) | PAG-4(9.9) | Base-1(1.4) | PGMEA(910) | CyHO(390) |
| R-16 | P-07(80) | PAG-4(9.9) | Base-1(1.4) | PGMEA(910) | CyHO(390) |
| R-17 | P-08(80) | PAG-2(9.1) | Base-2(1.3) | PGMEA(910) | CyHO(390) |

TABLE 2

| Resist | Resin | Acid generator | Base | Solvent 1 | Solvent 2 |
|---|---|---|---|---|---|
| R-18 | P-01(80) | PAG-6(8.7) | Base-1(1.4) | PGMEA(910) | CyHO(390) |
| R-19 | P-01(80) | PAG-7(9.3) | Base-1(1.4) | PGMEA(910) | CyHO(390) |
| R-20 | P-10(80) | PAG-2(9.1) | Base-1(1.4) | PGMEA(910) | CyHO(390) |
| R-21 | P-11(80) | PAG-2(9.1) | Base-1(1.4) | PGMEA(910) | CyHO(390) |

TABLE 4
| A-1M (R₁ = Me) | A-2M (R₁ = Me) |
| A-1A (R₁ = H) | A-2A (R₁ = H) |
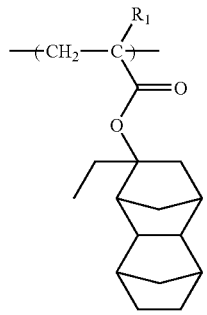 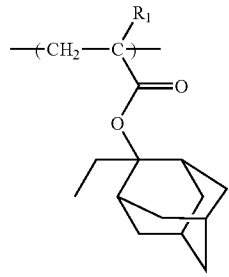
TABLE 5
| B-1M (R₁ = Me) | B-2M (R₁ = Me) |
| B-1A (R₁ = H) | B-2A (R₁ = H) |
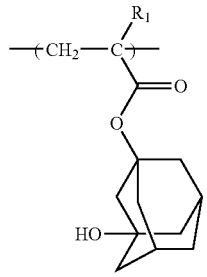 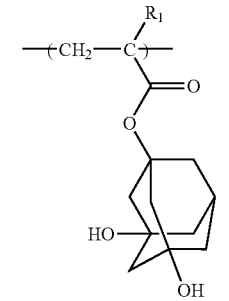
TABLE 6
| C-1M (R₁ = CH₃) | C-2M (R₁ = CH₃) | C-3M (R₁ = CH₃) |
| C-1A (R₁ = H) | C-2A (R₁ = H) | C-3A (R₁ = H) |
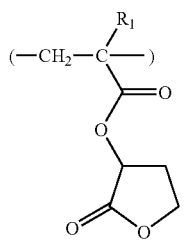 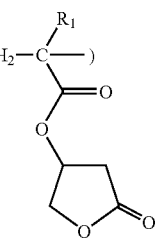 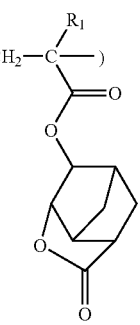
TABLE 7
| D-1M (R₁ = CH₃) | D-2M (R₁ = CH₃) |
| D-1A (R₁ = H) | D-2A (R₁ = H) |
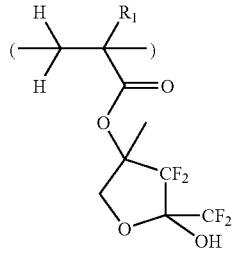 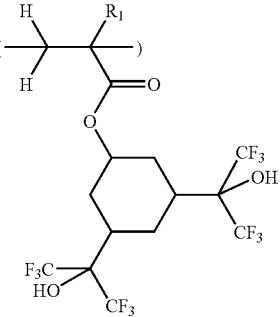
| D-3M (R₁ = CH₃) | D-4M (R₁ = CH₃) |
| D-3A (R₁ = H) | D-4A (R₁ = H) |
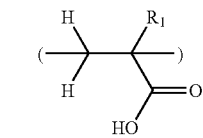 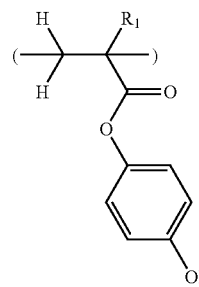
The acid generators designated by abbreviation PAG in Tables 1 and 2 are the sulfonium salt compounds shown in Table 8.
TABLE 8
[PAG-1]
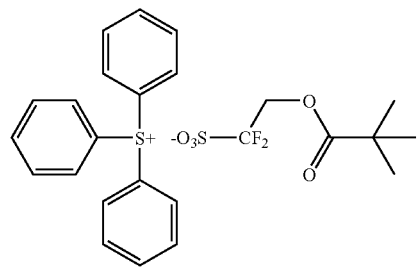
[PAG-2]
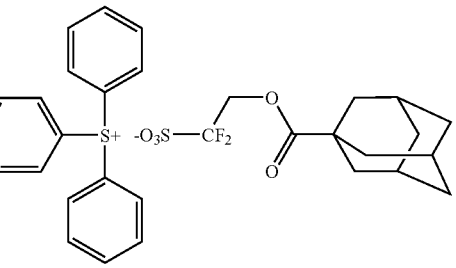

TABLE 8-continued

[PAG-4]
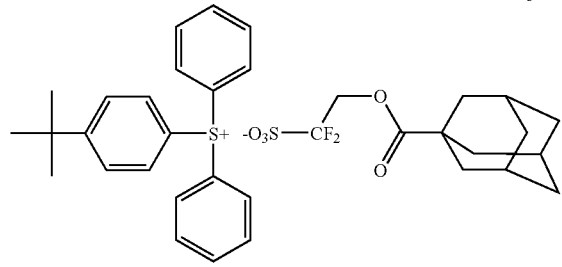

[PAG-5]
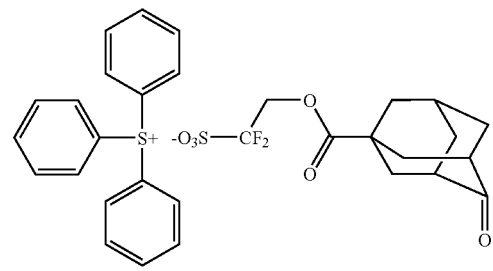

[PAG-6]
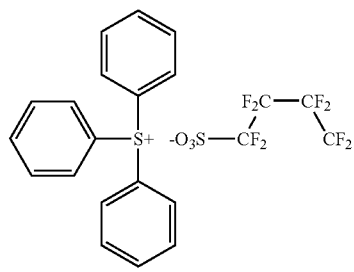

[PAG-7]
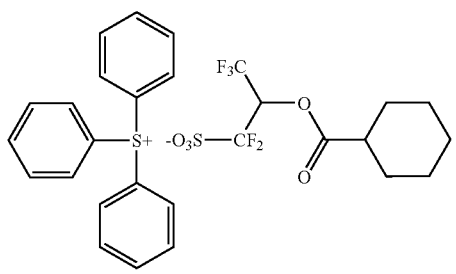

Evaluation of Resolution

Examples 1 to 17 & Comparative Examples 1 to 4

Each of inventive resist compositions R-01 to 17 and comparative resist compositions R-18 to 21, prepared above, was spin coated on a silicon wafer having an antireflective coating (ARC-29A, by Nissan Chemical Co., Ltd.) of 78 nm thick and baked at 100° C. for 60 seconds, forming a resist film of 150 nm thick. The resist film was exposed by means of an ArF excimer laser stepper (Nikon Corp., NA 0.85), post-exposure baked (PEB) for 60 seconds, and puddle developed with a 2.38 wt % aqueous solution of tetramethylammonium hydroxide (TMAH) for 30 seconds. In this way, 1:1 line-and-space patterns and 1:10 isolated line patterns were formed. The PEB step used an optimum temperature for a particular resist composition.

The pattern-bearing wafers were observed under a top-down scanning electron microscope (TDSEM). The optimum exposure was an exposure dose (mJ/cm$^2$) which provided a 1:1 resolution at the top and bottom of a 80-nm 1:1 line-and-space pattern. The maximum resolution of the resist was defined as the minimum line width (on-mask size, in increments of 5 nm) of a 1:1 line-and-space pattern that was found resolved and separated at the optimum exposure, with smaller values indicating better resolution. The 1:10 isolated line pattern at the optimum exposure was also observed for determining an actual on-wafer size of the isolated line pattern with an on-mask size of 140 nm, which was reported as mask fidelity (on-wafer size, a larger size being better). The pattern was observed for roughness, and line edge roughness (LER) was evaluated in three ratings of Good, Fair, and Poor.

Tables 9 and 10 tabulate the test results (maximum resolution, mask fidelity, and LER) of the inventive and comparative resist compositions, respectively.

TABLE 9

| Example | Resist | PEB temp. | Optimum exposure | Maximum resolution | Mask fidelity | LER |
|---|---|---|---|---|---|---|
| 1 | R-01 | 100° C. | 46.0 mJ/cm$^2$ | 65 nm | 87 nm | Good |
| 2 | R-02 | 100° C. | 45.0 mJ/cm$^2$ | 65 nm | 85 nm | Good |
| 3 | R-03 | 95° C. | 42.0 mJ/cm$^2$ | 70 nm | 82 nm | Good |
| 4 | R-04 | 95° C. | 44.0 mJ/cm$^2$ | 65 nm | 84 nm | Good |
| 5 | R-05 | 95° C. | 45.0 mJ/cm$^2$ | 70 nm | 85 nm | Good |
| 6 | R-06 | 95° C. | 42.0 mJ/cm$^2$ | 70 nm | 82 nm | Good |
| 7 | R-07 | 90° C. | 44.0 mJ/cm$^2$ | 65 nm | 84 nm | Good |
| 8 | R-08 | 90° C. | 45.0 mJ/cm$^2$ | 65 nm | 83 nm | Good |
| 9 | R-09 | 100° C. | 46.0 mJ/cm$^2$ | 65 nm | 86 nm | Good |
| 10 | R-10 | 100° C. | 45.0 mJ/cm$^2$ | 65 nm | 85 nm | Good |
| 11 | R-11 | 100° C. | 44.0 mJ/cm$^2$ | 70 nm | 84 nm | Good |
| 12 | R-12 | 100° C. | 46.0 mJ/cm$^2$ | 65 nm | 86 nm | Good |
| 13 | R-13 | 95° C. | 47.0 mJ/cm$^2$ | 65 nm | 82 nm | Good |
| 14 | R-14 | 95° C. | 47.0 mJ/cm$^2$ | 65 nm | 83 nm | Good |
| 15 | R-15 | 95° C. | 45.0 mJ/cm$^2$ | 70 nm | 83 nm | Good |
| 16 | R-16 | 90° C. | 44.0 mJ/cm$^2$ | 65 nm | 84 nm | Good |
| 17 | R-17 | 90° C. | 45.0 mJ/cm$^2$ | 65 nm | 85 nm | Good |

TABLE 10

| Comparative Example | Resist | PEB temp. | Optimum exposure | Maximum resolution | Mask fidelity | LER |
|---|---|---|---|---|---|---|
| 1 | R-18 | 100° C. | 35.0 mJ/cm$^2$ | 80 nm | 68 nm | Good |
| 2 | R-19 | 100° C. | 42.0 mJ/cm$^2$ | 80 nm | 70 nm | Good |
| 3 | R-20 | 110° C. | 43.0 mJ/cm$^2$ | 70 nm | 80 nm | Poor |
| 4 | R-21 | 110° C. | 42.0 mJ/cm$^2$ | 80 nm | 65 nm | Good |

It is seen from the results of Table 9 that the resist compositions (Examples 1 to 17) within the scope of the invention exhibit excellent resolution performance and minimized LER. In contrast, Table 10 reveals that Comparative Examples 3 and 4, which use prior art resins, have either one of the drawbacks of inferior resolution and LER minimization failure. In Comparative Examples 1 and 2 wherein the inventive resins are used in combination with customary acid generators, it is difficult to take advantage of the inventive resins, and in particular, their resolution performance is not improved over the prior art compositions.

Measurement of Leach-Out From Resist Film

Examples 18 to 20 & Comparative Example 5

To 100 parts by weight of the resist compositions (R-01, R-10, R-12) prepared above was added 0.2 part by weight of a surfactant (Surfactant-1, shown below) which was insoluble in water, but soluble in alkaline developer. The resulting resist compositions (R-01', R-10', R-12') and comparative composition (R-18) were spin coated on silicon substrates, then baked at 120° C. for 60 seconds to give photoresist films having a thickness of 120 nm. Using an ArF scanner S305B (Nikon Corp.), the entire surface of the photoresist film was irradiated through an open frame at an energy dose of 50 mJ/cm$^2$.

Surfactant-1: a copolymer of 3,3,3-trifluoro-2-hydroxy-1,1-dimethyl-2-trifluoromethylpropyl methacrylate and 2,2,3,3,4,4,5,5-octafluoropentyl methacrylate in a molar ratio of 20:80, with Mw=8,000

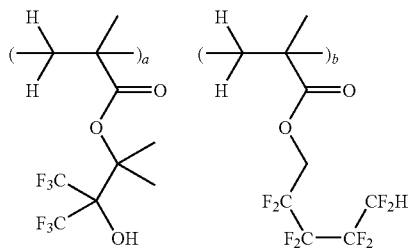

Then a true circle ring of Teflon® having an inner diameter of 10 cm was placed on the resist film, and 10 mL of deionized water was carefully injected inside the ring. The resist film was kept in contact with water at room temperature for 60 seconds. Thereafter, the water was recovered, and a concentration of PAG anion in the water was quantitatively measured by an LC-MS analyzer (Agilent). The anion concentration measured indicates an amount of anions leached out for 60 seconds. The results are shown in Table 11.

TABLE 11

|  | Resist composition | Anion leach-out (ppb) |
| --- | --- | --- |
| Example 18 | R-01' | ≦5 |
| Example 19 | R-10' | ≦5 |
| Example 20 | R-12' | ≦5 |
| Comparative Example 5 | R-18 | 35 |

As is evident from Table 11, the resist compositions is of the invention are effective for preventing the generated acid from being leached out in water when processed by immersion lithography using water. They are expected to experience a minimized change of pattern profile by immersion lithography and cause little damage to the exposure tool.

It has been demonstrated that a resist composition which uses a polymer comprising specific recurring units as a base resin in combination with a unique acid generator capable of generating an acid having controlled diffusibility is improved in resolution performance and mask fidelity, and minimized in LER, as compared with resist compositions of the prior art design.

Japanese Patent Application No. 2008-008931 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:
1. A positive resist composition comprising (A) a resin component which becomes soluble in an alkaline developer under the action of an acid and (B) a compound capable of generating an acid in response to actinic light or radiation, wherein said resin component (A) is a polymer comprising recurring units (a), (b), and (c) represented by the general formula (1):

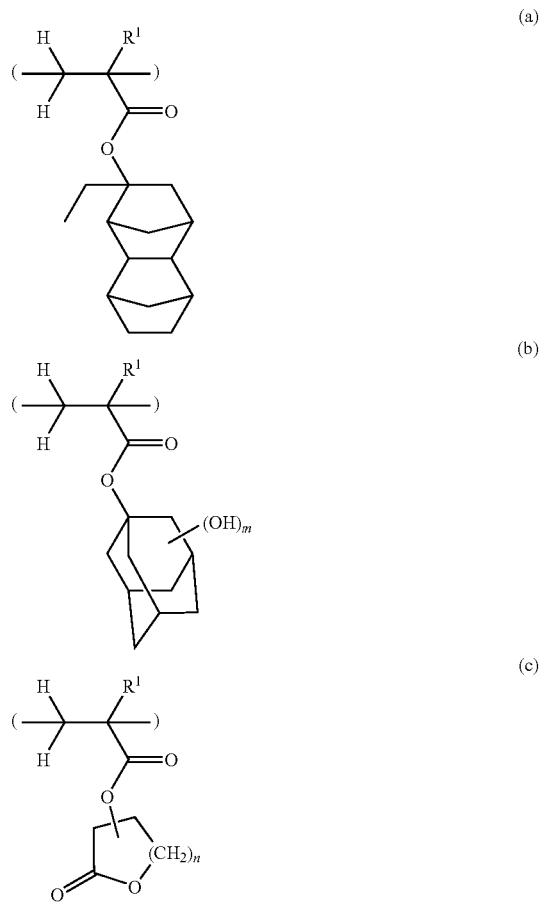

wherein $R^1$ is each independently hydrogen or methyl, m is 1 or 2, and n is 1 or 2, and said compound (B) is a sulfonium salt compound having the general formula (2):

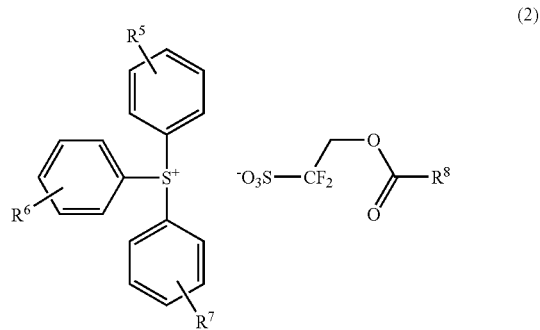

wherein $R^5$, $R^6$ and $R^7$ are each independently hydrogen or a straight, branched or cyclic, monovalent hydrocarbon group of 1 to 20 carbon atoms which may contain a heteroatom, and $R^8$ is a straight, branched or cyclic, monovalent hydrocarbon group of 4 to 30 carbon atoms which may contain a heteroatom.

2. The composition of claim 1 wherein the recurring units (c) in said resin component (A) are recurring units (c-1) of the following formula:

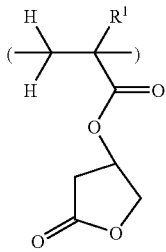

(c-1)

wherein $R^1$ is each independently hydrogen or methyl.

3. The composition of claim 1, further comprising a tertiary amine as an acid diffusion regulator.

4. The composition of claim 1, further comprising a surfactant which is insoluble in water and soluble in the alkaline developer.

5. A process for forming a pattern, comprising the steps of applying the positive resist composition of claim 1 onto a substrate to form a resist coating, heat treating, exposing the resist coating to high-energy radiation through a photomask, optionally heat treating, and developing the exposed coating with a developer.

6. A process for forming a pattern, comprising the steps of applying the positive resist composition of claim 1 onto a substrate to form a resist coating, beat treating, applying on the resist coating a protective coating which is insoluble in water and soluble in an alkaline developer, exposing the resist coating to high-energy radiation through a photomask, with water interposed between the substrate and a projection lens, optionally heat treating, and developing the exposed coating with a developer.

7. A process for forming a pattern, comprising the steps of applying the positive resist composition of claim 1 onto a substrate to form a resist coating, heat treating, imagewise writing on the resist coating with an electron beam, optionally heat treating, and developing the coating with a developer.

8. A process for forming a pattern, comprising the steps of applying the positive resist composition of claim 1 onto a substrate to form a resist coating, heat treating, exposing the resist coating to high-energy radiation through a photomask, heat treating, and developing the coating with a developer, said process further comprising the step of applying a protective coating on the resist coating, the exposing step being effected by the immersion lithography wherein a liquid having a refractive index of at least 1.0 intervenes between the protective coating and a projection lens.

* * * * *